United States Patent
Saravis

(10) Patent No.: US 11,262,816 B2
(45) Date of Patent: Mar. 1, 2022

(54) TEMPERATURE REGULATING MOUNT WITH MAGNETIC POWER MOUNT

(71) Applicant: Darren Saravis, Long Beach, CA (US)

(72) Inventor: Darren Saravis, Long Beach, CA (US)

(*) Notice: Subject to any disclaimer, the term of this patent is extended or adjusted under 35 U.S.C. 154(b) by 0 days.

(21) Appl. No.: 16/690,420

(22) Filed: Nov. 21, 2019

(65) Prior Publication Data

US 2020/0192441 A1 Jun. 18, 2020

Related U.S. Application Data

(63) Continuation-in-part of application No. 15/993,000, filed on May 30, 2018, now Pat. No. 10,877,529, which is a continuation-in-part of application No. 15/826,411, filed on Nov. 29, 2017, now Pat. No. 10,409,342, which is a continuation of application No. 14/393,781, filed on Nov. 12, 2015, now Pat. No. 9,836,101.

(60) Provisional application No. 62/078,085, filed on Nov. 11, 2014, provisional application No. 62/770,653, filed on Nov. 21, 2018.

(51) Int. Cl.
  *G06F 1/20* (2006.01)
  *G06F 1/16* (2006.01)
  *H05K 7/20* (2006.01)

(52) U.S. Cl.
  CPC ............ *G06F 1/203* (2013.01); *G06F 1/1626* (2013.01); *G06F 1/1628* (2013.01); *G06F 1/1632* (2013.01); *G06F 1/206* (2013.01); *H05K 7/20172* (2013.01)

(58) Field of Classification Search
  CPC .. G02B 7/1828; H05K 5/0217; H05K 5/0204; H05K 7/20172; H05K 5/0247; H05K 7/14; H05K 7/1401; G06F 1/203; G06F 1/1626; G06F 1/1628; G06F 1/1632; G06F 1/206
  See application file for complete search history.

(56) References Cited

U.S. PATENT DOCUMENTS

| | | |
|---|---|---|
| 6,616,111 B1 | 9/2003 | White |
| 8,439,191 B1 | 5/2013 | Lu |
| 8,496,213 B1 | 7/2013 | Kunert et al. |
| 8,775,710 B1 | 7/2014 | Miller et al. |
| 8,902,607 B1 | 12/2014 | Chang et al. |
| 8,936,072 B2 | 1/2015 | Senatori |
| 9,417,894 B1 | 8/2016 | Giganti et al. |

(Continued)

OTHER PUBLICATIONS https://sportstechnologyblog.com/2013/11/11/designing-an-ipad-cooling-case/; Sports Technology Blog—Enabling technologies for sport and health; printed from website Jun. 15, 2016; 4pp.

*Primary Examiner* — Michael A Matey
(74) *Attorney, Agent, or Firm* — Avyno Law P.C.

(57) ABSTRACT

A magnet mount assembly is provided for quickly mounting and releasing the portable electronic device to various objects, including stands, clamps and/or holders (i.e., support mount) to support the portable electronic device in elevated positions at a variety of angles. The magnet mount assembly may attach to the back of the temperature control device or to the back of the portable devices by, for example, connecting to the universal mount. The mount may further include pong pins or other electrical connectors for supplying power to the cooling mount and/or portable electronic device when the magnet mount assembly is connected to a support mount.

14 Claims, 62 Drawing Sheets

(56) References Cited

U.S. PATENT DOCUMENTS

| | | | |
|---|---|---|---|
| 9,836,101 B1 | 12/2017 | Saravis | |
| 9,845,058 B2* | 12/2017 | Chow | F16M 13/022 |
| 2002/0105783 A1 | 8/2002 | Kitahara | |
| 2003/0095374 A1 | 5/2003 | Richardson | |
| 2004/0232291 A1* | 11/2004 | Carnevali | F16M 13/00 |
| | | | 248/206.5 |
| 2006/0061964 A1 | 3/2006 | Cheng | |
| 2006/0164806 A1 | 7/2006 | Huang | |
| 2007/0091560 A1 | 4/2007 | Parker | |
| 2007/0152633 A1 | 7/2007 | Lee | |
| 2007/0156333 A1 | 7/2007 | McBride et al. | |
| 2007/0268667 A1 | 11/2007 | Moorer et al. | |
| 2008/0037213 A1 | 2/2008 | Haren | |
| 2008/0110672 A1* | 5/2008 | Ryan | H05K 5/0204 |
| | | | 174/542 |
| 2009/0195983 A1 | 8/2009 | Reichert et al. | |
| 2009/0321039 A1 | 12/2009 | Therrien et al. | |
| 2010/0147737 A1 | 6/2010 | Richardson et al. | |
| 2010/0270188 A1 | 10/2010 | Dotson | |
| 2011/0058326 A1 | 3/2011 | Idems et al. | |
| 2012/0175474 A1* | 7/2012 | Barnard | F16M 11/14 |
| | | | 248/122.1 |
| 2012/0273630 A1* | 11/2012 | Gillespie-Brown | F16M 11/10 |
| | | | 248/122.1 |
| 2012/0314354 A1 | 12/2012 | Rayner | |
| 2012/0325723 A1 | 12/2012 | Carnevali | |
| 2013/0078855 A1* | 3/2013 | Hornick | H01R 13/6205 |
| | | | 439/571 |
| 2013/0164567 A1 | 6/2013 | Olsson et al. | |
| 2013/0181584 A1* | 7/2013 | Whitten | F16B 3/00 |
| | | | 312/223.1 |
| 2013/0235520 A1 | 9/2013 | Huang | |
| 2013/0235521 A1 | 9/2013 | Burch et al. | |
| 2013/0294020 A1 | 11/2013 | Rayner et al. | |
| 2013/0334071 A1 | 12/2013 | Carnevali | |
| 2014/0183067 A1 | 7/2014 | Carnevali | |
| 2014/0233183 A1 | 8/2014 | Horng | |
| 2014/0235156 A1 | 8/2014 | Li et al. | |
| 2014/0249947 A1 | 9/2014 | Hicks et al. | |
| 2014/0260443 A1* | 9/2014 | Grziwok | E05B 73/0082 |
| | | | 70/62 |
| 2014/0262875 A1 | 9/2014 | Carnevali | |
| 2014/0263908 A1* | 9/2014 | Franklin | F16M 13/022 |
| | | | 248/309.4 |
| 2014/0265765 A1* | 9/2014 | Khodapanah | F16M 13/00 |
| | | | 312/223.1 |
| 2014/0305985 A1 | 10/2014 | Chang | |
| 2014/0354218 A1* | 12/2014 | Ali | H01F 7/0252 |
| | | | 320/107 |
| 2014/0355200 A1* | 12/2014 | Thiers | F16M 11/105 |
| | | | 361/679.41 |
| 2015/0017905 A1 | 1/2015 | Li et al. | |
| 2015/0195952 A1 | 7/2015 | Tsunoda et al. | |
| 2015/0264826 A1 | 9/2015 | Dunn et al. | |
| 2015/0301561 A1* | 10/2015 | Carnevali | G06F 1/1628 |
| | | | 455/575.8 |
| 2015/0317445 A1 | 11/2015 | Singh et al. | |
| 2016/0065702 A1* | 3/2016 | Carnevali | H01R 31/06 |
| | | | 455/575.8 |
| 2016/0102805 A1 | 4/2016 | Khodapanah et al. | |
| 2016/0127643 A1 | 5/2016 | Huerta et al. | |
| 2016/0150861 A1* | 6/2016 | Yao | H04B 1/3888 |
| | | | 224/245 |
| 2016/0183393 A1 | 6/2016 | Groom et al. | |
| 2016/0225204 A1* | 8/2016 | Grziwok | H05K 5/0234 |
| 2016/0309010 A1 | 10/2016 | Carnevali et al. | |
| 2016/0318455 A1* | 11/2016 | Zhang | F16M 11/2007 |
| 2017/0062999 A1* | 3/2017 | Thiers | H04M 1/04 |
| 2018/0032104 A1* | 2/2018 | Schatz | G06F 1/1683 |
| 2018/0043840 A1 | 2/2018 | Minn et al. | |
| 2018/0274768 A1 | 9/2018 | Grider et al. | |
| 2019/0129482 A1* | 5/2019 | Todrzak | B60R 11/02 |
| 2019/0198212 A1* | 6/2019 | Levy | B62J 50/225 |
| 2019/0219677 A1 | 7/2019 | Gupta | |
| 2019/0220059 A1* | 7/2019 | Miles | G06F 1/1632 |
| 2019/0274453 A1* | 9/2019 | Chung | A47G 1/166 |
| 2020/0162593 A1* | 5/2020 | Koh | F16M 11/2021 |
| 2020/0328017 A1* | 10/2020 | Isenberg | H04M 1/11 |

* cited by examiner

TEMPERATURE REGULATING MOUNT WITH MAGNETIC POWER MOUNT

CROSS REFERENCE TO RELATED APPLICATIONS

The claims priority to U.S. Provisional Patent Application No. 62/770,653, titled TEMPERATURE REGULATING MOUNT, filed Nov. 21, 2018, and is a continuation-in-part of U.S. patent application Ser. No. 15/993,000, titled TEMPERATURE REGULATING MOUNT, filed May 30, 2018, which application is a continuation-in-part of U.S. patent application Ser. No. 15/826,411, titled COOLING MOUNT, filed Nov. 29, 2017 (now U.S. Pat. No. 10,409,342), which application is a continuation of U.S. patent application Ser. No. 14/939,781, titled COOLING MOUNT, filed Nov. 12, 2015 (now U.S. Pat. No. 9,836,101), which application claims priority to U.S. Provisional Patent Application No. 62/078,085, titled PORTABLE TABLET COOLING DEVICE, filed Nov. 11, 2014, all of the above of which are incorporated into this application in its entirety.

FIELD OF THE INVENTION

The invention relates to a cooling mount for portable electronic devices having a magnetic mount with power supply and related accessories.

BACKGROUND OF THE INVENTION

Portable electronic devices, including tablets, such as iPADs, iPAD Airs and iPAD minis; smart phones, such as iPhones and Android phones; mobile phones; and personal computers, all of which are typically powered by a battery so that users may carry them about and use them as needed, including when operating a vehicle, such as an aircraft, boat or car. Frequently, these devices provide navigation information to users, and for many, such a device has become a required navigational item. More recently, such devices have been used to process sales transaction and for other commercial purposes, which requires the tablet to be used consistently for long hours both indoors and outdoors.

When in use, it can become problematic if the electronic device is exposed to extreme heat or direct sunlight, especially if used to guide the operation of land, water and aircraft. The screen of the electronic device, being almost completely black, can get extremely hot if left in direct sun and/or the device can become overheated if used continuously for long periods of time. As a protective measure, some electronic devices may automatically shut down upon reaching a critical temperature and stay shut down until they cool off. The primary reason for this is to protect the electronic device's internal battery. However, if the electronic device is the primary source for navigation, it can become problematic and/or dangerous to the user if the device automatically shuts down during use.

Currently, if a device overheats, the user's only option is to get the device to a cooler environment and lower its internal temperature, usually by removing it from direct sunlight, and/or cease use for an extended period of time. Once the device's internal temperature lowers, it may automatically switch back on, but in the interim there is nothing else for the user to do once the device overheats. Similar problems may also occur with a portable electronic device is exposed to extremely cold temperatures. A need exist for portable electronic devices to be used in all temperatures and for long-durations without interruption from overheating or exposure to extreme temperatures. A need further exists for a quick mount for portable electronic devices having a power supply, which quick mount can be used with or without the temperature control devices, to allow the hands-free operation of the devices at varying angles.

SUMMARY OF THE INVENTION

The current invention relates to a temperature regulating mount for portable electronic devices, including, but not limited to, tablets, such as iPADs, iPAD Airs and iPAD minis; smart phones, such as iPhones and Android phones; cell phones; and personal computers that will not only extend product life, but also prevent critical temperature shutdowns and general overheating of the device, which can make user contact uncomfortable or even dangerous. As illustrated and explained further below, in one example, the present invention is a cooling mount that provides forced air across the rear of the portable electronic device using fans and either internal battery power or external power. The mount can also include other types of temperature control units, including but not limited to heating units, that may also provide the user with the ability to heat the portable electronic device for use in cold weather environments. For the purposes of this application, the term "cooling mount" is interchangeable with "temperature control unit," "temperature control device" or "temperature control mount" in that all function to control the temperature of the portable electronic device.

In one implementation, the invention consists of a polygonal housing made of a rigid material having a front face in the general shape of a portable electronic device for mounting the electronic device on the cooling mount. The housing has a back portion and four sidewalls. The back portion contains two battery housings, a circuit board and electric fans. The cooling mount is constructed so that the portable electronic device, when engaged within the cooling mount, is held away from the back, permitting air flow from the fans to circulate across the back of the electronic device to lower its internal temperature.

Optionally, the invention can include a device for fastening the cooling mount to objects. For example, the cooling mount may include a strap for attaching the mount to a user's leg or to clamp for attaching the cooling mount to various objects within a cabin or cockpit, on a dash board or on objects in the area immediately surrounding the user.

The invention may also optionally include a probe with a temperature-sensitive head that mounts onto the back of a portable electronic device when it is engaged within the cooling mount. The temperature-sensitive probe can detect with the when the ambient temperature or the temperature of the portable electronic device reaches a certain predetermined level and initiate cooling of the device.

In another example, a temperature regulating mount for portable electronic devices is provided that includes a temperature control unit for preventing portable electronic devices from reaching critical temperatures during operation to avoid undesired shut down of the electronic device. The mount is further accompanied by a protective perimeter casing for protecting the electronic device and allowing the device to mate with a universal mount. The perimeter casing leaves the back of the device open or exposed (e.g., through webbing) for temperature control. The protective perimeter casing includes grooves and indents for mating with guide rails and a movable clamping mechanism for securing the electronic device to the mount in a particular orientation to maximize the mounts ability to regulate the temperature of the electronic device.

Optionally, the invention can further include a magnet mount assembly for quickly mounting and releasing the portable electronic device to various objects, including stands, clamps and/or holders (i.e., support mount) to support the portable electronic device in elevated positions at a variety of angles. The magnet mount assembly may attach to the back of the temperature control unit or to the back of the portable devices by, for example, engaging the protective perimeter casing. The mount may further include pong pins or other electrical connectors for supplying power to the cooling mount and/portable electronic device when the magnet mount assembly is connected to a support mount.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention may be better understood by referring to the following figures. The components in the figures are not necessarily to scale, emphasis instead being placed upon illustrating the principles of the invention.

DETAILED DESCRIPTION

Figure 1:
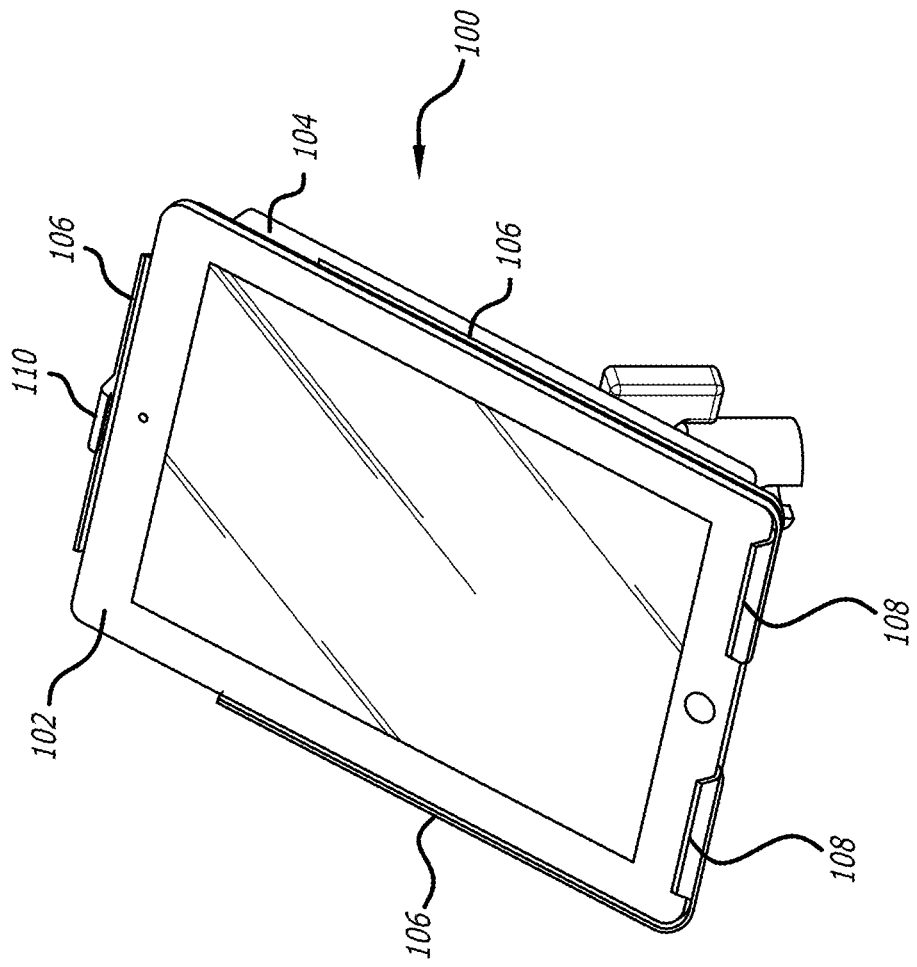
FIG. 1 is a perspective view of one example of an implementation of a cooling mount of the present invention as it appears engaged with a tablet.
Figure 65:
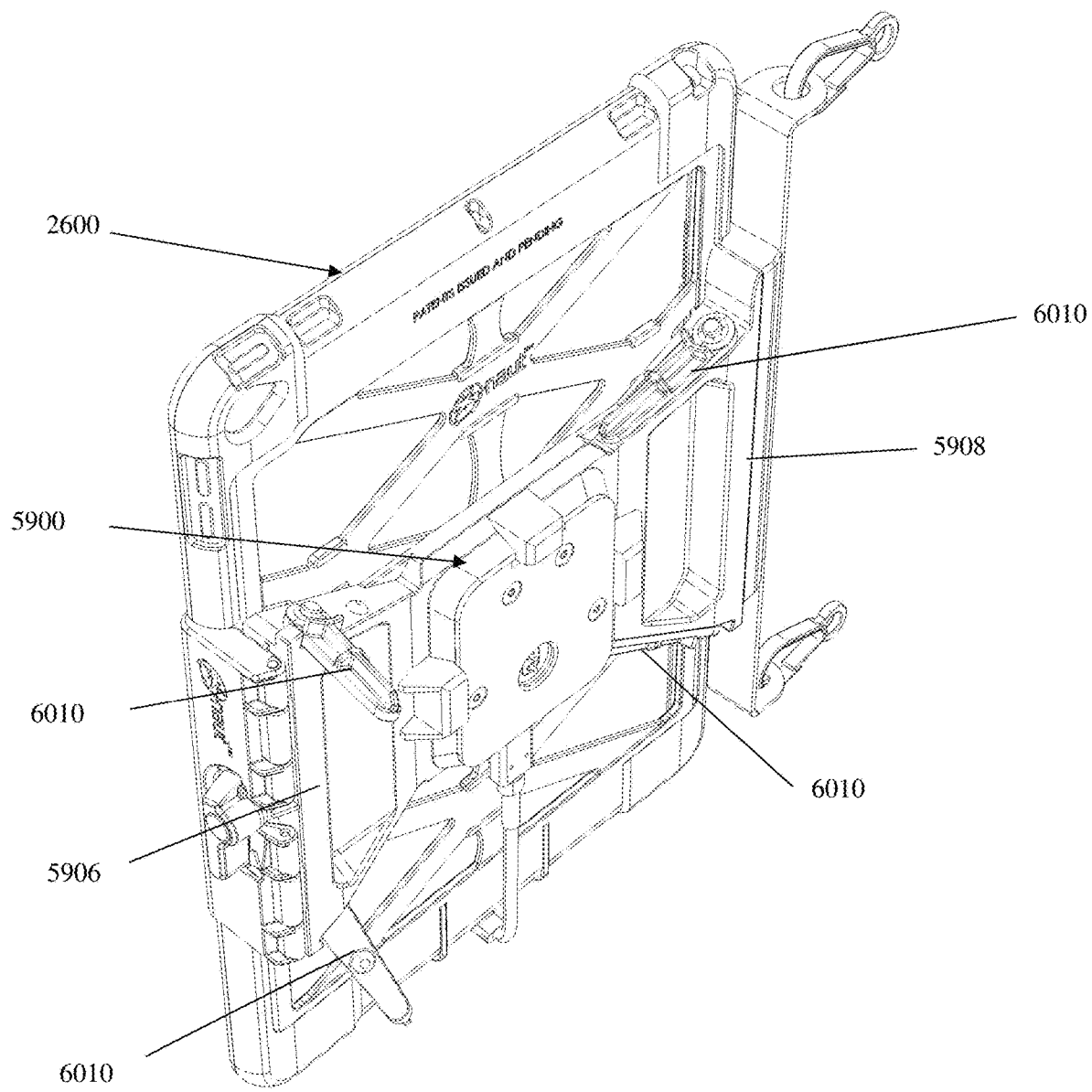

As illustrated in FIGS. 1-65, the current invention relates to a cooling mount 100 for portable electronic devices 102 that will not only extend product life, but also prevent critical temperature shutdowns and general overheating of the devices 102. As illustrated and explained further below, the cooling mount 100 of the present invention houses a portable electronic device 102 in a manner that allows for air flow across the rear of the device 102 to cool the electronic device during use. In one example implementation, fans, powered by internal and/or external power sources, may be used in the cooling mount to produce airflow across the back of the device. As further illustrated below, the cooling mount may include a mechanism for fastening the cooling mount to a person or object, may include an external power source for use as primary or back-up power supply and may also include a temperature probe for monitoring the temperature of the electronic device and/or air surrounding the device and initiating air flow when predetermined temperatures are detected. The cooling mount may further include a heating element to prevent the portable electronic device from shutting down in cold temperatures, creating an overall temperature regulating mount, device or unit. The temperature regulating unit of the present invention may cool the portable electronic device, heat the portable electronic device, or provide both heating and cooling of the portable electronic device.

As seen in FIGS. 47-65, the invention may further include a magnet mount assembly for quickly mounting and releasing the portable electronic device to various objects, including stands, clamps and/or holders (i.e., support mount) to support the portable electronic device in elevated positions at a variety of angles. The magnet mount assembly may attach to the back of the temperature control unit or to the back of the portable device by, for example, engaging the protective perimeter casing. The mount may further include pong pins or other electrical connectors for supplying power to the cooling mount and/or portable electronic device when the magnet mount assembly is connected to a support mount. Turning now to FIG. 1. FIG. 1 is a perspective view of one example of an implementation of a cooling mount 100 of the present invention as it appears engaged with a portable electronic device 102, which in this example, is a tablet. As illustrated in FIG. 1, the cooling mount 100 includes a generally polygonal shaped housing 104 made of a general rigid material having a front face of the general shape of a portable electronic device 102. Although the portable electronic device 102 in FIG. 1 is a tablet, such as an iPAD, the present invention can be designed of varying sizes and shapes to engage other types and sizes of portable electronic devices 102, such as smart phones and personal computers. Further the cooling mount 100 may include adapters (not shown) for accommodating various types of the devices without modifying the overall design.

While FIG. 1 shows the cooling mount 100 and portable electronic device 102 in a portrait orientation, the position of cooling mount 100 may easily be changed to a landscape orientation or other orientation, depending on the orientation of the electronic device. Further, although the housing 104 is illustrated as a rectangular polygonal shape, the cooling mount 100 is not so limited in shape and may be designed of any shaping having a front face for mounting the electronic device 102.

The portable electronic device 102 is mounted on the front face of the cooling mount 100. The front face of the cooling mount 100 includes a general raised perimeter 106 having a retaining device 108, 110 for receiving and retaining the portable electronic device 102 on the front face of the cooling mount 100. For example, and as illustrated in FIG. 1, the device 102 may be retained along various points around its perimeter by raised 106, channeled 108 or clipping 110 mechanisms that are positioned along the housing 104 sidewalls securing, hooking and/or clipping the device to the front of the cooling mount 100.

Figure 2:
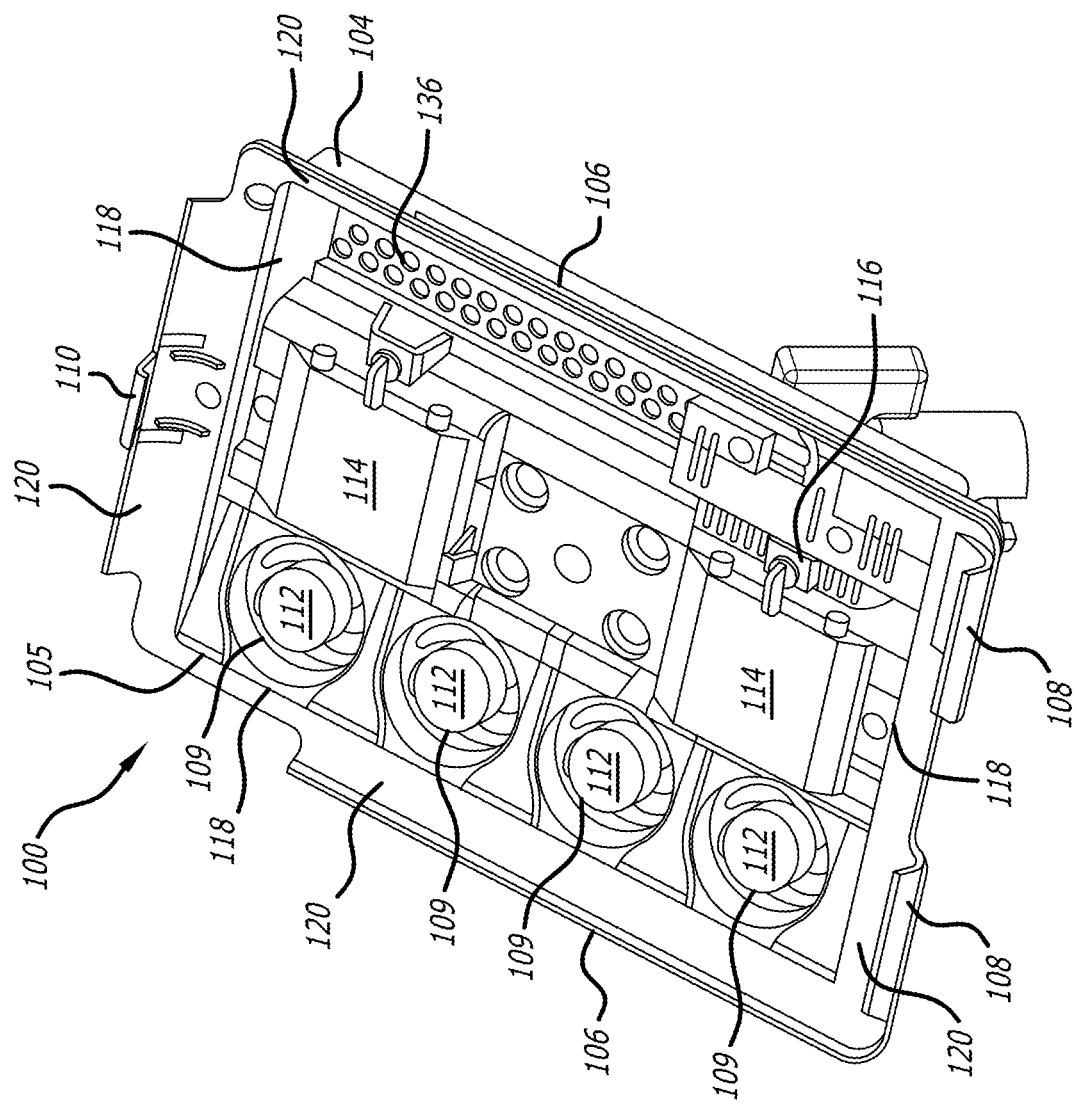
FIG. 2 is a front perspective view of the cooling mount of FIG. 1 with the tablet removed.

FIG. 2 is a front perspective view of the cooling mount 100 of FIG. 1 with the tablet 102 removed. As illustrated in FIG. 2, the cooling mount 100 provides a user with the ability to lower the internal and external temperatures of the device 102 through a cooling unit 105, which in this is example, is a series of fans 112 that blow across thermodynamically designed airflow paths 109 through ports 136. In this example, the fans 112 are powered by an internal power source 114, which in this example, are batteries within a battery housing. An electronic circuit board 116 may also be provided to further control the operation of the fans 112 and optionally provide external power to the fans 112 from an external power source (not shown). Optionally, and as further described below, the electronic circuit board 116 may be in communication with a temperature sensing device 160 for determining when to turn on and/or off the cooling unit 105 and control other functions and features of the mount 100 (e.g., power low light indicator).

As illustrated, in this example, the cooling mount 100 includes generally inwardly angled side walls 120 that converge toward a recessed compartment 118 for housing the cooling unit 105, power supply (i.e. batteries) located within the battery housings 114 and circuit board 116. To allow for cooling unit 105 in the cooling mount 100 to blow air across the airflow paths 109, the portable electronic device 102, when engaged with the cooling mount 100, rests above the fans 112, power supply (i.e. batteries) located within the battery housings 114 and circuit board 116. Accordingly, the cooling unit 105 is positioned in the recessed compartment 118 at the rear of the cooling mount 100 to maintain a predetermined amount of air space between the back of the electronic device 102 and recessed compartment 118.

By having the sides walls 120 angle downwardly and inward toward the recessed compartment 118, the portable electronic device 102 is maintained on the front face of the cooling mount 100, resting against the perimeter edges of the side walls 102 and engaged by raised 106, channeled 108 or clipping 110 mechanisms. Breaks in the sidewalls 120 and the raised 106, channeled 108 or clipping 110 mechanisms allow the portable electronic device 102 to be slid easily into the cooling mount 100 and further permits access to such things as the external power port, on/off switch, microphone, speakers, volume controls and/or other buttons on the top and sides of portable electronic device.

Figure 3:
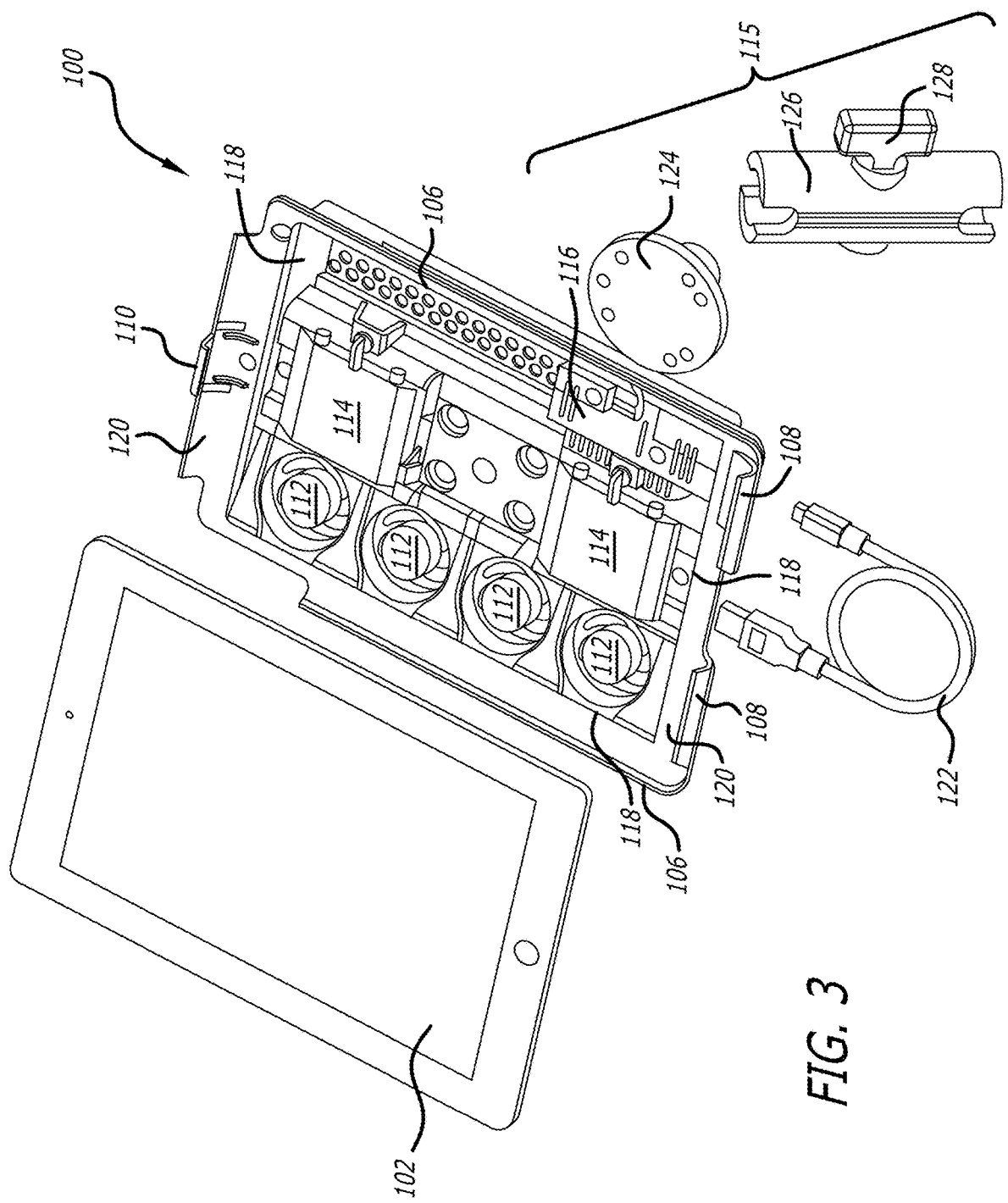
FIG. 3 is a perspective view of the cooling mount of FIG. 1 separated from the tablet.

FIG. 3 is a perspective view of the cooling mount 100 of FIG. 1 separated from the electronic device 102 and best illustrates the cooling unit 105 and component parts housed in the recessed compartment 118. Shown from the front are the exposed fans 112, battery housings 114 and circuit board 116. When the portable electronic device 102 is removed, unhinged or unhooked from the invention, access to the internal power source (i.e. batteries) located within the battery housings 114 becomes readily available. This facilitates the quick and easy changing of batteries when power is low during operation. FIG. 3 also illustrates an external power cord 122 that may be used to connect the mount 100 to an external power source, which as illustrated in connection with FIG. 9 below, may be an external battery. Additionally, FIG. 3 illustrates one example of a mounting mechanism 115 that may be connected to the back of the cooling mount 100, as will be further described in connection with FIG. 10 below, for mounting the cooling mount 100 to an object. In this example, the mounting mechanism 115 consists of a ball pivot mechanism 124, a clamping device 126 into which the ball pivot fits and a nut adjustment assembly 128.

Figure 4:
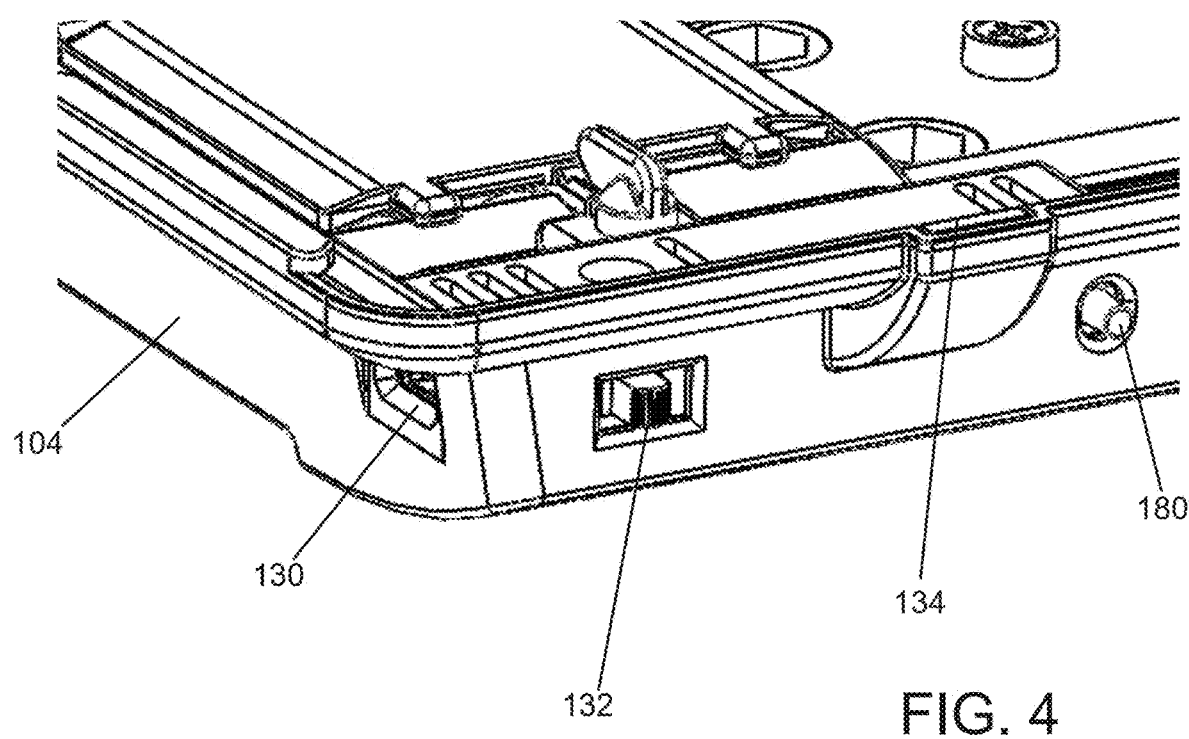
FIG. 4 is a perspective elevation view of the bottom left side of the cooling mount of FIG.

FIG. 4 is a perspective elevation view of the bottom left side of the cooling mount 100 of FIG. 1. FIG. 4 illustrates an external power connection port 130 in the cooling mount housing 104 which may be connected to an external power source in lieu of battery power and a power switch 132 and that provides a means for selecting power input source (either internal or external, e.g., USB or internal batteries). External power can be applied to the invention, for example, through a USB or micro USB connector 122 (i.e., power switch-over is initiated by a slide switch). Extended shrouding can protect the micro USB power connector.

FIG. 4 further shows a battery indicator light 134 that in a specific implementation emits a green light if the internal batteries are in a high power condition, a yellow light if the batteries are in a low power condition and a red color if the batteries need to be replaced. However, in other implementations, the indicator can emit any color or wavelength of visible light as desired. FIG. 4 also illustrates a battery test button 180 for the invention that if pushed allows a user to test the strength of the internal batteries. While these components are illustrated as positioned on the bottom left side of the cooling mount 100, those skilled in the art will recognize that these features may be located at various locations along the mount 100.

Figure 5:
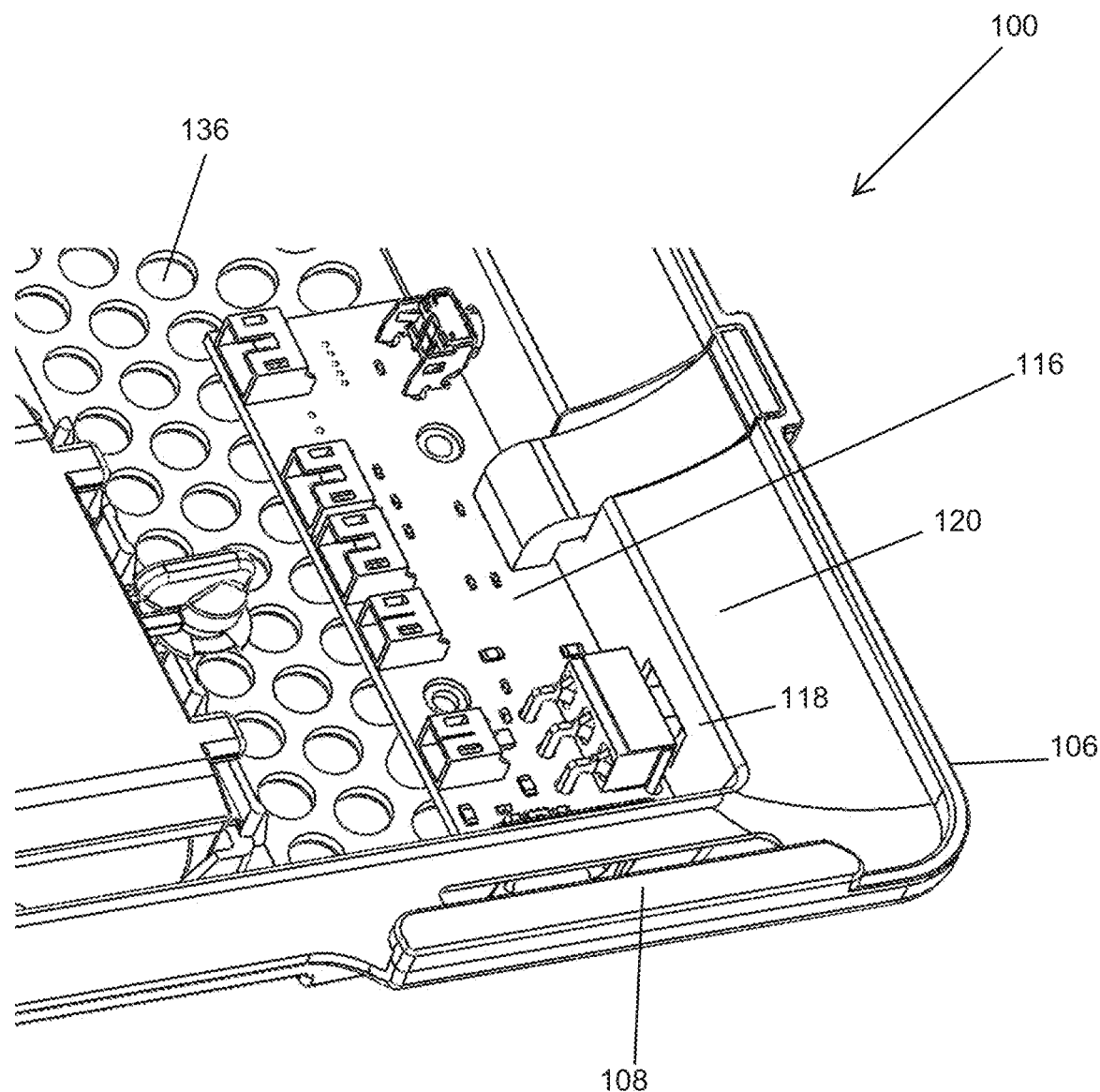
FIG. 5 is a close-up top perspective view of the bottom right corner of the cooling mount of FIG. 1.

FIG. 5 is a close-up top perspective view the bottom right corner of the cooling mount 100 of FIG. 1 showing the circuit board 116, the recessed compartment 118 and the side walls 120 and raised 106 and channeled 108 mechanism within or upon which the portable electronic device 102 rests.

Figure 6:
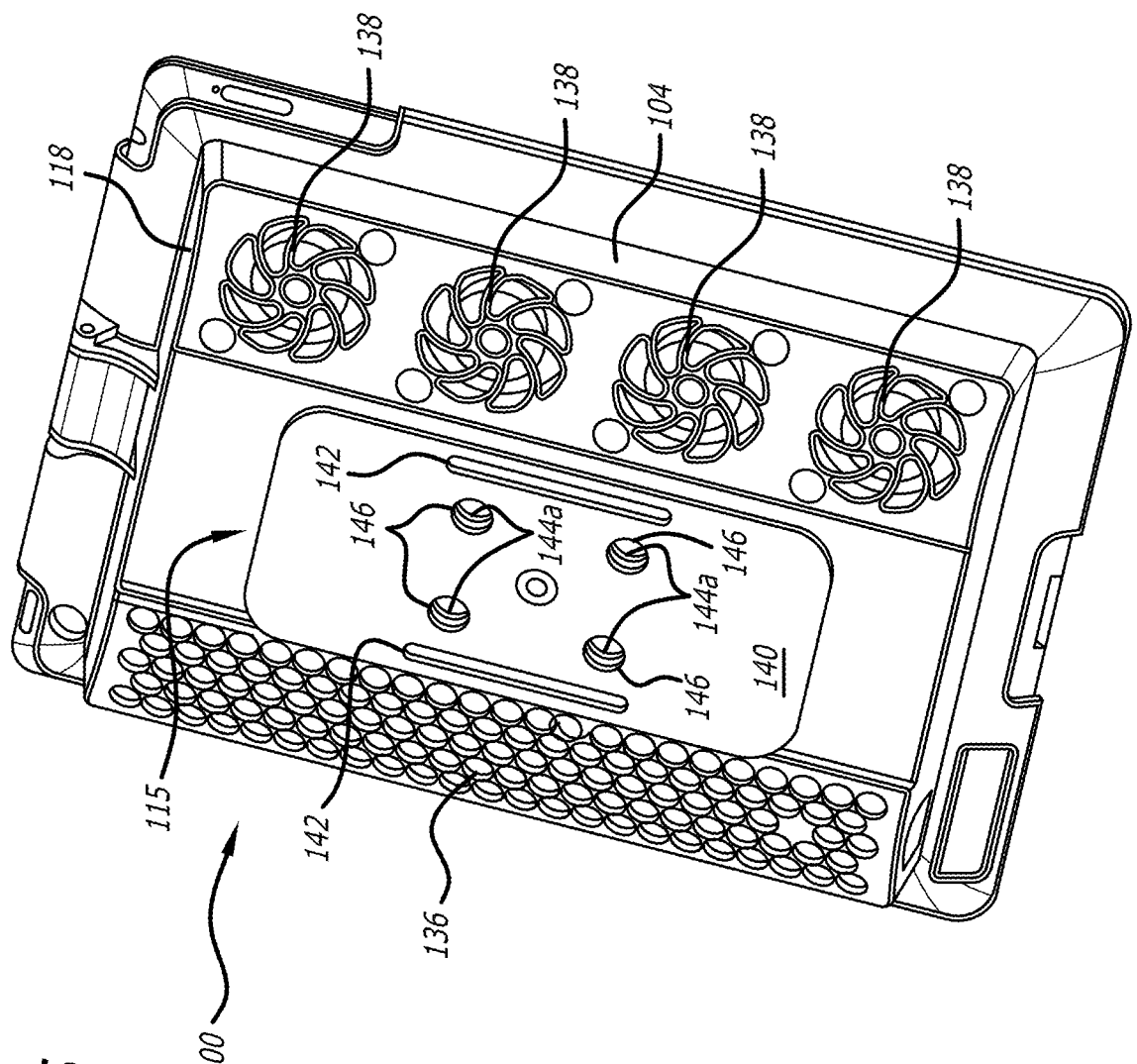
FIG. 6 is a rear perspective view of the cooling mount of FIG. 1.

FIG. 6 is a rear perspective view of the cooling mount 100 of FIG. 1 illustrating the ventilation holes 138 for the fans 112 and one example of a mounting mechanism 115 attached to the cooling mount 100. FIG. 6 best illustrates the recessed compartment 118 of the portable cooling mount 100 which houses the fans 112, battery housings 114 and circuit board 116 outward and away from the back of the electronic device 102. As illustrated in FIG. 6, the recessed compartment 118 includes angled panels for mounting the fans 112 at an inward angle to blow across the cooling mount 100 and the back of the electronic device 100. FIG. 6 illustrates the opposing and angled nature of the series of fans 112 directing air flow across the back of the portable electronic device 102 when inserted into the cooling mount 100. The air from the fans 112 is vented out of holes or ports 136 on the backing of the cooling mount. The ports 136, as illustrated may be positioned on an angled panel opposing the panel for mounting the fans 112. Also illustrated in FIG. 6 is one example of a mounting mechanism 115 for the invention, which in this case is a mounting plate 140 that is affixed to the back of the housing 104 of the cooling mount 100 by fasteners 144a through holes 146 in the mounting plate 140.

Figure 7:
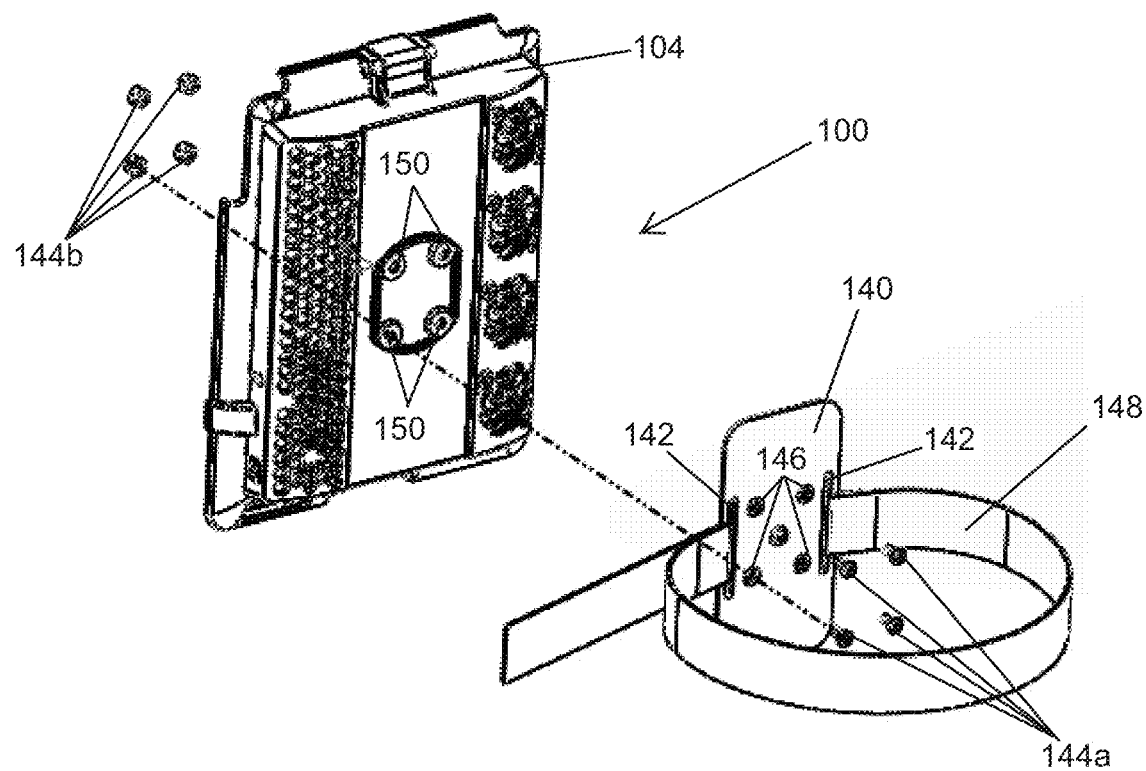
FIG. 7 is a rear perspective exploded view of the cooling mount of FIG. 1 showing one example of a mounting mechanism that may be attached to the back of the cooling mount.

FIG. 7 is a rear perspective exploded view of the cooling mount 100 of FIG. 1 showing one example of a mounting mechanism 115 that may be attached to the back of the cooling mount 100. While various mounting mechanisms 115 may be used to mount the cooling mount 100, in this example, the mounting mechanism 115 is a leg strap 148 for mounting the cool mount 100 to a user's leg. The mounting mechanism 115 includes a mounting plate 140, a leg strap 148 that passes through slots 142 in the mounting plate 140 and fasteners 144a and 144b that pass through holes 146 in the plate 140 for mounting the plate 140 to corresponding holes 150 on the back of the cooling mount 100. The strap 148 may be, for example, an adjustable strap for attaching the cooling mount 100 and portable electronic device 102 directly to a part of the user, such as the user's leg, or, alternative, a large and stable object. The strap 148 may be adjustable and secured by means of Velcro or other fastening device to adjust the position and size of the strap 148 around the object to which it is mounted.

Figure 8:
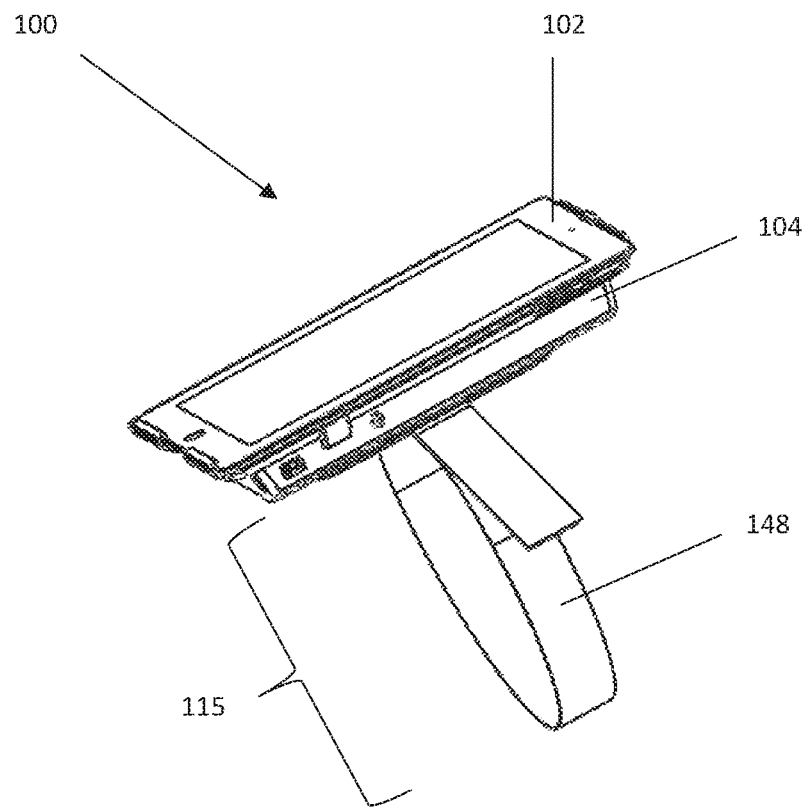
FIG. 8 illustrates a side perspective view of one example of the cooling mount of FIG. 1 having a mounting mechanism attached to the rear of the cooling mount.

FIG. 8 shows the mounting mechanism 115 of FIG. 7 affixed to the back of the housing 104 of the cooling mount 100. In operation, as explained above, the strap 148 attaches the cooling mount 100 and portable electronic device 102 directly to the user (i.e., the user's leg) or to another object.

Figure 9:
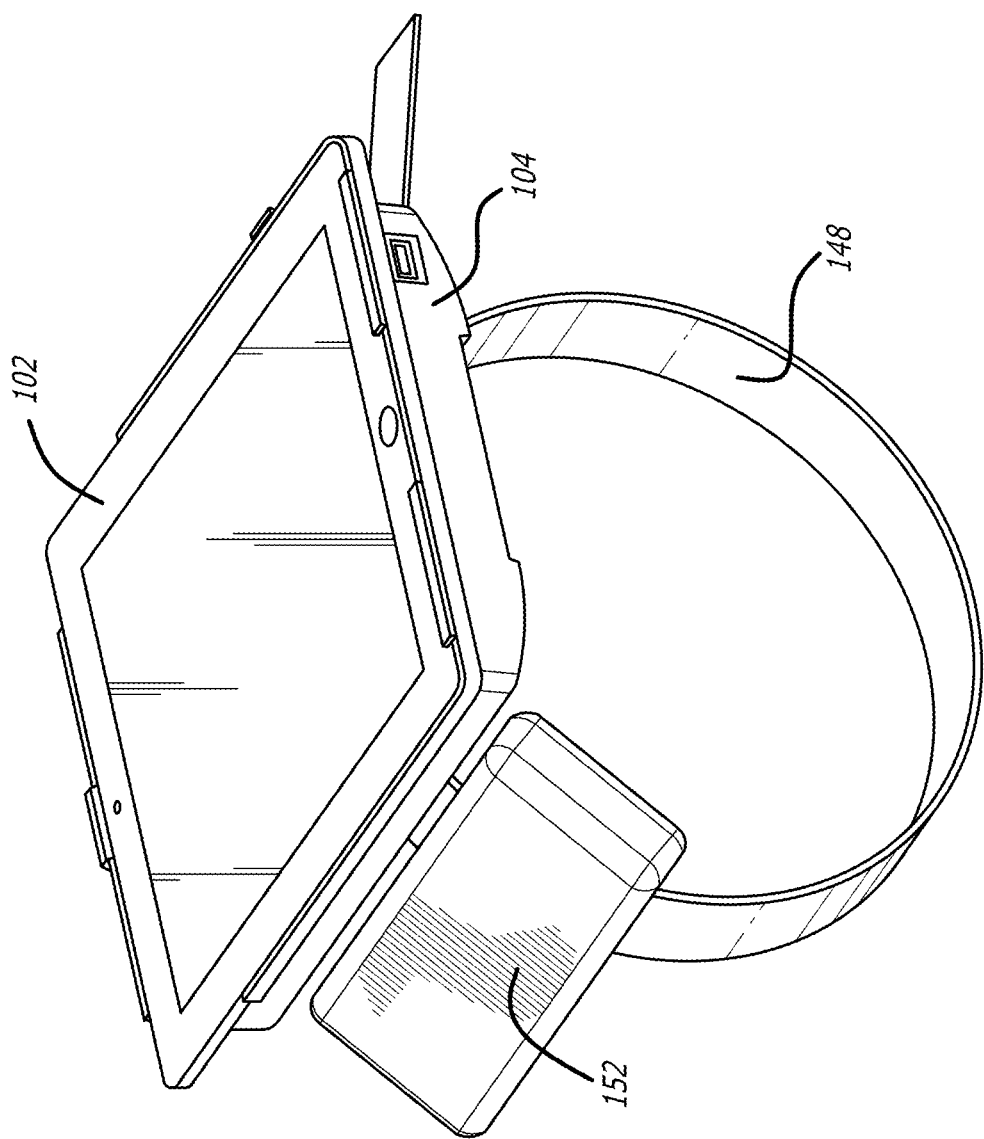
FIG. 9 is a perspective elevation view of the cooling mount of FIG. 1 showing an example of an external power supply mounted onto a mounting mechanism.

FIG. 9 is a perspective elevation view of the cooling mount 100 of FIG. 1 showing an example of an external power supply 152 mounted onto the leg strap 148 of a mounting mechanism 115. Optionally, an external power source, such as battery pack 152, may be utilized to power the cooling mount 100 or, alternative, provide external power for the portable electronic device 102. In this example, the mounting mechanisms 115 for mounting the cooling mount 100 may include an additional feature for holding and supporting an external power supply 152. The external power device may also be mounted onto the back of the portable tablet cooling device (not shown) or at another location on the mounting mechanism 115, such as the mounting plate 140. In use, the internal power source, such as the batteries pack, may also be charged periodically through the power port using an external power supply or the back-up battery pack.

Figure 10:
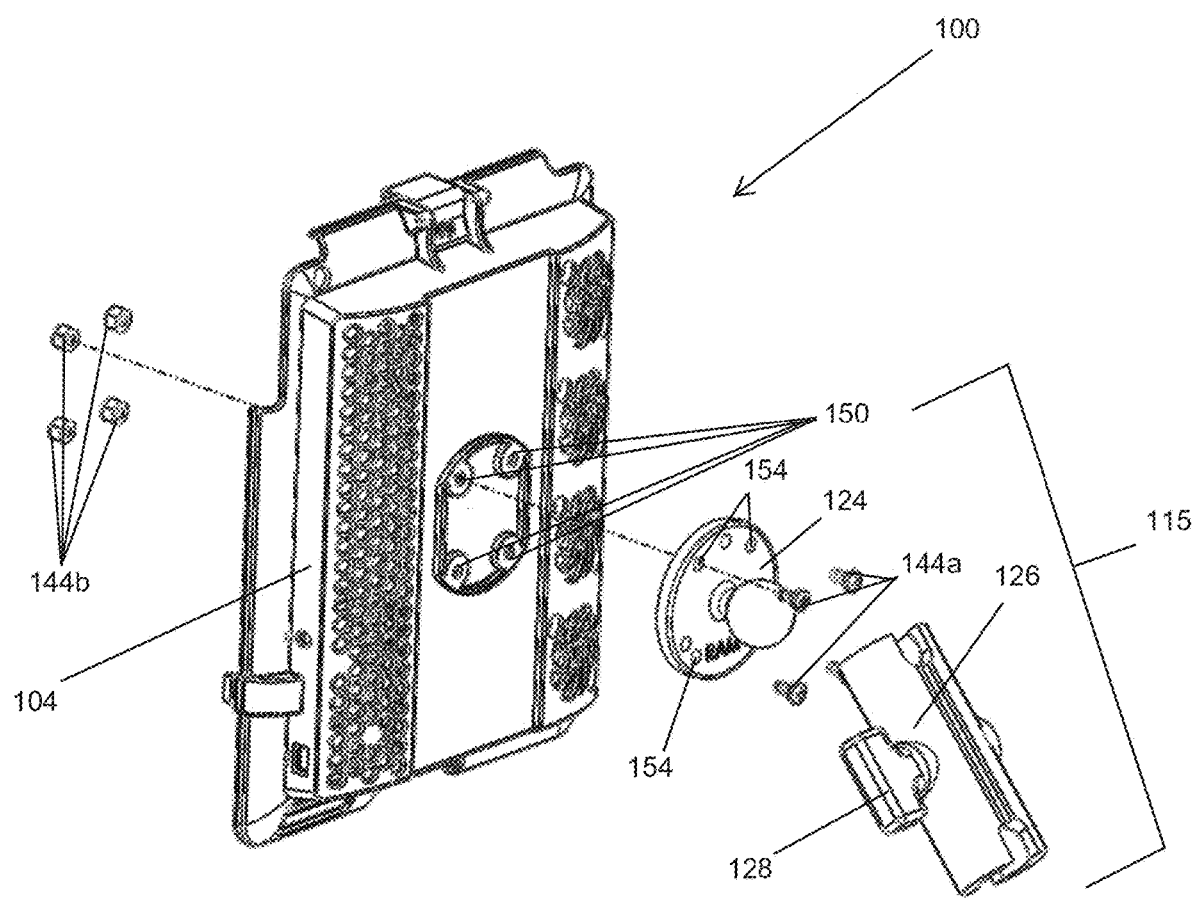
FIG. 10 is a rear perspective exploded view of the cooling mount of FIG. 1 showing an example of another mounting mechanism that may be attached to the back of the cooling mount.

FIG. 10 is a rear perspective exploded view of the cooling mount 100 of FIG. 1 showing another example of a mounting mechanism 115 that may be attached to the back of the cooling mount 100. In this example, the mounting mechanism 115 includes a ball pivot mechanism 124, which can be affixed to the back of the cooling mount housing 104 using fasteners 144a and 144b that pass through holes 154 in the ball joint assembly 124 that engage holes 150 on the back of the housing 104. The ball joint may then snap into a clamping device 126 with a nut adjustment assembly 128 that permits the user to clamp the cooling mount 100 and engaged portable electronic device 102 onto an object within the cabin, cockpit or immediate area surrounding the user (e.g., dashboard) operating a land, air or water vehicle positioned within the reach or vicinity of the user. The ball joint 124 permits the cooling mount 100 and device 102 to be repositioned easily by allowing for a pivotal mount.

Figure 11:
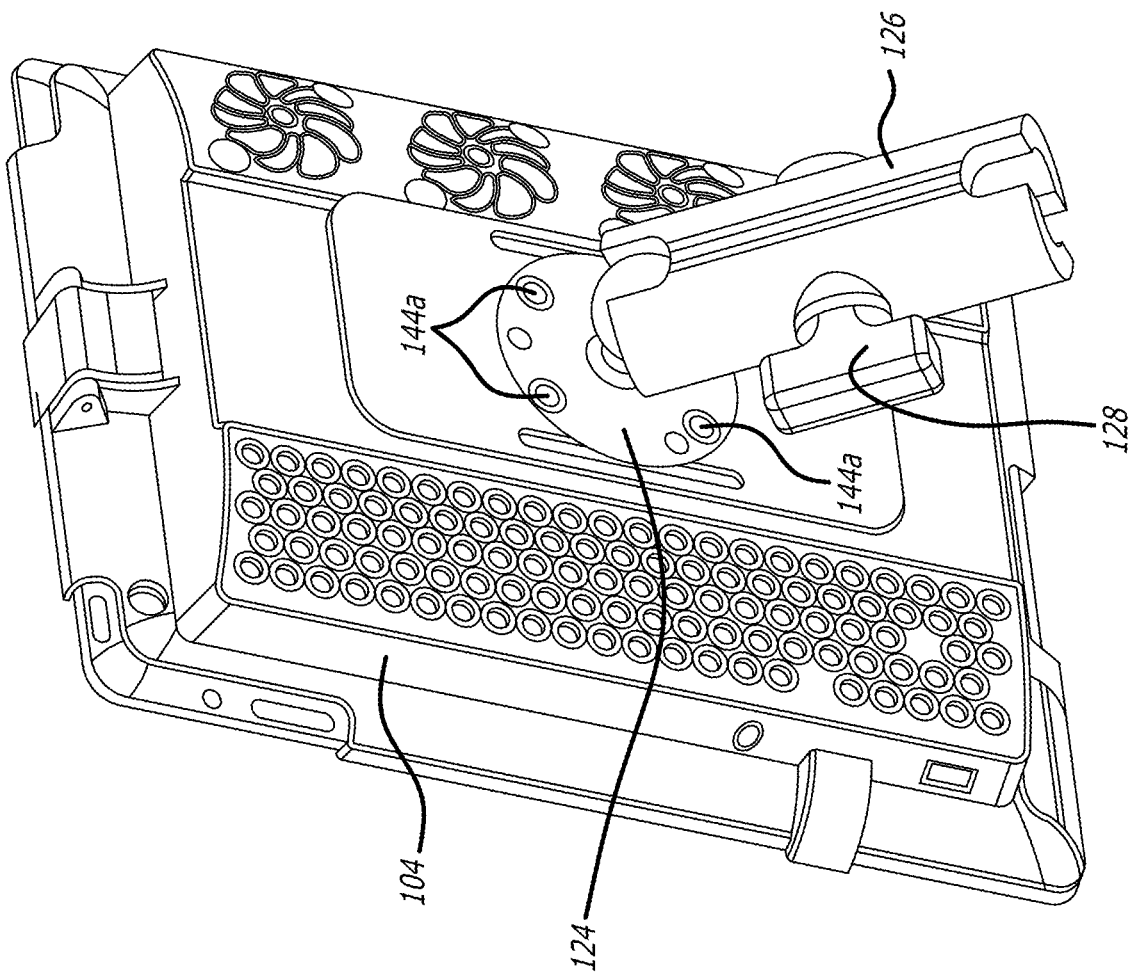
FIG. 11 is a rear perspective view of the cooling mount of FIG. 1 showing the mounting mechanism of FIG. 10 attached to the back of the cooling mount.

FIG. 11 shows the mounting mechanism of FIG. 10, mounted on the rear of the cooling mount housing 104 with fasteners 144a, with its ball joint snapped into the clamping device 126. In this example, the ball joint assembly 140 is mounting to the mounting plate 140 rather than directly to the back of the cooling mount 100. In this manner, the ball joint assembly 140 can be removed to provide access to the leg mount device without requiring the mounting plate of the leg mount to be secured to the cooling mount 100, facilitating easier interchangeability between mounts.

Figure 12:
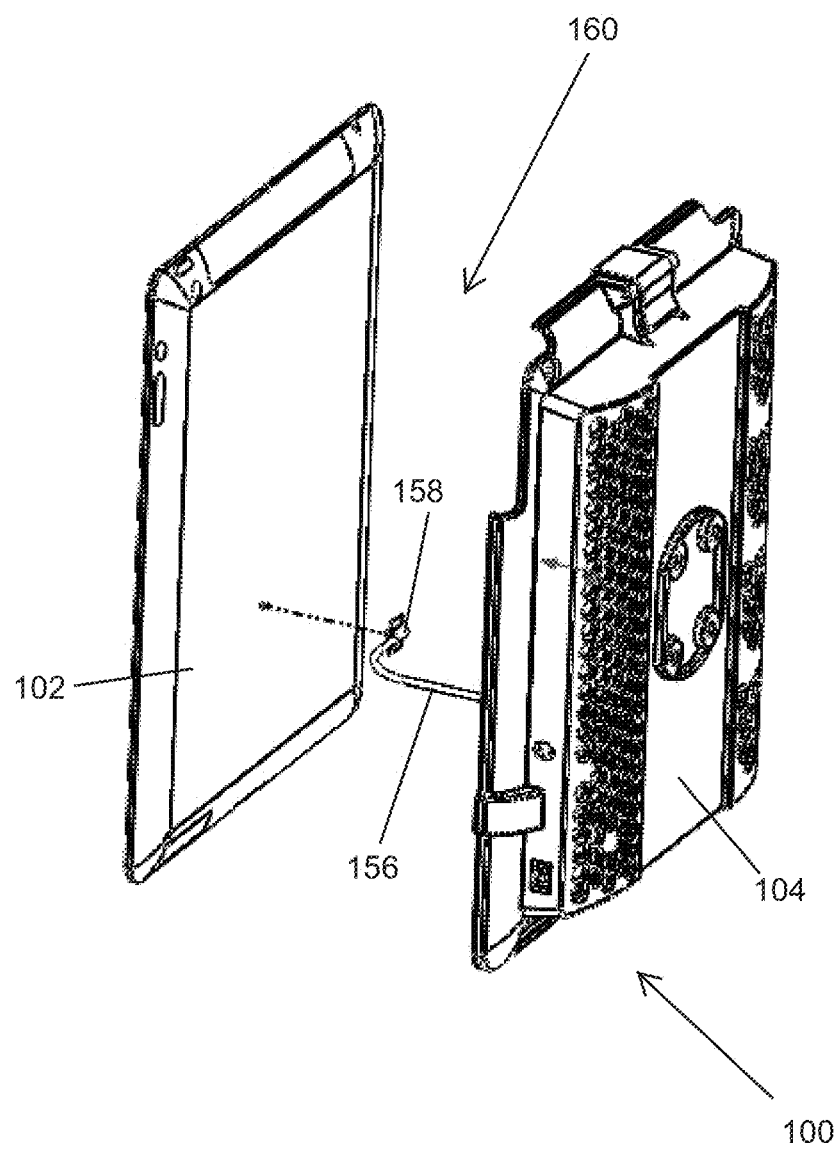
FIG. 12 is rear perspective exploded view of the cooling mount of FIG. 1 having a temperature sensing device for measuring the temperature of the portable electronic device engaged by the cooling mount.

FIG. 12 is rear perspective exploded view of the cooling mount of FIG. 1 having a temperature sensing device 160 for measuring the temperature of the portable electronic device 102 engaged by the cooling mount 100. In this example, a temperature sensing device 160 includes a probe 158 that may be positioned on the back of the portable electronic device 102 for monitoring the temperature of the portable electronic device 102. The temperature sensor or probe 158 may be in electronic communication with cooling unit 105 and may control the operation of the cooling unit 105 based upon measure temperatures of the electronic device 102 and/or the ambient air surrounding the device 102. Controls may trigger the operation of the cooling unit 105 from an on to an off state depending upon the detected temperatures. Optionally, an in other implementations, applications on the electronic device 102 may be also be able to measure the internal and/or external temperature of the device 102 and communicate such temperature information to the cooling mount 100.

Figure 13:
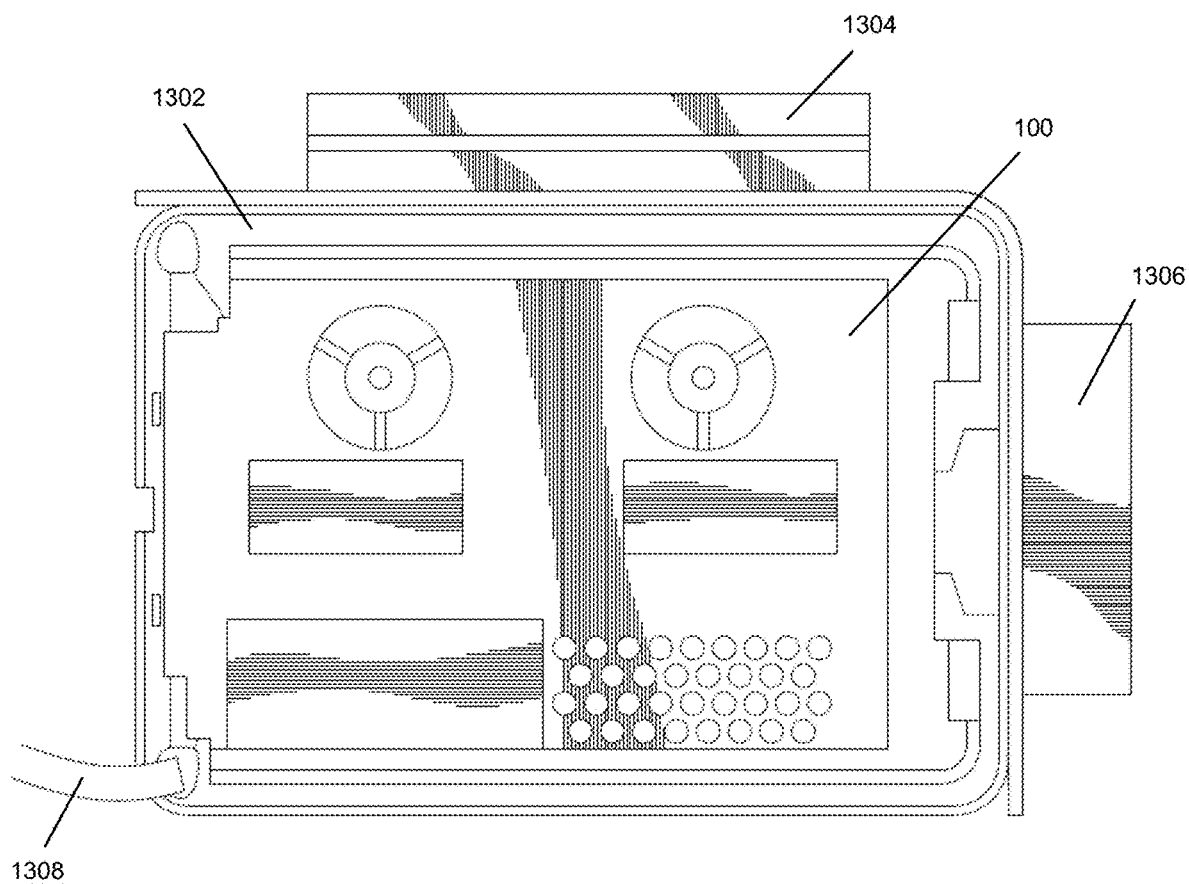
FIG. 13 is a top view of the cooling mount of FIG. 1 positioned in a perimeter mount for adding additional functionality to the cooling mount.

FIG. 13 is a top view of the cooling mount 100 of FIG. 1 positioned in a perimeter mount 1302 for adding additional functionality to the cooling mount 100. The perimeter mount 1302 may be a flex-frame that hooks directly to the cooling mount 100 to provide multiple mounting or attachment points for additional supports and/or electronic devices, including, but not limited to, point of sale systems, hand straps, sash straps and external battery packs. For example, FIG. 13 shows external devices such as a point of sale system 1304 that can be used to swipe credit cards, debit cards or any other forms of payment when making a sale, and an external battery pack 1306 for providing additional power to either the cooling mount 100 and/or to an electronic device mounted on the cooling mount.

While FIG. 13 shows the point of sale system 1304 and external battery pack 1306 on specific perimeter sides of the perimeter mount 1302, it should be understood that additional supports or external devices may be located on any side of the perimeter mount 1302. Additionally, additional supports and/or external devices may be attached to the perimeter mount in a variety of different ways, including but not limited to, screws, hooks, bolts, glue, tape and Velcro. For example, as shown in FIG. 13, point of sale system 1304 may be attached to perimeter mount 1302 using Velcro while external battery pack 1306 may be attached to perimeter mount 1302 through the use of hooks or screws that go in openings or slots 1402 (shown in FIG. 14) that may be located on the side of perimeter mount 1302.

FIG. 13 further illustrates a lanyard 1308 attached to perimeter mount 1302. Lanyard 1308 may be attached to a shoulder strap (not shown) using a clip, carabiner, or any other attachment mechanism such that the perimeter mount can be supported by the shoulder of the user. The shoulder strap may comprise of any material known in the art and can be adjustable. In use, for example, a server standing outside, such as in a drive through restaurant, may be able to take someone's order using the cooling mount 100 and perimeter mount 1302. The user can carry or support the perimeter mount 1302 over the shoulder using a shoulder strap and then hold the mount 1302 using the hand strap device 1502 in either the horizontal and/or vertical position to access the electronic device positioned on the perimeter mount 1302 for taking a food order. The point of sale system 1304 attached to the perimeter mount 1302 may then be used to swipe a customer's credit card once the order is place. The perimeter mount 1302 and cooling mount 100 will prevent electronic devices such as iPads from overheating and may allow for the full processing of any purchasing order, including taking credit card, debit card or other payments.

Figure 14A:
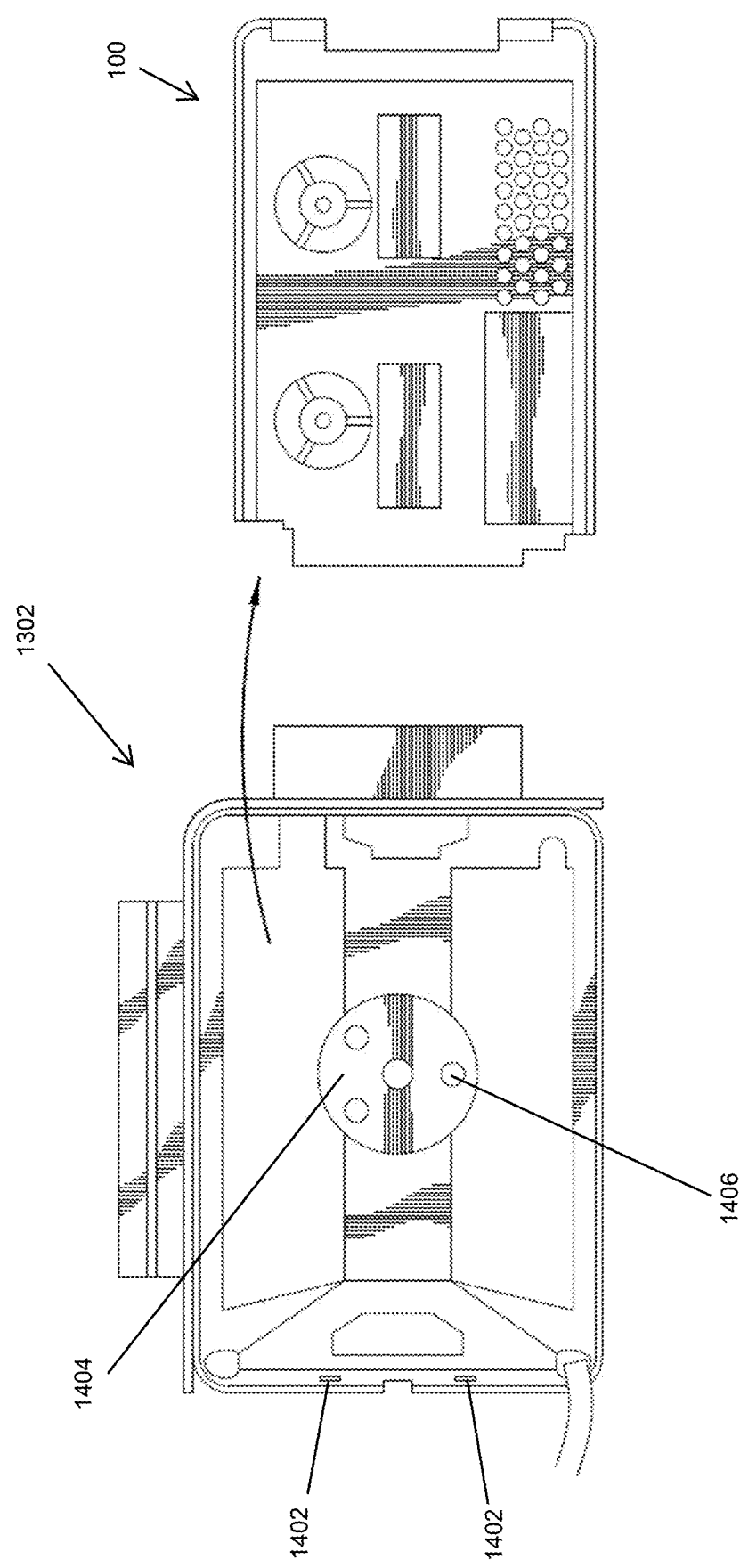
FIG. 14A is a top view of the cooling mount of FIG. 13 removed from the perimeter mount.

FIG. 14A is a top view of the cooling mount 100 of FIG. 13 removed from the perimeter mount 1302. As shown in FIG. 14A, the back of the perimeter mount 1302 may have a mounting plate 1404. The mounting plate 1404 may include holes 1406 for securing or bolting to the cooling mount 100 and/or additional devices, like hand straps and point of sale systems. Further, the mounting plate 1404 can include attachments for cable management. Additional items that can be secured to the mounting plate 1404, may include, but not be limited to, sun shades.

Figure 14B:
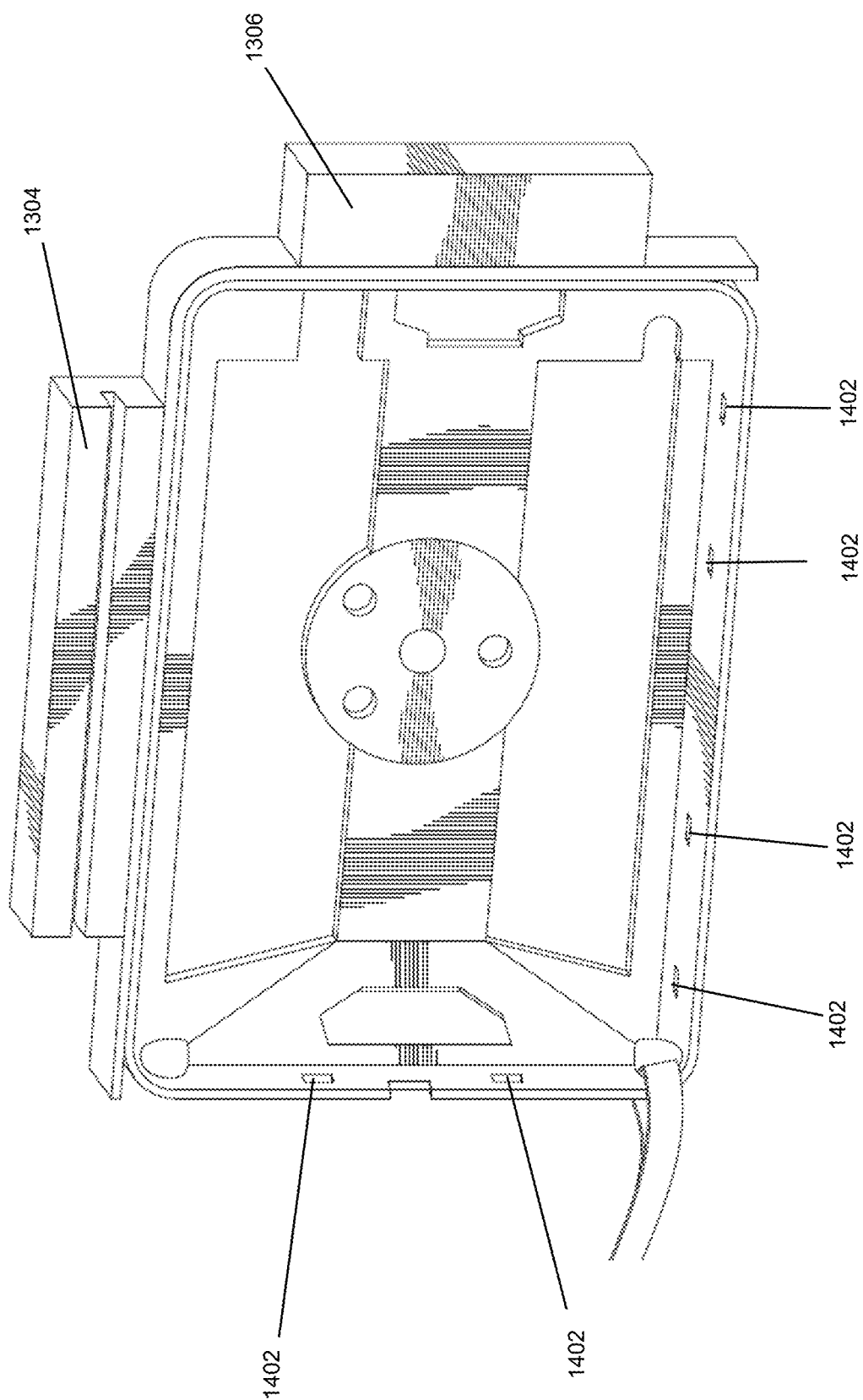
FIG. 14B is a front perspective view of the perimeter mount of FIG. 13.

FIG. 14A also illustrates attachment slots 1402 for attaching elongated sides 1602 (shown in FIG. 16) and/or additional electronic devices 102 to the perimeter mount 1302 that may operate in conjunction with the electronic device held by the cooling mount 100, such as point of sale devices 1304 and/or external battery packs 1306. Attachment slots 1402 may be located on any side of perimeter mount 1302. FIG. 14B illustrates a front perspective view of perimeter mount 1302. In particular, FIG. 14B shows attachment slots 1402 located on the longer side of perimeter mount 1302.

Figure 15:
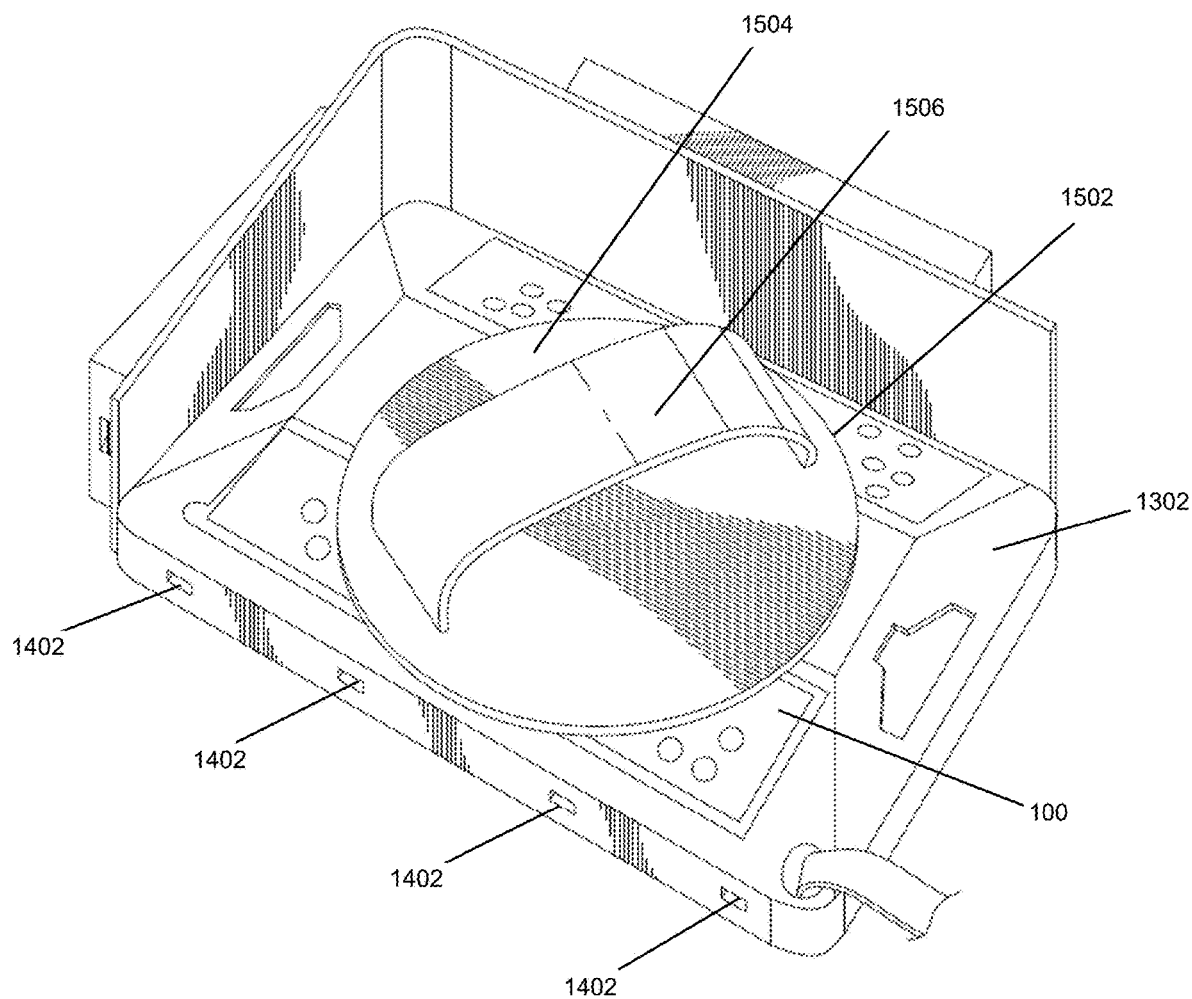
FIG. 15 is a back perspective view of the perimeter mount of FIG. 13 where a hand strap device is mounted to the back of the perimeter mount.

FIG. 15 is a back perspective view of perimeter mount 1302 illustrating the attachment of a hand strap device 1502 to the mounting plate 1404. The hand strap device 1502 may include a rotatable disc 1504 and strap 1506. The rotatable disc 1504 may be capable of rotating 360 degrees along its central axis. Thus, the hand strap device 1502, when mounted to the mounting plate 1404 of perimeter mount 1302 may be capable of rotating the perimeter mount 1302 along its central axis such that the electronic device 102 that is located within the perimeter mount 1302 may be oriented in either a landscape or portrait position while the user's hand is in the hand strap device 1502.

Figure 16:
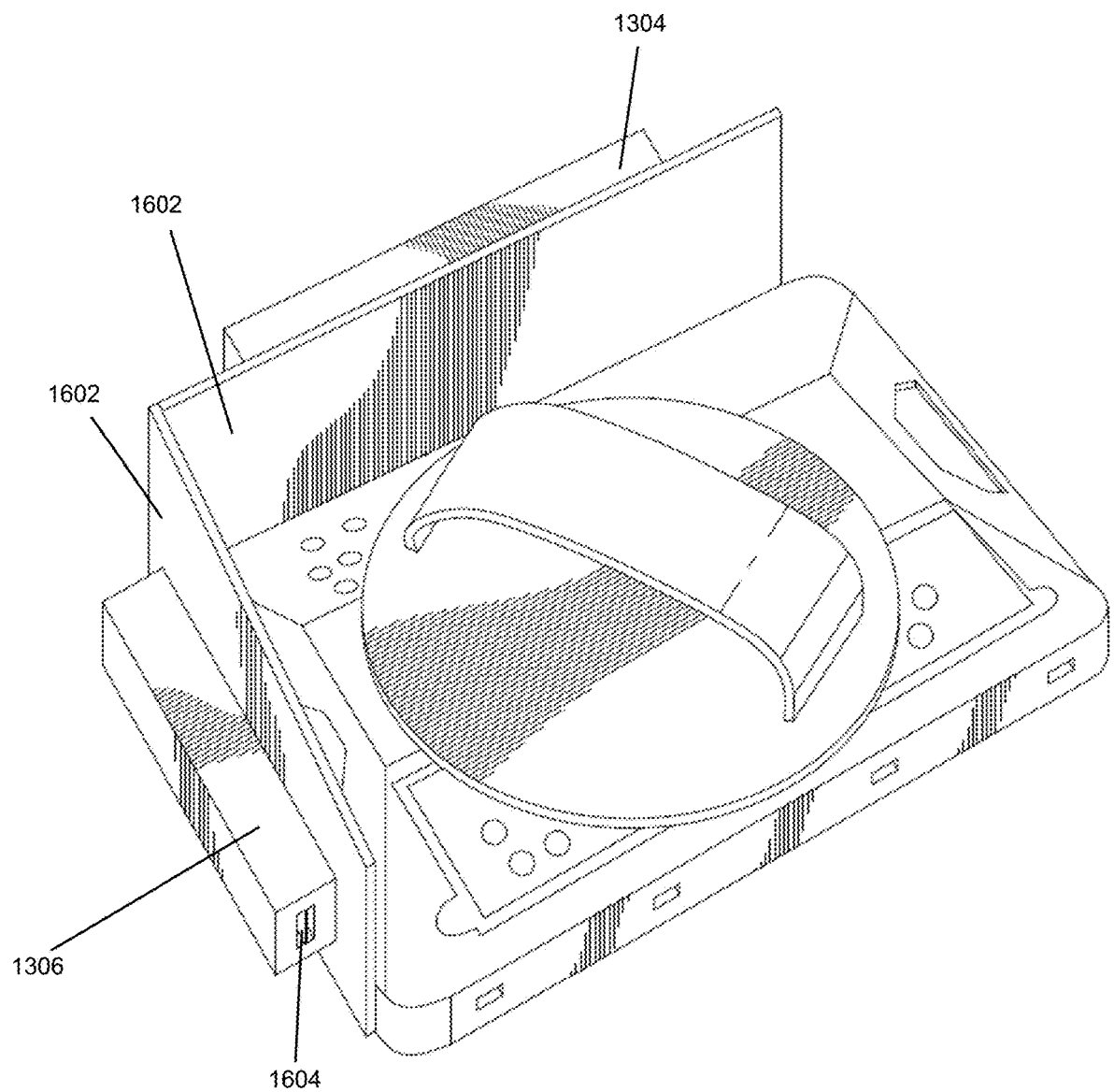
FIG. 16 is another back perspective view of the perimeter mount of FIG. 13 where a hand strap device is mounted to the back of the perimeter mount.

FIG. 16 is another back perspective view of perimeter mount 1302 illustrating the perimeter mount having elongated sides 1602 for the attachment of additional external devices such as external battery pack 1306, point-of-sale devices 1304 or any other associated electronics. The external battery pack 1306 may have a USB port 1604 or any other port that provides power to either the cooling mount 100 and/or electronic device 102. The elongated side 1602 may be made of plastic or any other rigid material. The elongated side 1602 may also serve as a dual purpose, one which is to provide attachment means to an external device but also to act as a stand for perimeter mount 1302. It should be understood that elongated sides 1602 may be located on one or more perimeter sides of the perimeter mount 1302. For example, FIG. 15 illustrates elongated sides 1602 located on two perimeter sides of the perimeter mount 1302.

Figure 17:
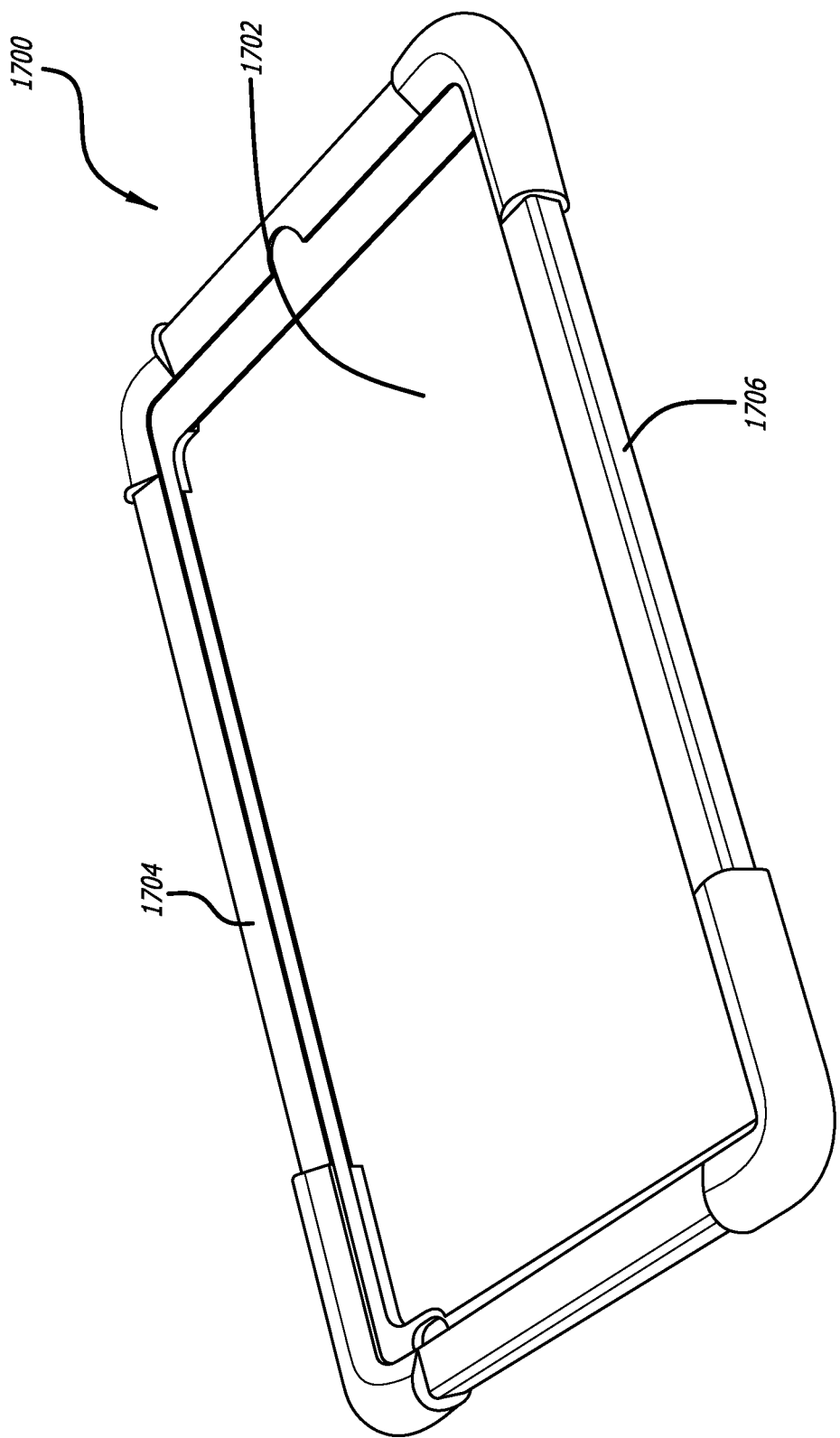
FIG. 17 is a front perspective view of one example of a perimeter casing that can be placed around the perimeter of an electronic device.
Figure 20:
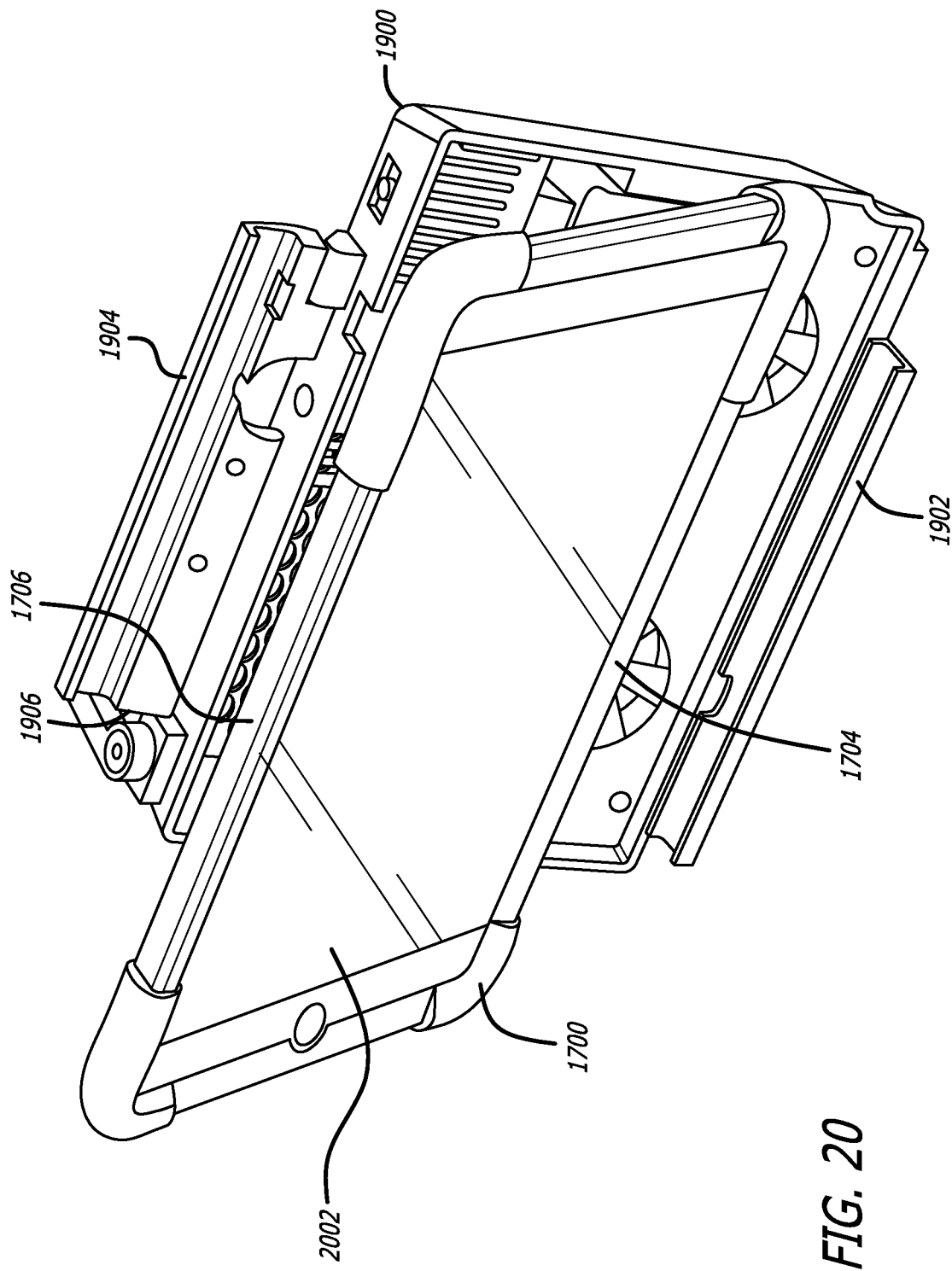
FIG. 20 is a front perspective view of an electronic device secured by the perimeter casing of FIG. 17 being placed in the cooling mount of FIG. 19.

FIG. 17 illustrates a front perspective view of one example of a perimeter casing 1700 that can be placed around the perimeter of an electronic device 2002 (FIG. 20). As illustrated in FIG. 17, a perimeter casing 1700, such as a silicon perimeter or sleeve, may be designed for placement around the perimeter and/or edges of the electronic device 2002. The perimeter casing 1700 may protect the electronic device 2002 from damage.

While FIG. 17 shows the perimeter casing 1700 having a central opening 1702 for exposing both the front and back of electronic device 2002, in another example, the perimeter casing 1700 may include a screen protector (not shown) for protecting the screen on the front of the electronic device 2002 to protect the screen from cracking or shattering, or protecting the screen from direct sunlight. The longer sides 1704, 1706 of the perimeter casing 1700 may also include a grooved or indented area for engaging and securing to cooling mount 1900 (shown in FIG. 19). As will be discussed further below, another purpose of the perimeter casing 1700 is to allow cooling mount 1900 to accommodate various sizes or models of electronic devices including but not limited to tablets such as iPADs, iPAD Airs and iPAD minis, by altering the thickness of the perimeter casing 1700.

Figure 18:
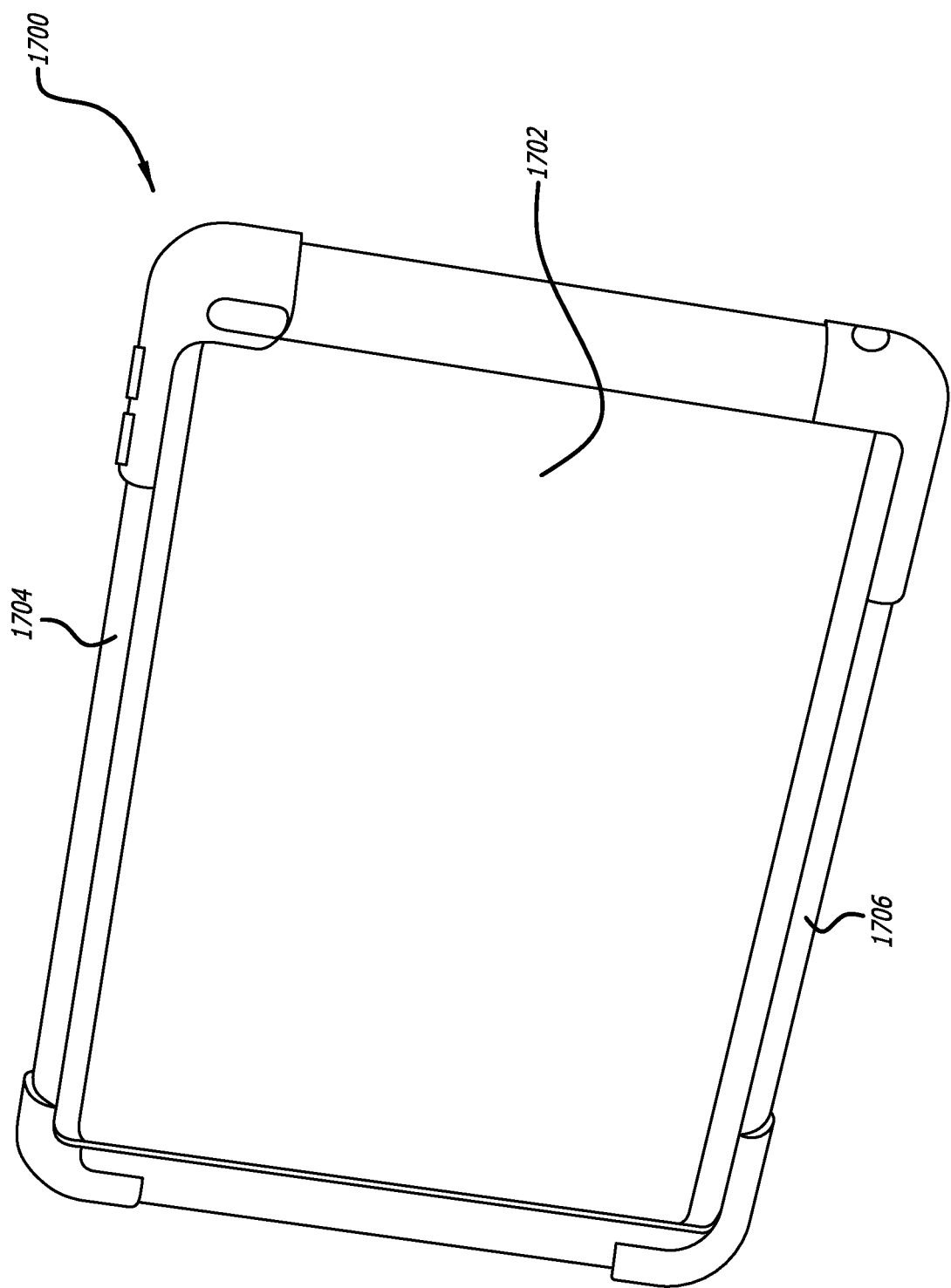
FIG. 18 is a back perspective view of the perimeter casing of FIG. 17.

FIG. 18 illustrates a back perspective view of perimeter casing 1700 of FIG. 17. As illustrated in FIG. 18, perimeter casing 1700 is open in the back and is only placed around the perimeter of electronic device 2002. This allows the back of the electronic device 2002 to be cooled by the cooling mount 1900 when the electronic device is placed within the cooling mount 1900. Although the cooling mount 1900 is designed to cool, the mount 1900 can also be used in general, to regulate the temperature of the electronic device 2002. For example, in colder climates or environments, heat elements or heat packs (not shown) could also be included behind the electronic device 2002 in the mount 1900. These heating elements can be useful to prevent the electronic device from freezing when used in colder environments and maximizing the operational performance of the electronic device. As the back of electronic device 2002 is still exposed when protected by the perimeter casing 1700, the electronic device 2002 may be cooled or heated by the mount 1900 as needed depending on the surrounding climate or environment. The cooling mount 1900 may also be referred to as a temperature regulating mount when the mount can be used either to cool, heat and/or to cool or heat an electronic device 2002. The cooling or heating unit positioned in the mount 1900, as described herein, may be referred to as a temperature control unit.

As stated above, the size of the perimeter casing 1700 may vary depending upon the size of the electronic device 2002. In particular, while the outer dimensions of the perimeter casing 1700 may remain the same, the size of the inner dimensions or central opening 1702 of the perimeter casing may vary depending on the size of the electronic device that is intended to be used. For example, if an electronic device is smaller (such as an IPad mini), the opening 1702 of the perimeter casing 1700 may be sized to also be smaller to accommodate the smaller electronic device such that the perimeter casing 1700 fits securely around the smaller electronic device. Additionally, the thickness of the perimeter casing 1700 may also vary to accommodate various thickness sizes of electronic devices. Having the central opening 1702 of the perimeter casing 1700 to be of any size, the cooling mount 1900 can act to fit any number of different sized electronic devices by using perimeter casings 1700 that are sized to both fit in the mount 1900 and around any given type of electronic device 2002 to allow the cooling mount 1900 to be a universal mount. In this manner, the mount 1900 may come with different sized perimeter casings 1700 for different types and sizes of electronic devices 2002. While the height of the perimeter casing (distance from side 1704 to 1706) may remain the same, in some examples, the length of the longer sides 1704, 1706 of the perimeter casing 1700 may be varied to accommodate various different sized electronic devices, without impact its fit within the mount 1900.

Figure 19:
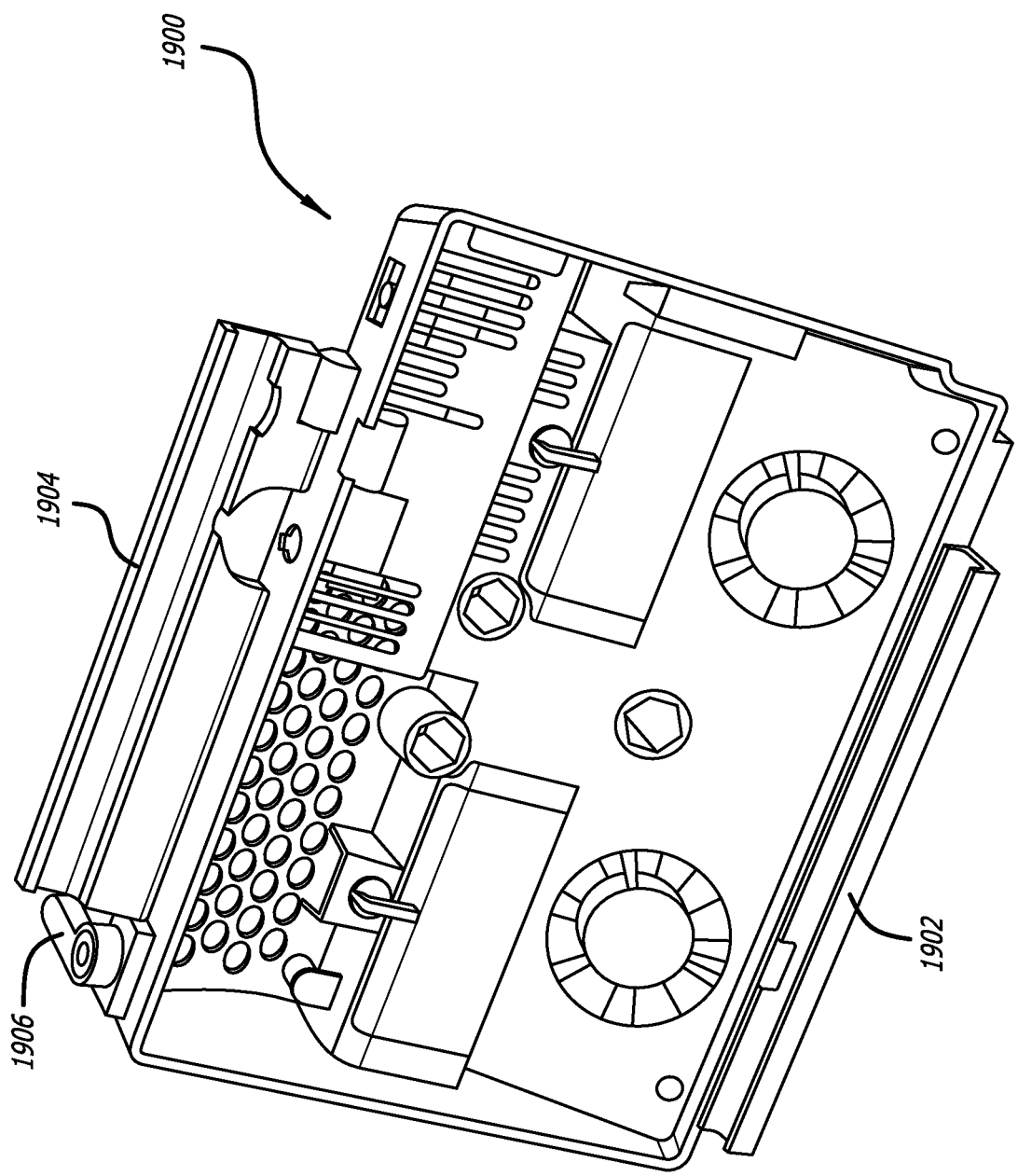
FIG. 19 is a front perspective view of another example of a cooling mount of the present invention.

FIG. 19 is a front perspective view of another example of a cooling mount 1900 of the present invention. As shown in FIG. 19, to mount the electronic device 2002 with perimeter casing 1700 in the cooling mount 1900, the cooling mount 1900 may be designed to hold the electronic device 2002 in place at opposing sides 1704, 1706 of casing 1700. As seen in FIG. 19, the mount 1900, on the bottom or side edge, may include a guide rail 1902 in which one side edge 1704 or 1706 of casing 1700 can be positioned. On the opposing side of cooling mount 1900 is a clamping mechanism 1904 that can move from an open to a closed positioned and then be locked in place by locking mechanism 1906 to secure electronic device 2002 in cooling mount 1900. It should be noted that all features and functions incorporated or that may be incorporated in cooling mount 100 may also be incorporated in cooling mount 1900.

Figure 22:
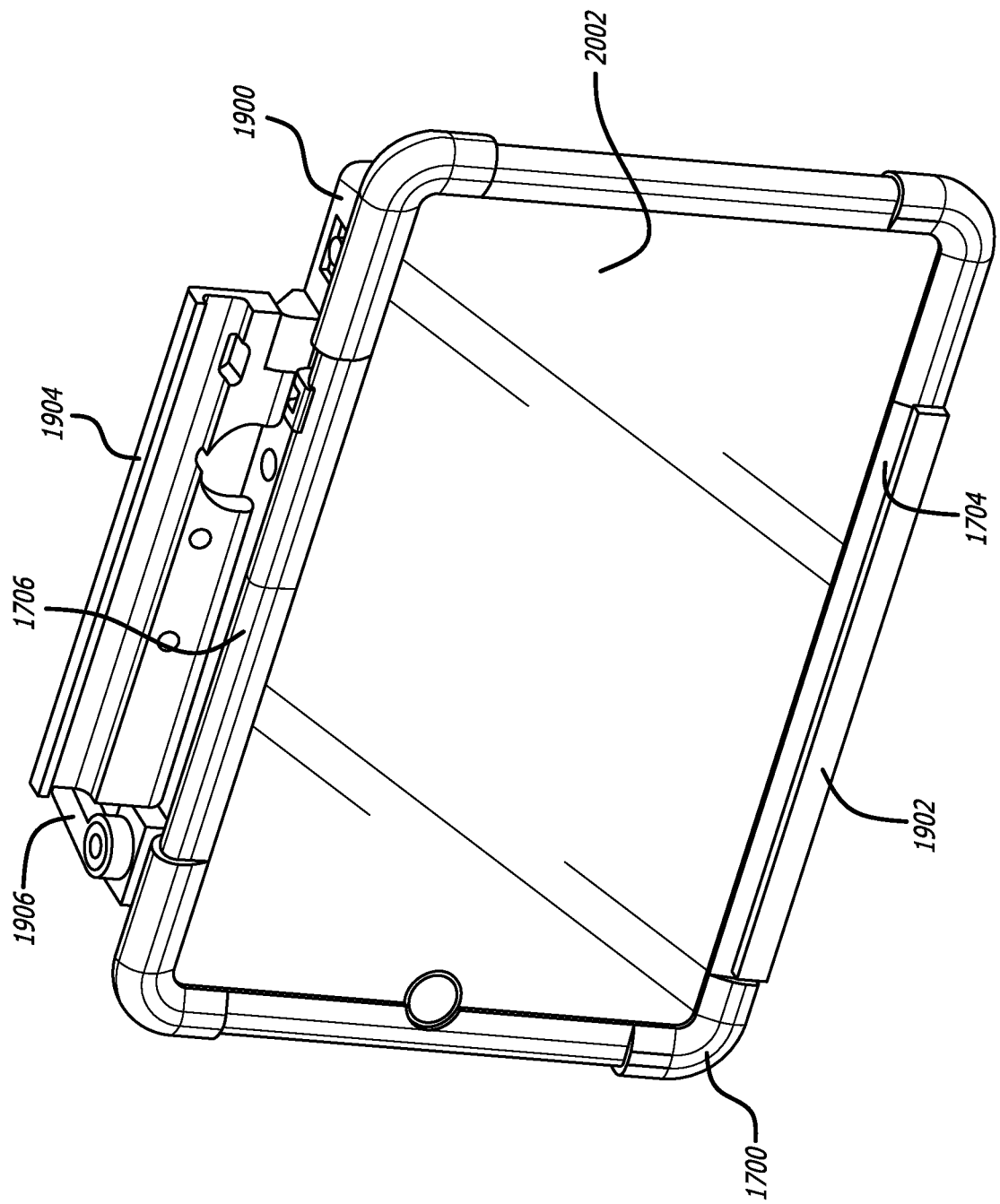
FIG. 22 is a front perspective view of an electronic device secured in the perimeter casing of FIG. 17 being placed in the cooling mount of FIG. 19 with the clamping mechanism being in an open position.
Figure 23:
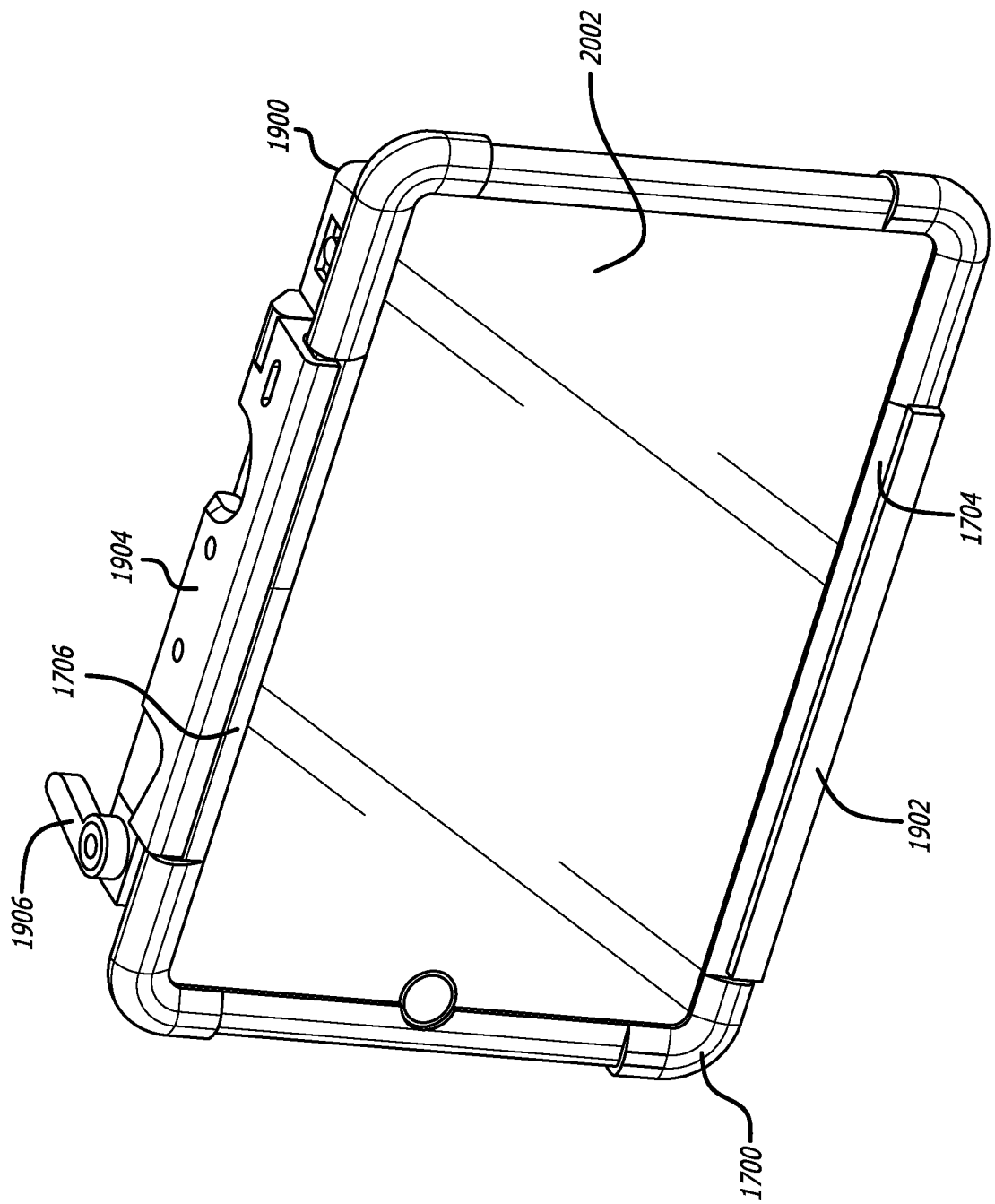
FIG. 23 is a front perspective view of an electronic device secured in the perimeter casing of FIG. 17 being placed in the cooling mount of FIG. 19 with the clamping mechanism being in a closed position.

In the illustrated example, the clamping mechanism 1904 is moveable and pivots from an open position (FIG. 22) to a closed positioned (FIG. 23). In the closed position, the clamping mechanism 1904 engages the electronic device 2002 such that electronic device 2002 is maintained between the guide rail 1902 and the clamping mechanism 1904 in the cooling mount 1900. The clamping mechanism 1904 is then locked into place by a movable or pivotable locking mechanism 1906.

FIG. 20 is a front perspective view of an electronic device 2002 secured by perimeter casing 1700 being placed in the cooling mount 1900 of FIG. 19. As illustrated in FIG. 20, in operation, side 1704 of perimeter casing 1700 may be first placed in the guide rail 1902 along the bottom or side opposing the clamping mechanism 1904. When placing the electronic device 2002 in the guide rail 1902, the clamping mechanism 1904 is in the open position. While FIG. 19 shows side 1704 of the perimeter casing 1700 engaging with guide rail 1902, it should be understood that perimeter casing 1700 may be mounted to cooling mount 1900 such that side 1706 of the perimeter casing 1700 is engaged with guide rail 1902.

Figure 21:
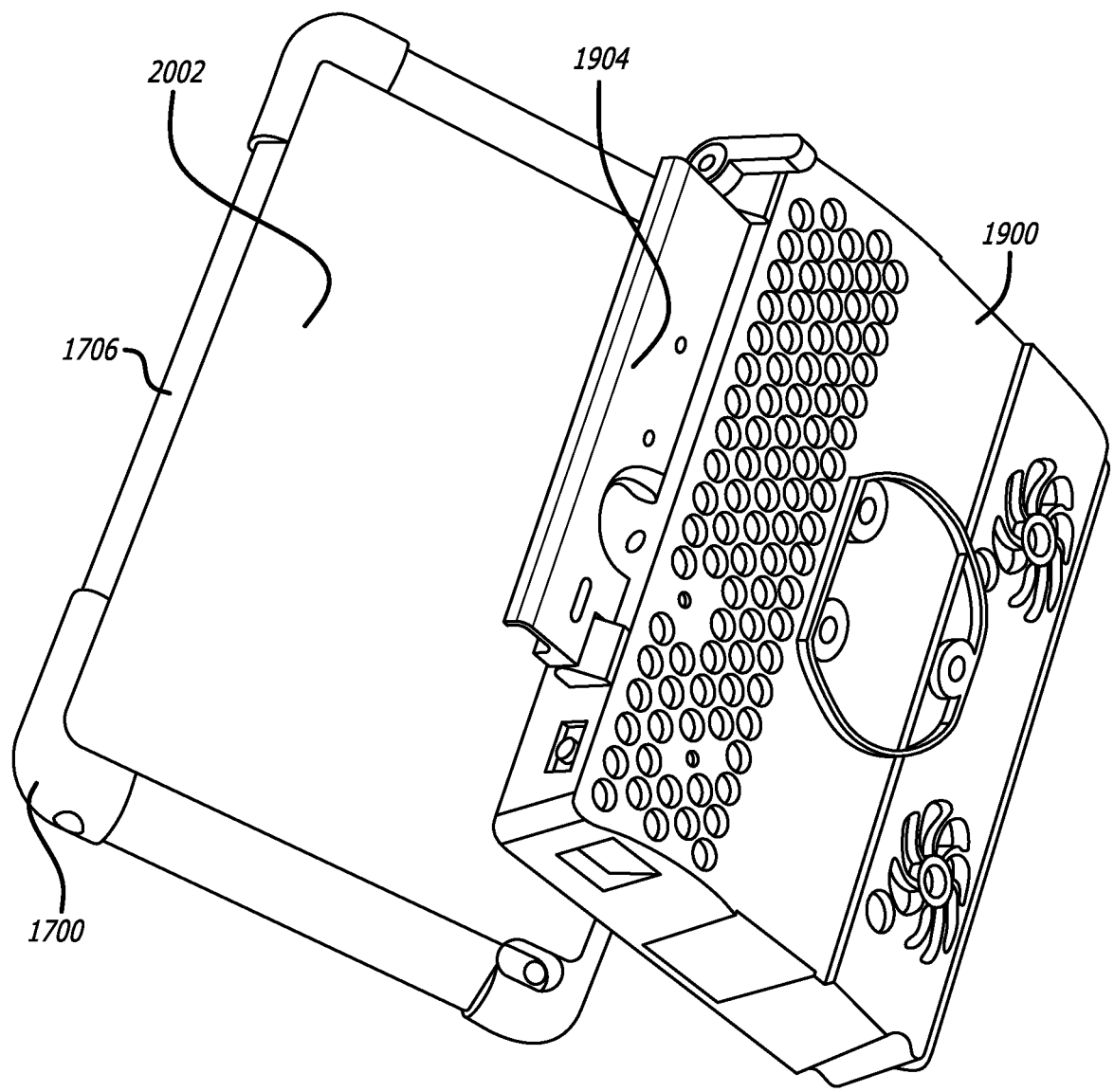
FIG. 21 is a back perspective view of an electronic device secured in the perimeter casing of FIG. 17 being placed in the cooling mount of FIG. 19.

FIG. 21 is a back perspective view of an electronic device being placed in the cooling mount 1900 of FIG. 19. FIG. 21 best illustrates that the back of the electronic device 2002 remains exposed to allow the temperature of the electronic device 2002 to be better controlled by the mount 1900.

FIG. 22 is a front perspective view of electronic device 2002 being placed in the cooling mount 1900 such that the guide rail 1902 engages with the grooved or indented area of side 1704 of perimeter casing 1700. The guide rail 1902 may include a lip that comes over the top side of the electronic device 2002 to contact both the side and top edge of the electronic device 2002 to maintain it in place. As illustrated in FIG. 22, the clamping mechanism 1904 is in an open position. In this example, the clamping mechanism 1904 can pivot between an open position and a closed position. The clamping mechanism 1904 in the open position may be angled away from cooling mount 1900 at, for example, a 45-90 degree angle, or more, to receive the perimeter casing 1700 and electronic device 2002.

Figure 29:
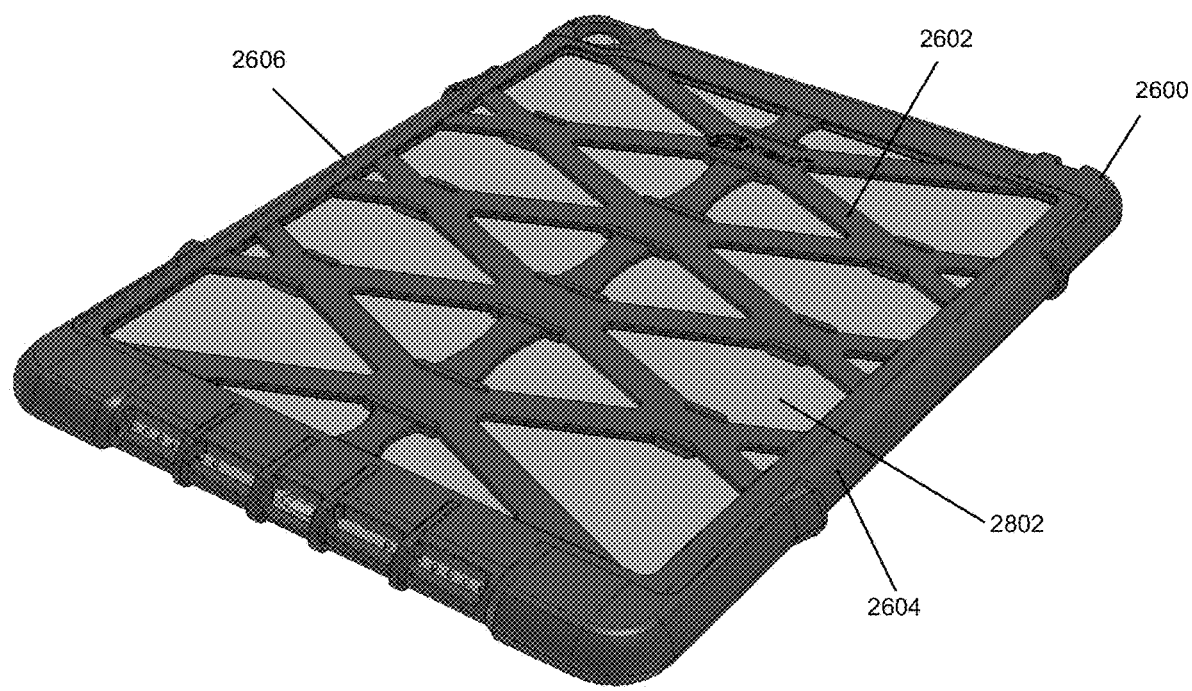
FIG. 29 is a back perspective view of an electronic device secured by the perimeter casing of FIG. 26.

FIG. 23 is a front perspective view of an electronic device 2002 being placed in the cooling mount 1900 of FIG. 29 with the clamping mechanism 1904 in a closed position. When in the closed position, the clamping mechanism 1904 is positioned against the electronic device 2002 such that the clamping mechanism 1904 fits within the grooves of side 1706 of perimeter casing 1700. In this example, the clamping mechanism 1904 may be generally parallel to the side 1706 of the perimeter casing 1700 to engage the side of the electronic device 2002. The clamping mechanism 1904 may include a lip that comes over the top side of the electronic device 2002 to contact both the side and top edge of the electronic device 2002 to maintain it in place.

Figure 24:
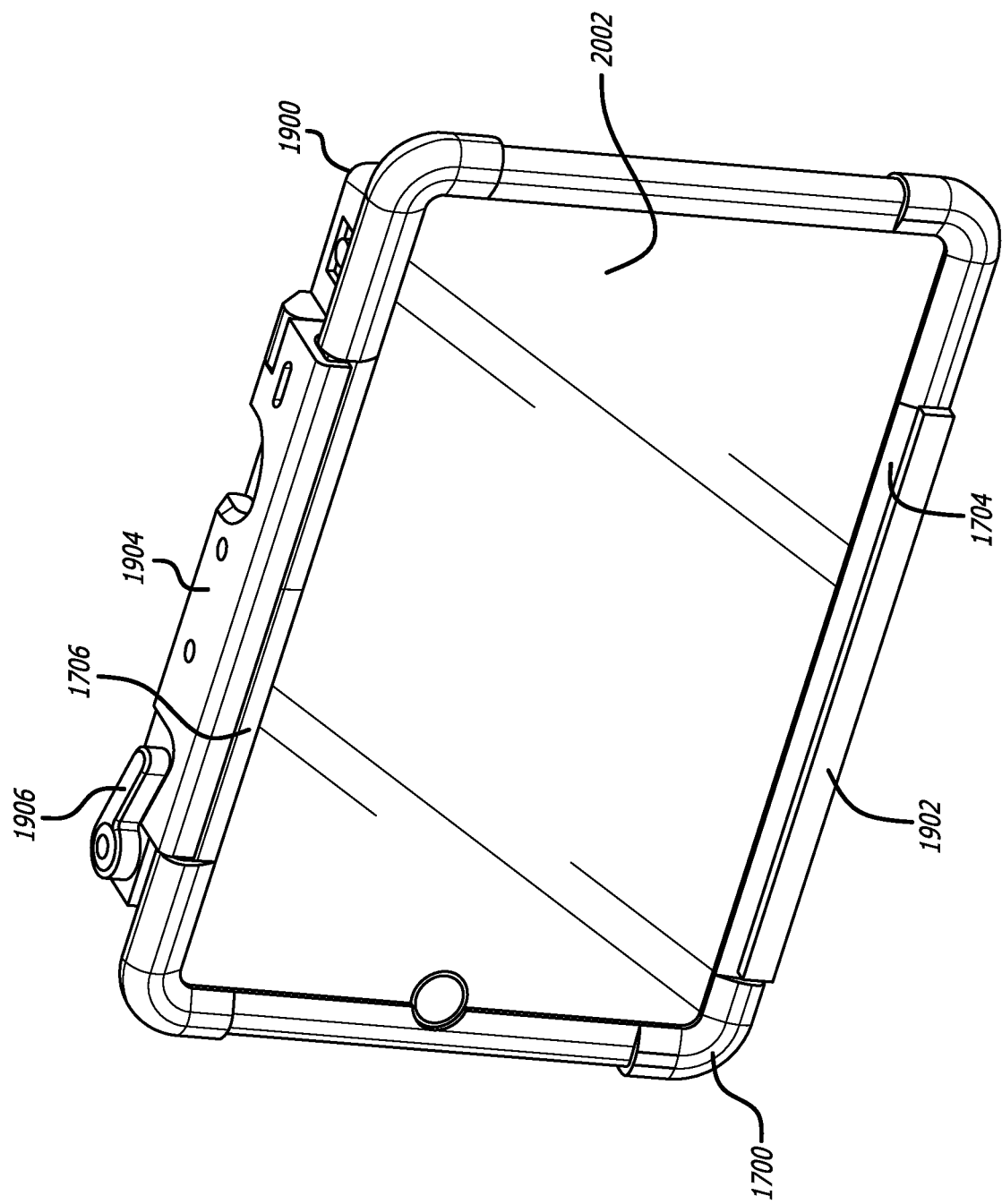
FIG. 24 is a front perspective view of an electronic device secured in the perimeter casing of FIG. 17 being placed in the cooling mount of FIG. 19 with the locking mechanism being in a locked position.

FIG. 24 is a front perspective view of an electronic device 1702 being placed in the cooling mount 1900 of FIG. 19 with the locking mechanism 1906 in a locked position. To lock the clamping mechanism 1904 in a closed position, the locking mechanism 1906 may pivot between a closed and open state and may be pivoted over the clamping mechanism 1904 to lock and prevent clamping mechanism 1904 from opening.

Figure 25:
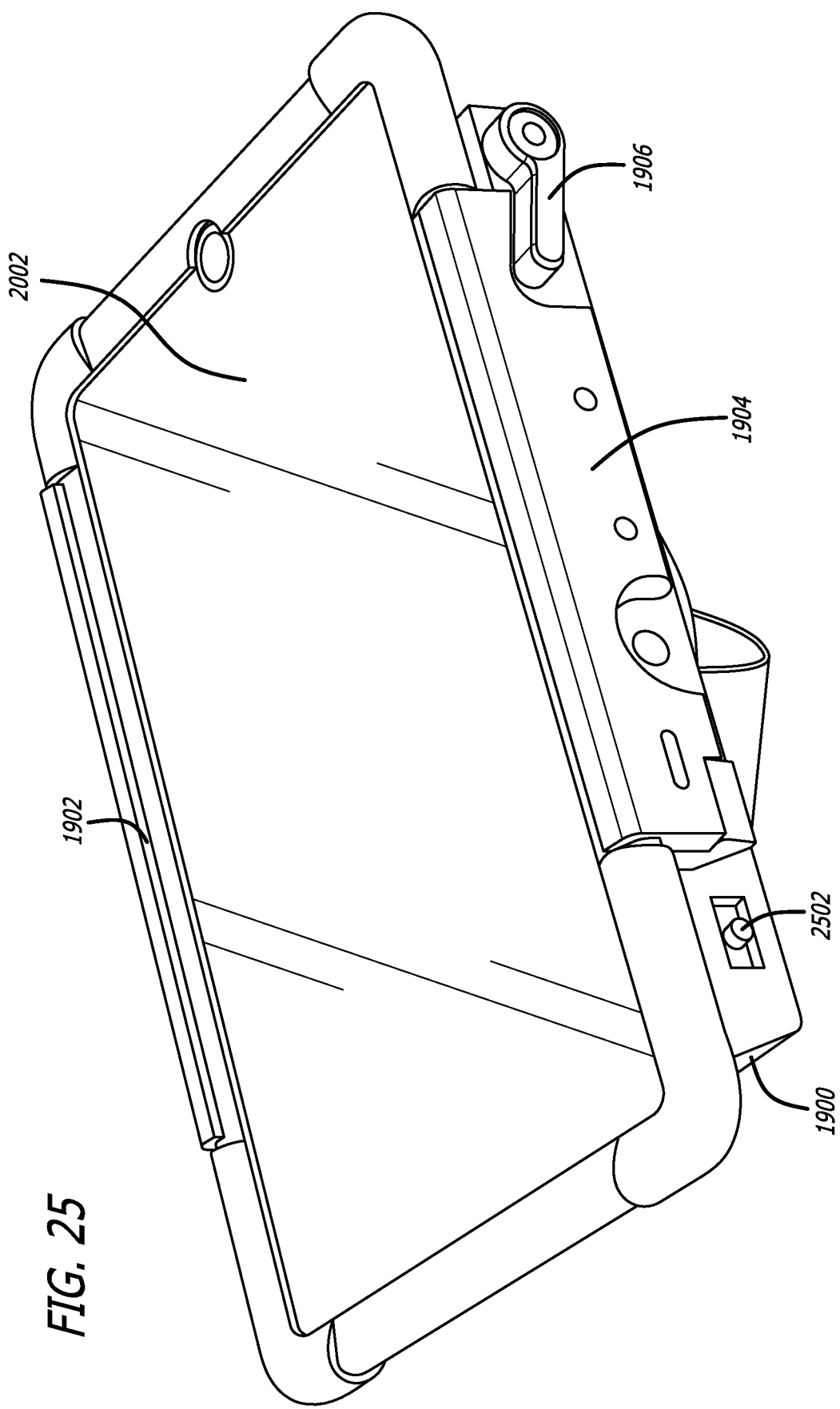
FIG. 25 is another front perspective view of an electronic device secured in the perimeter casing of FIG. 17 being placed in the cooling mount of FIG. 19.

FIG. 25 is another front perspective view of an electronic device 2002 being held in the cooling mount 1900 of FIG. 19 with the clamping mechanism 1904 in a closed position and locked by locking mechanism 1906. As illustrated in FIG. 25, openings 2502 or attachment points may be located on the cooling mount 1900 for attaching additional accessories (e.g. point of sale devices or battery packs) as illustrated and described above to the sides of cooling mount 1900.

Figure 26:
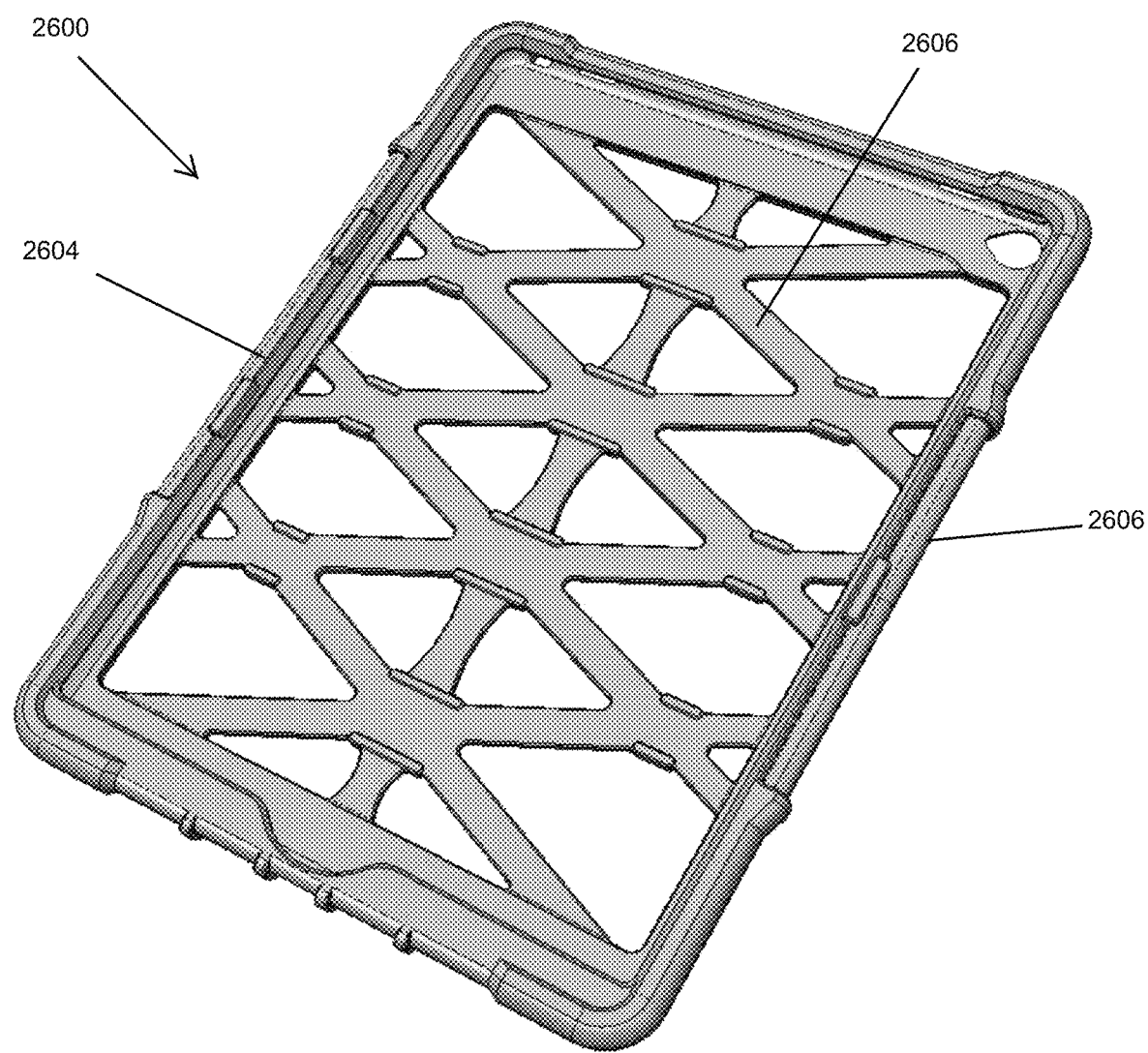
FIG. 26 is a front perspective view of another example of a perimeter casing that can be placed around the perimeter of an electronic device.
Figure 28:
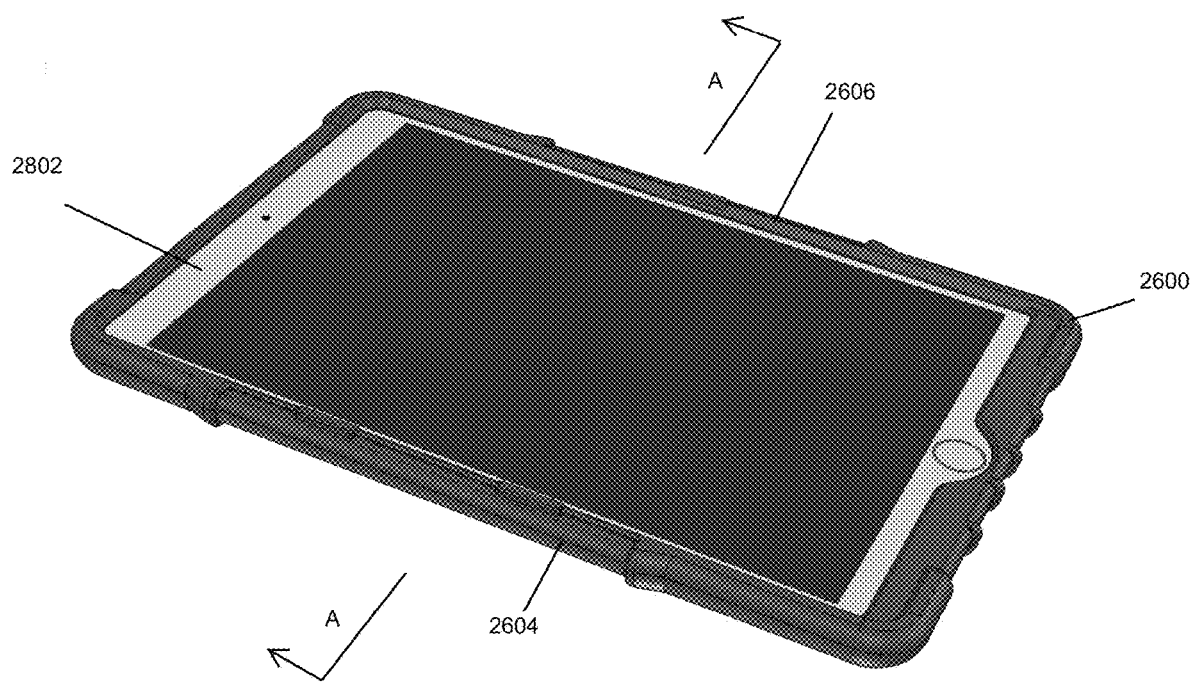
FIG. 28 is a front perspective view of an electronic device secured by the perimeter casing of FIG. 26.

FIG. 26 illustrates a front perspective view of another example of a perimeter casing 2600 that can be placed around the perimeter of an electronic device 2802 (shown in FIG. 28). It should be noted that all features and functions incorporated or that may be incorporated in perimeter casing 1700 may also be incorporated in perimeter casing 2600. As illustrated in FIG. 26, perimeter casing 2600, which can be made from any elastomer material such as silicon (to provide both rigidness and flexibility), may be designed such that it can be placed around the perimeter and/or edges of the electronic device 2802 and may protect the electronic device 2802 from damage. Additionally, the longer sides 2604, 2606 of perimeter casing 2600 may also include a grooved or indented area for engaging and securing to cooling mount 3500 (shown in FIG. 35).

Figure 35:
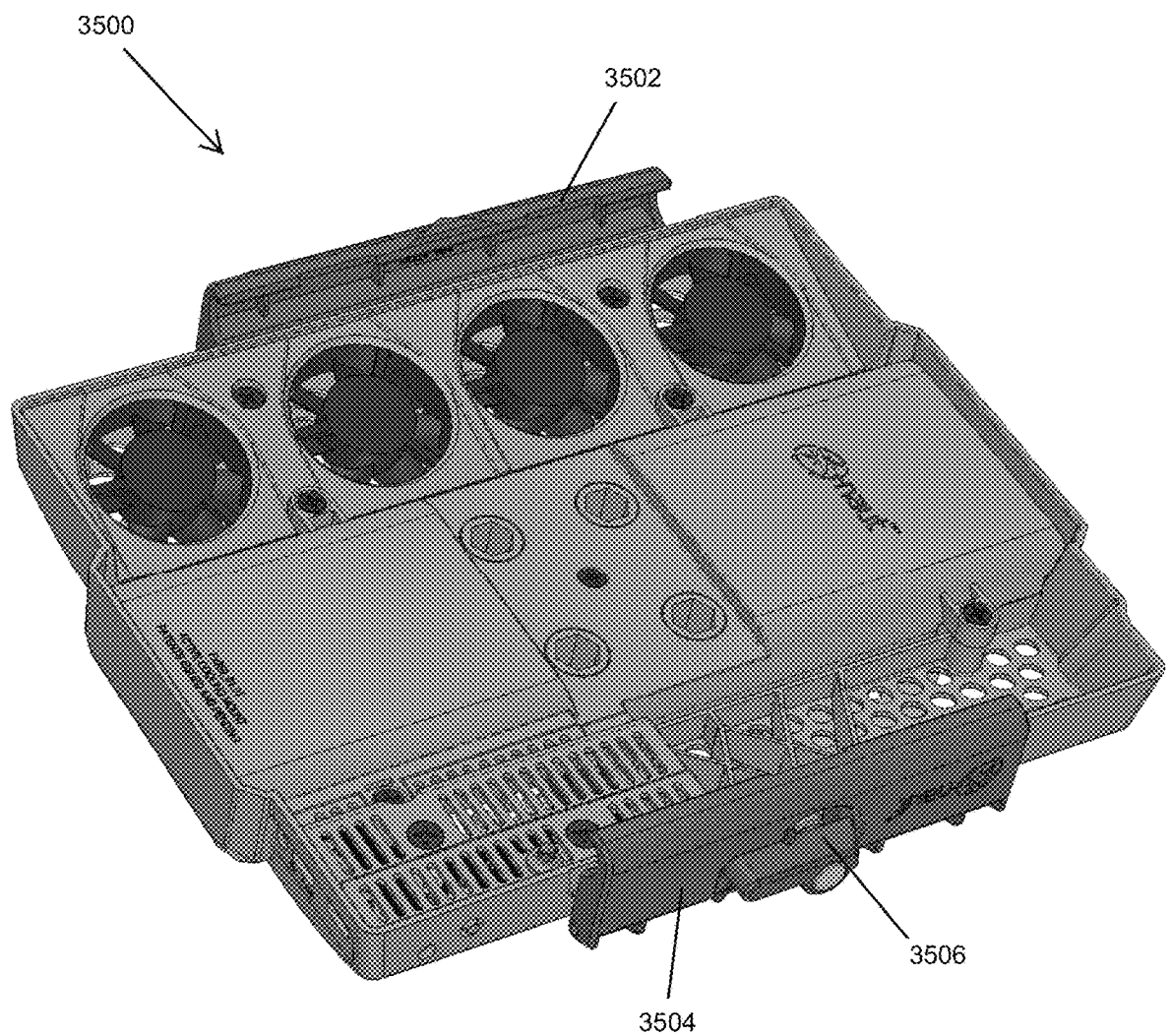
FIG. 35 is a front perspective view of another example of a cooling mount of the present invention.

Unlike perimeter casing 1700, perimeter casing 2600 may include a web configuration 2602 on the back of the casing 2600 that includes openings or holes to protect the back of electronic device 2802 and provide further stability to electronic device 2802. The openings or holes in the web configuration allows the back of electronic device 2802 to be cooled by cooling mount 3500 (FIG. 35). Although the mount 3500 is designed to cool, the mount 3500 can also be used in general, to regulate the temperature of the electronic device 2802. For example, in colder climates or environments, heat elements or heat packs (not shown) could also be included behind the electronic device 2802 in the mount 3500. These heating elements can be useful to prevent the electronic device from freezing when used in colder environments and maximizing the operational performance of the electronic device. As the back of electronic device 2802 is still exposed through the web configuration 2602 when protected by perimeter casing 2600, electronic device 2802 may be cooled and/or heated by cooling mount 3500 as needed depending on the surrounding climate or environment.

As stated above for perimeter casing 1700, the size of perimeter casing 2600 may vary depending upon the size of the electronic device 2802. In particular, while the outer dimensions of the sides of perimeter casing 2600 may remain the same, the size of the inner dimensions of the sides of the perimeter casing may vary depending on the size of the electronic device that is intended to be used. For example, if an electronic device is smaller (such as an IPad mini), the inner dimensions of the sides of the perimeter casing 2600 may be sized smaller to accommodate the smaller electronic device such that the perimeter casing 2600 fits securely around the smaller electronic device. Additionally, the thickness of the sides of perimeter casing 2600 may also vary to accommodate various thickness sizes of electronic devices. Having the inner dimensions of the sides of perimeter casing 2600 to be of any size, the cooling mount 3500 can act to fit any number of different sized electronic devices by using perimeter casings 2600 that are sized to both fit in the mount 3500 and around any given type of electronic device 2802 to allow the cooling mount 3500 to be a universal mount. In this manner, the mount 3500 may come with different sized perimeter casings 2600 for different types and sizes of electronic devices 2802. While the height of the perimeter casing may remain the same (measured from side 2604 to 2606), in some examples, the length of the longer sides 2604, 2606 of perimeter casing 2600 may be varied to accommodate various different sized electronic devices without varying the thickness of the perimeter walls of the casing.

Figure 27:
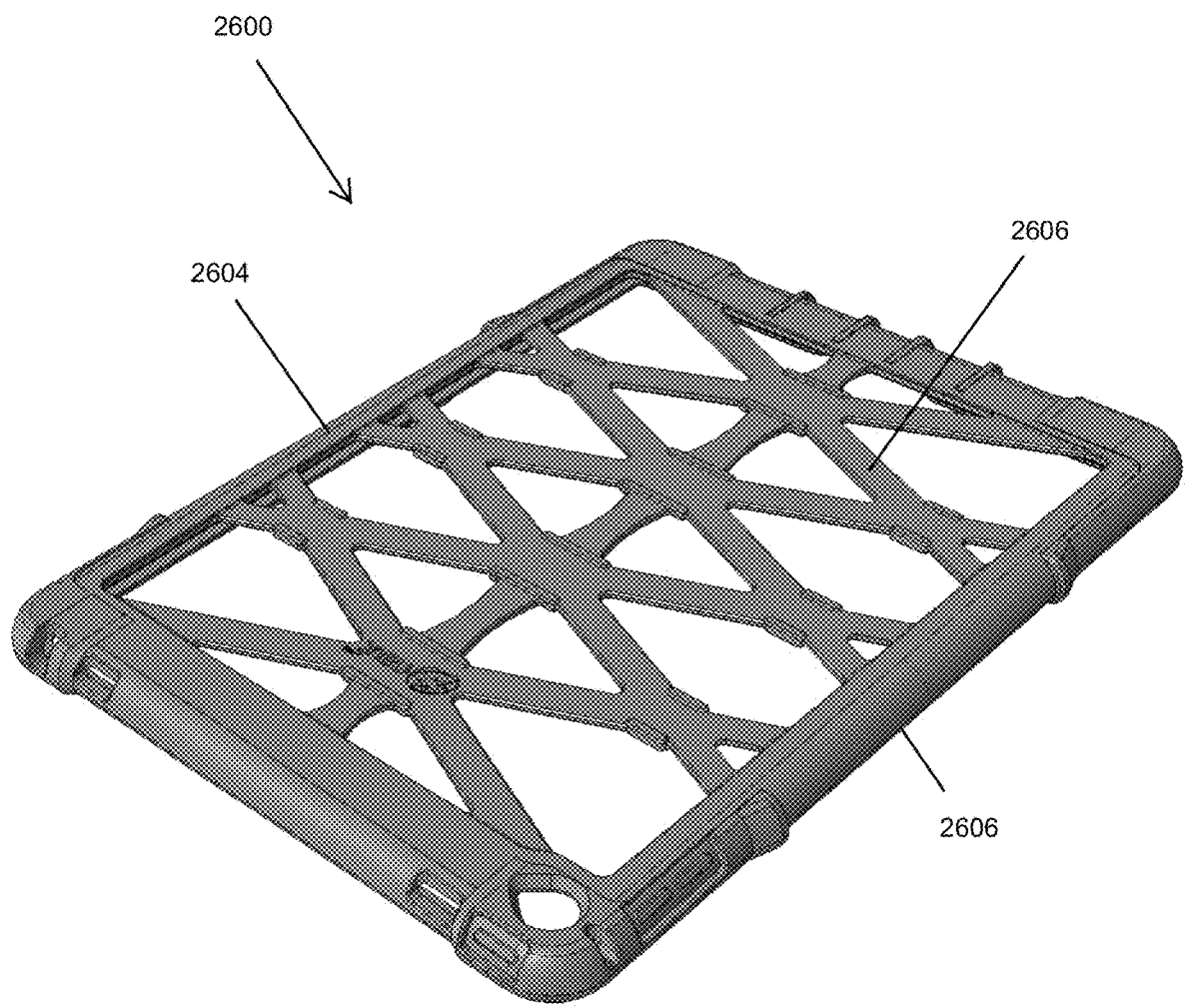
FIG. 27 is a back perspective view of the perimeter casing of FIG. 26.

FIG. 27 illustrates a back perspective view of perimeter casing 2600 of FIG. 26. As stated above, web configuration

Figure 40:
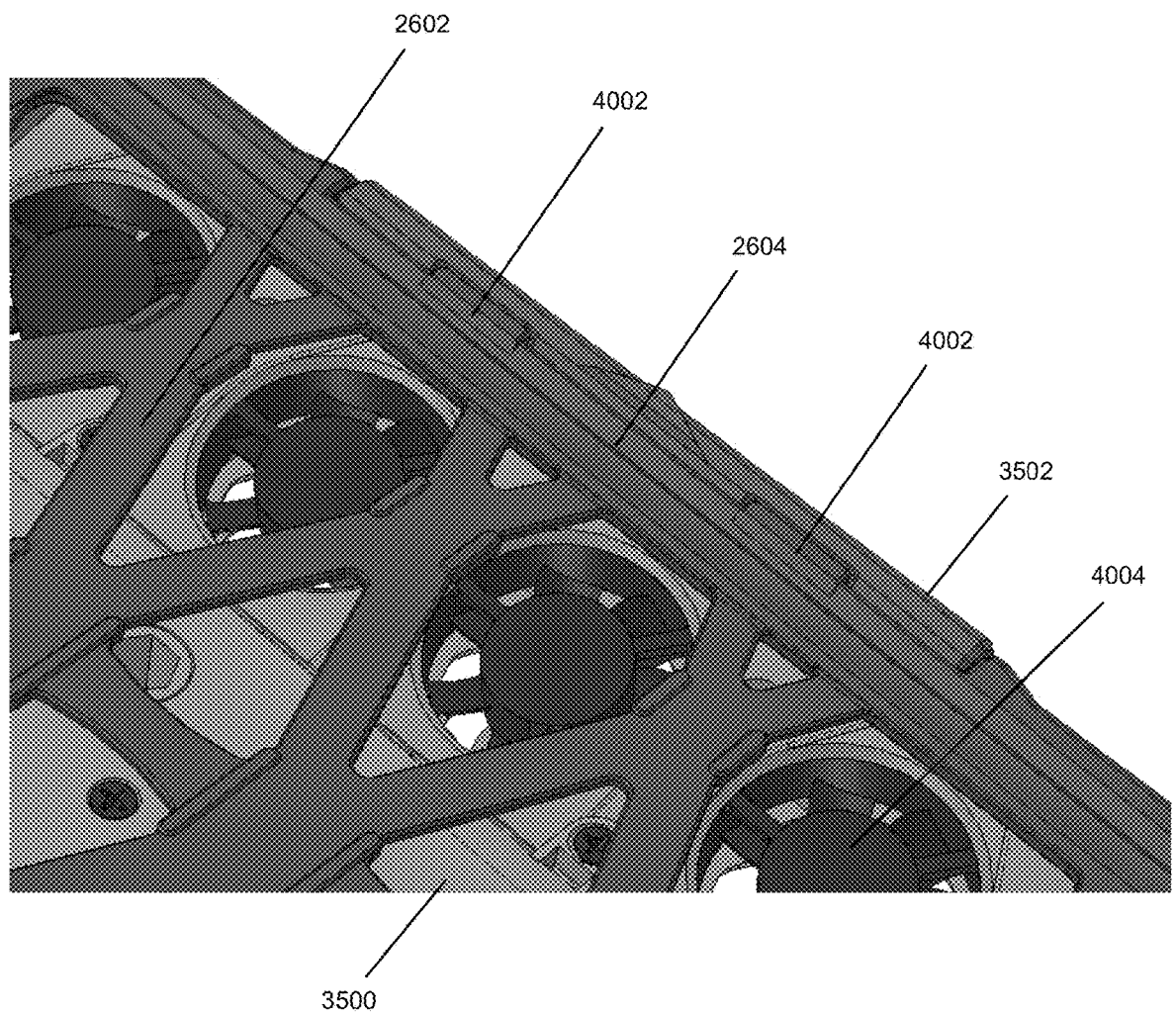
FIG. 40 is a close-up front perspective view of the guide rail of the cooling mount of FIG. 35.

2602. While perimeter casing 2600 illustrates a particular web configuration design 2602, any web configuration design can be utilized having different sizes/shapes of holes or openings. For example, web configuration 2602 may be configured such that the amount of holes corresponds to the number of fans located in cooling mount 3500 and/or the holes are located in the same location as the fans on the cooling mount 3500 when the electronic device 2802 is mounted within the cooling mount to allow airflow from the fans to directly contact the back of electronic device 2802 for sufficiently regulating the temperature of the electronic device 2802 (as shown in FIG. 40).

FIG. 28 illustrates a front perspective view of the front of perimeter casing 2600 when electronic device 2802 is placed within and secured by perimeter casing 2600. As shown in FIG. 28, the screen of electronic device 2802 is fully exposed when electronic device is encased by perimeter casing 2600. In another example, perimeter casing 2600 may also include a screen protector (not shown) for protecting the screen on the front of electronic device 2802 to protect the screen from cracking or shattering, or protecting the screen from direct sunlight.

Figure 36:
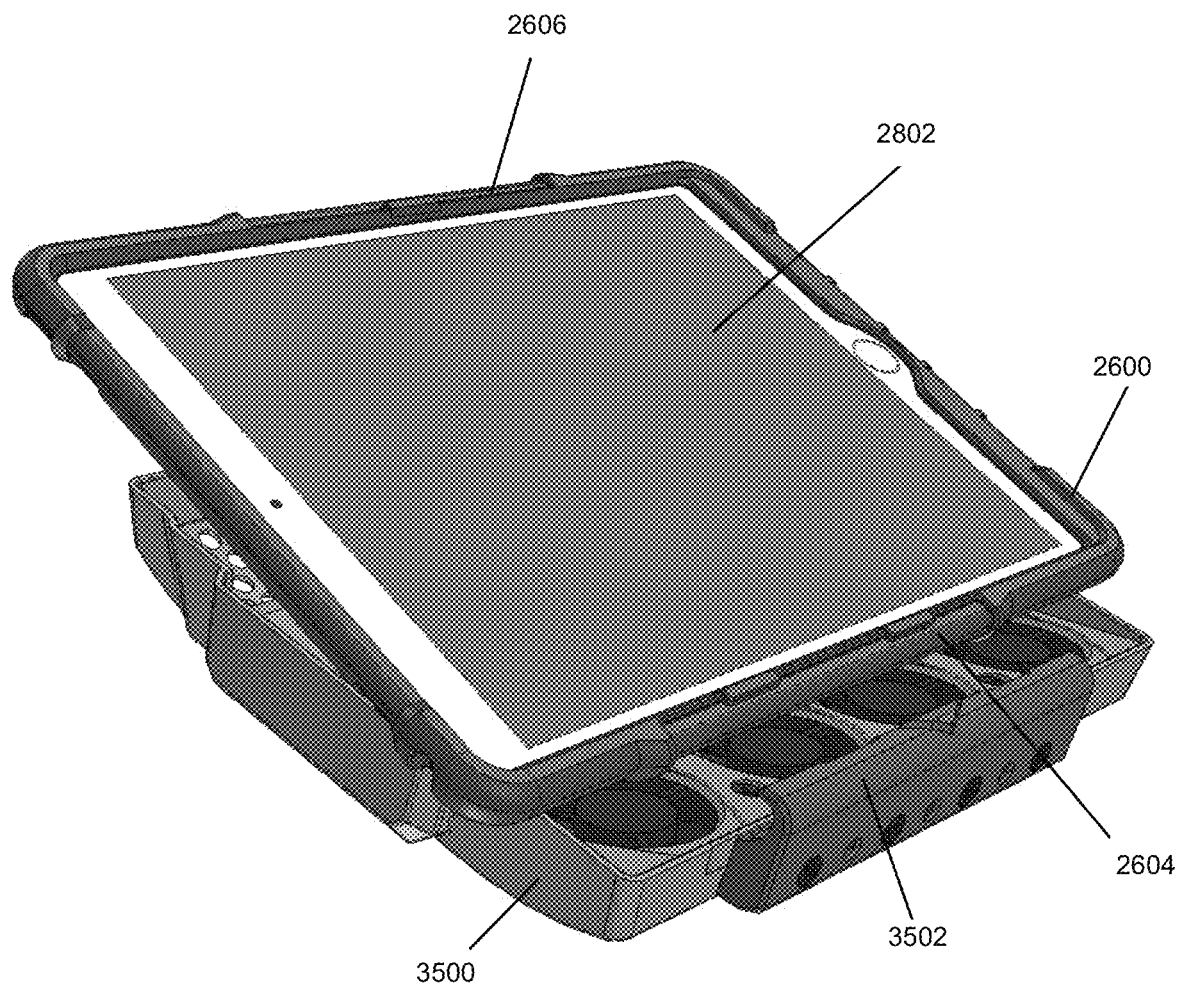
FIG. 36 is a front perspective view of an electronic device secured by the perimeter casing of FIG. 26 being placed in the cooling mount of FIG. 35.
Figure 37:
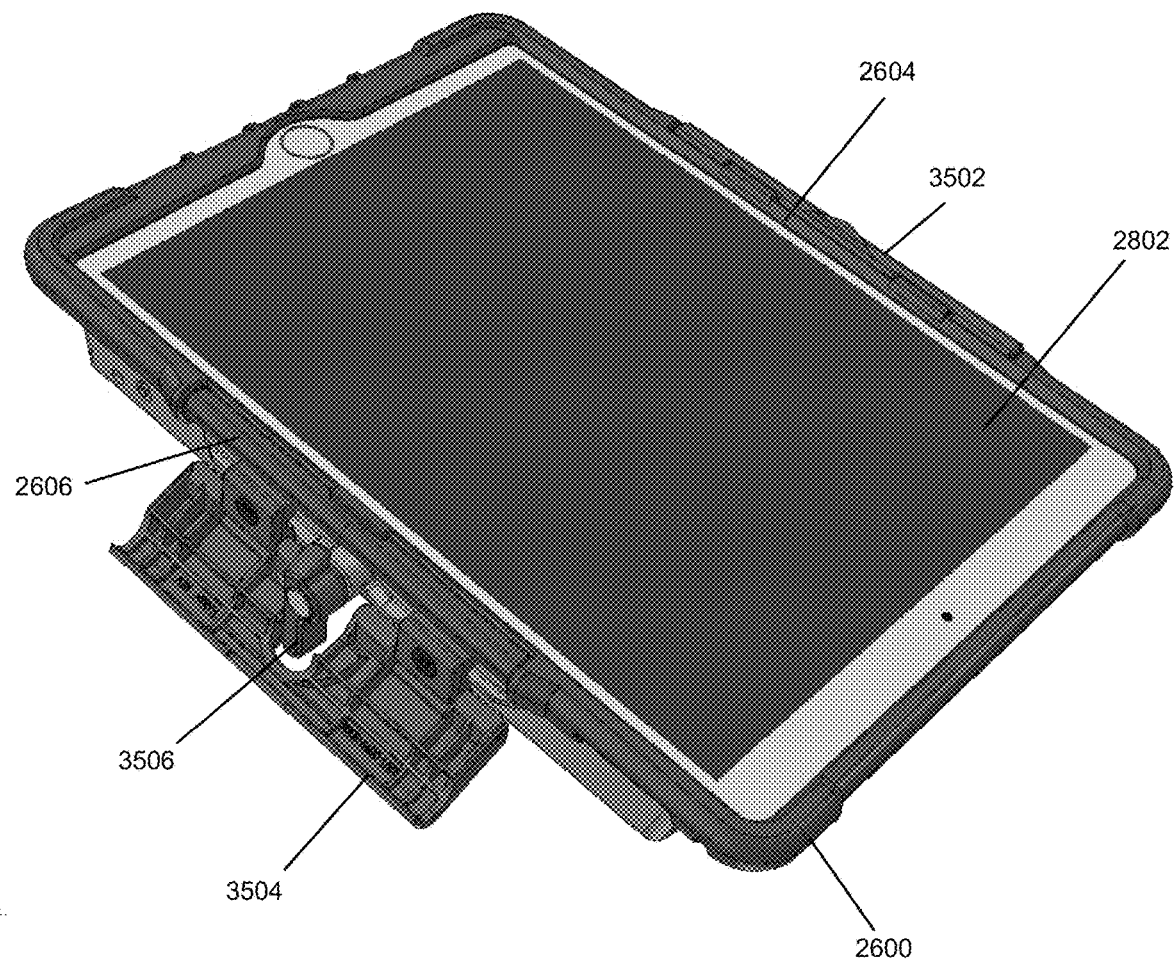
FIG. 37 is a front perspective view of an electronic device secured in the perimeter casing of FIG. 26 being placed in the cooling mount of FIG. 35 with the clamping mechanism being in an open position.

FIG. 29 illustrates a back perspective view of perimeter casing 2600 when electronic device 2802 is placed within and secured by perimeter casing 2600. A shown in FIG. 29, web configuration 2602 on the back of the casing 2600 may include openings or holes to allow the back of electronic device 2802 exposed such that when electronic device 2802 is mounted in cooling mount 3500 (as shown in FIGS. 36 and 37), cooling mount 3500 can more efficiently regulate the temperature of electronic device 2802. While the case may have an open back, it may be desired to provide a webbed or semi-open back to provide rigidity to the casing 2600 and further protect the electronic device 2802.

Figure 30:
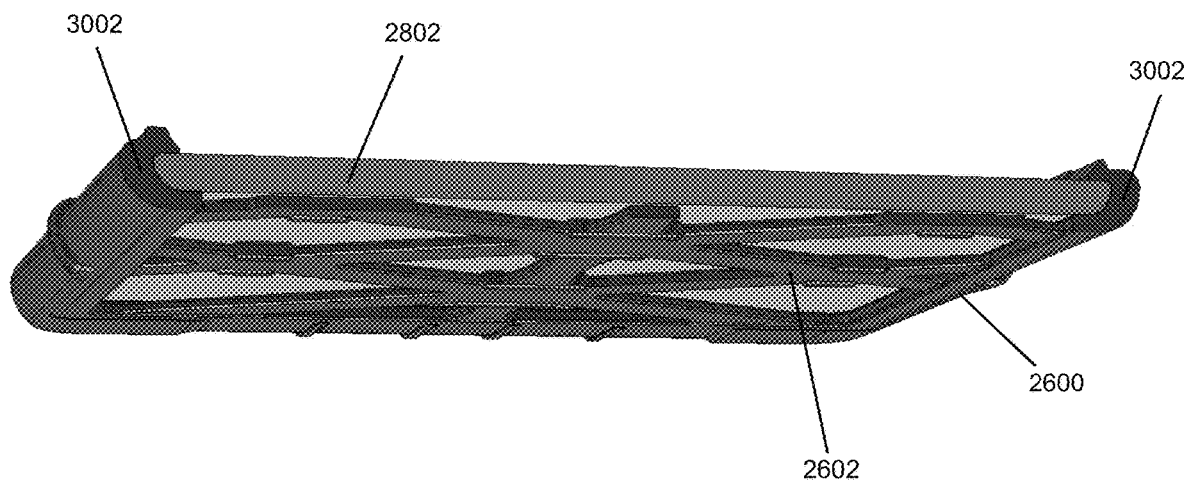
FIG. 30 is a perspective cross sectional view taken along line A-A of FIG. 28.

FIG. 30 is a perspective cross-sectional view of electronic device 2802 when placed within and secured by perimeter casing 2600 taken along line A-A of FIG. 28. As shown in FIG. 30, perimeter casing has side walls 3002 for engaging the sides of electronic device 2802. The side walls 3002 of perimeter casing 2600 may have elasticity to confine the electronic device 2802 so that electronic device 2802 is secured in the casing 2600. The thickness of side walls 3002 can be varied to be thicker or thinner to accommodate different sized electronic devices 2802. For example, without changing the perimeter dimension of the casing 2600, a large electronic device 2802 can fit within a casing 2600 having thinner walls 3200 than a casing with thicker walls 3200, which will accommodate a smaller electronic device 2802. In this manner, a temperature regulating mount can operate as a universal mount for all sized electronic devices. The temperature regulating mount will sized to accommodate the largest tablet and the thickness of the perimeter casings will vary (at least on two opposing sides) to allow for any sized portable electronic device to be held within the temperature regulating mount.

FIGS. 31-34 illustrate side views of each side of perimeter casing 2600 with electronic device 2802 secured in casing 2600. FIGS. 31-34 all show perimeter casing 2600 facing upwards such that the front of perimeter casing 2600 is on the top and back of perimeter casing 2600 is on the bottom.

Figure 31:
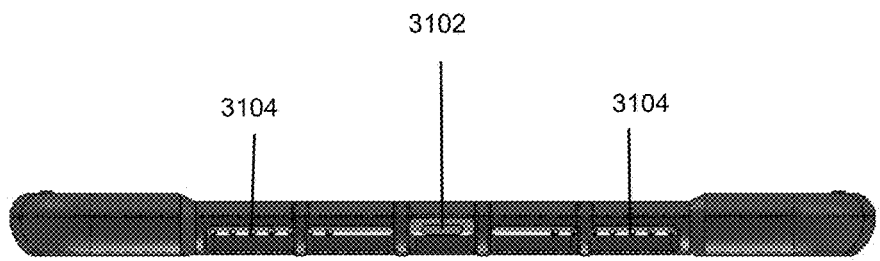
FIG. 31 is a bottom side view of the perimeter casing of FIG. 26.
Figure 32:
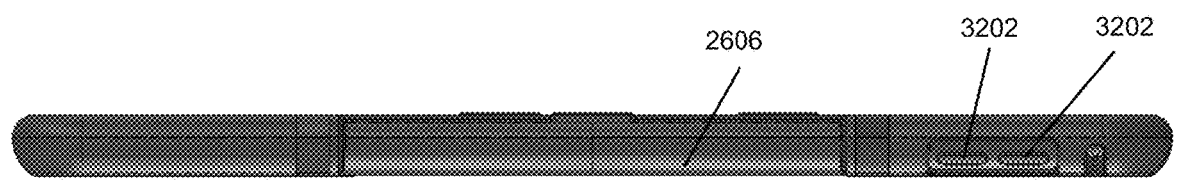
FIG. 32 is a side view of the right side of the perimeter casing of FIG. 26.
Figure 33:
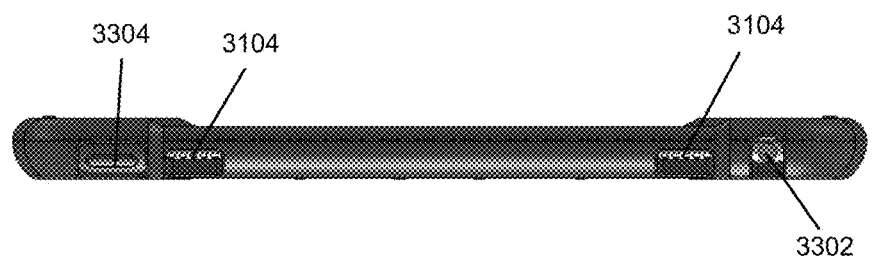
FIG. 33 is a top side view of the perimeter casing of FIG. 26.
Figure 34:
FIG. 34 is a side view of the left side of the perimeter casing of FIG. 26.

In particular, FIG. 31 illustrates the bottom side of perimeter casing 2600, FIG. 32 illustrates a side view of the right side 2606 of perimeter casing 2600, FIG. 33 illustrates a side view of the top side of perimeter casing 2600, and FIG. 34 illustrates a side view of the left side 2604 of perimeter casing 2600. As shown in FIGS. 31-34, the sides of perimeter casing 2600 may include holes located at specific areas to correspond with various ports (e.g. charging port 3102 and auxiliary port 3302)(i.e., port holes) speaker 3104 and buttons (e.g. volume buttons 3202, power button 3304) located on electronic device 2802. It should be understood that perimeter casing 2600 may incorporate any hole in any location to correspond with any function or feature located on an electronic device, regardless of the model or size of the electronic device.

FIG. 35 is a front perspective view of another example of an implementation of a cooling mount 3500 of the present invention. As shown in FIG. 35, to mount electronic device 2802 with perimeter casing 2600 in cooling mount 3500, cooling mount 3500 may be designed to hold electronic device 2802 in place at opposing sides 2604, 2606 of casing 2600. As shown in FIG. 35, the mount 3500 may include a guide rail 3502 in which side 2604 of casing 2600 can be positioned. On the opposing side of cooling mount 3500 is a clamping mechanism 3504 that can move from an open position to a closed positioned after engaging with side 2606 and then be locked in place by locking mechanism 3506 to secure electronic device 2802 in cooling mount 3500. Also shown in FIG. 35, are the different lengths of guide rail 3502 and clamping mechanism 3504 for corresponding to the different lengths of the elongated grooved areas on sides 2604 and 2606. The purpose of having these different lengths is to ensure that perimeter casing 2600 can only be mounted to cooling mount 3500 in one orientation such that guide rail 3502 can only engage with side 2604 and clamping mechanism 3504 can only engage with side 2606. The purpose of having the perimeter casing 2600 capable of being mounted in the cooling mount 3500 in only one orientation is to maximize the cooling efficiency of the cooling mount 3500 as will be discussed in further detail below in connection with FIG. 39.

It should also be noted that all features and functions incorporated or that may be incorporated in cooling mount 100 and/or 1900 may also be incorporated in cooling mount 3500. For example, any features such as the temperature sensor or probe 158 shown and described herein with respect to cooling mount 100 and 1900, including any external attachments such as various mounts described above, may be incorporated in cooling mount 3500. Additionally, cooling mount 3500 may also incorporate a mechanism, button, or sensor (not shown) that automatically turns the fans of cooling mount 3500 "on" when an electronic device or protective casing 2600 is mounted or secured within the cooling mount 3500. This automatic "turn on" mechanism may also be incorporated in cooling mount 100 and/or 1900.

Figure 38:
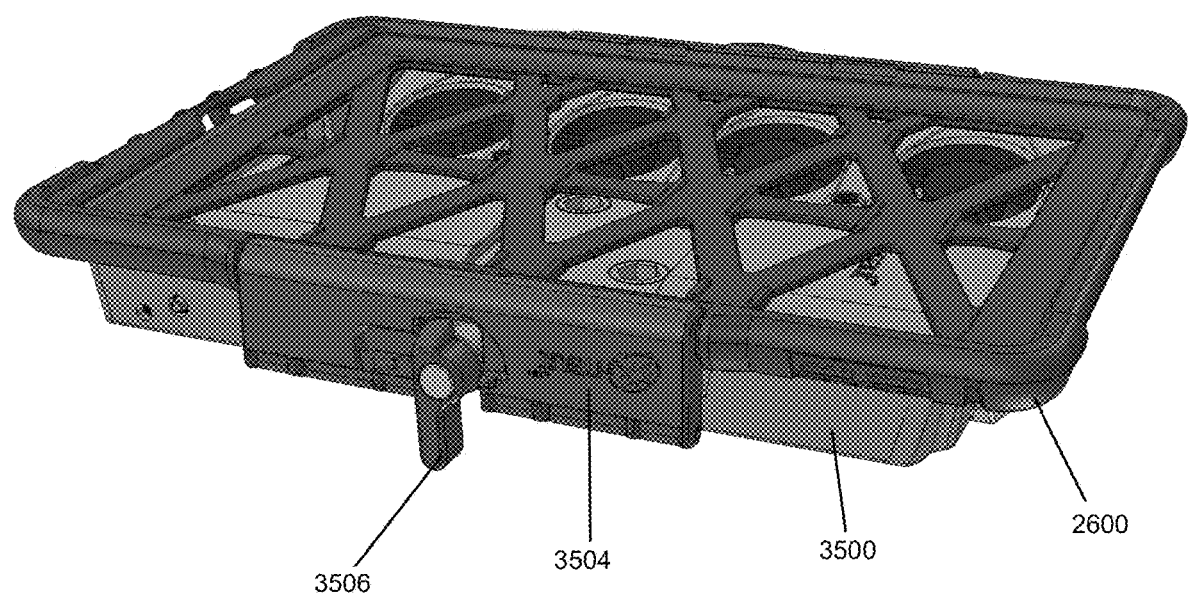
FIG. 38 is a front perspective view of the perimeter casing of FIG. 26 being placed in the cooling mount of FIG. 35 with the clamping mechanism being in a closed position and locking mechanism being in an unlocked position.

In the illustrated example, the clamping mechanism 3504 is moveable and pivots from an open position (FIG. 37) to a closed positioned (FIG. 38). In the closed position, the clamping mechanism 3504 engages perimeter casing 2600 (in which an electronic device may be held within) such that electronic device 2802 is maintained between guide rail 3502 and clamping mechanism 3504 in cooling mount 3500. The clamping mechanism 3504 is then locked into place by a movable or pivotable locking mechanism 3506.

FIG. 36 is a front perspective view of an electronic device 2802 secured by perimeter casing 2600 being placed in cooling mount 3500 of FIG. 35. As illustrated in FIG. 36, in operation, side 2604 of perimeter casing 2600 may be first placed in the guide rail 3502 along the bottom or side opposing the clamping mechanism 3504. When placing the electronic device 2802 in the guide rail 3502, the clamping mechanism 3504 is in the open position.

FIG. 37 is a front perspective view of electronic device 2802 being placed in the cooling mount 3500 such that the guide rail 3502 engages with the grooved or indented area of side 2604 of perimeter casing 2600. The guide rail 3502 may include a lip that comes over the top side 2604 of perimeter casing 2600 to maintain it in place. As illustrated in FIG. 37, the clamping mechanism 3504 is in an open position. In this example, the clamping mechanism 3504 can pivot between an open position and a closed position. The clamping mechanism 3504 in the open position may be angled away from cooling mount 3500 at, for example, a 45-90 degree angle, or more, to receive the perimeter casing 2600 and electronic device 2802.

FIG. 38 is a front perspective view of an electronic device 2802 being placed in the cooling mount 3500 of FIG. 35 with the clamping mechanism 3504 in a closed position. When in the closed position, the clamping mechanism 3504 is positioned against the electronic device 2802 such that the clamping mechanism 3504 fits within the grooves of side 2606 of perimeter casing 2600. In this example, the clamping mechanism 3504 may be generally parallel to the side 2606 of the perimeter casing 2600 to engage the side of the electronic device 2802. The clamping mechanism 3504 may include a lip that comes over the top side 2606 of perimeter casing 2600 to maintain it in place. To lock the clamping mechanism 3504 in a closed position, the locking mechanism 3506 may pivot between a closed and open state and may be pivoted over the clamping mechanism 3504 (as show in FIG. 35) to lock and prevent clamping mechanism 3504 from opening.

Figure 39:
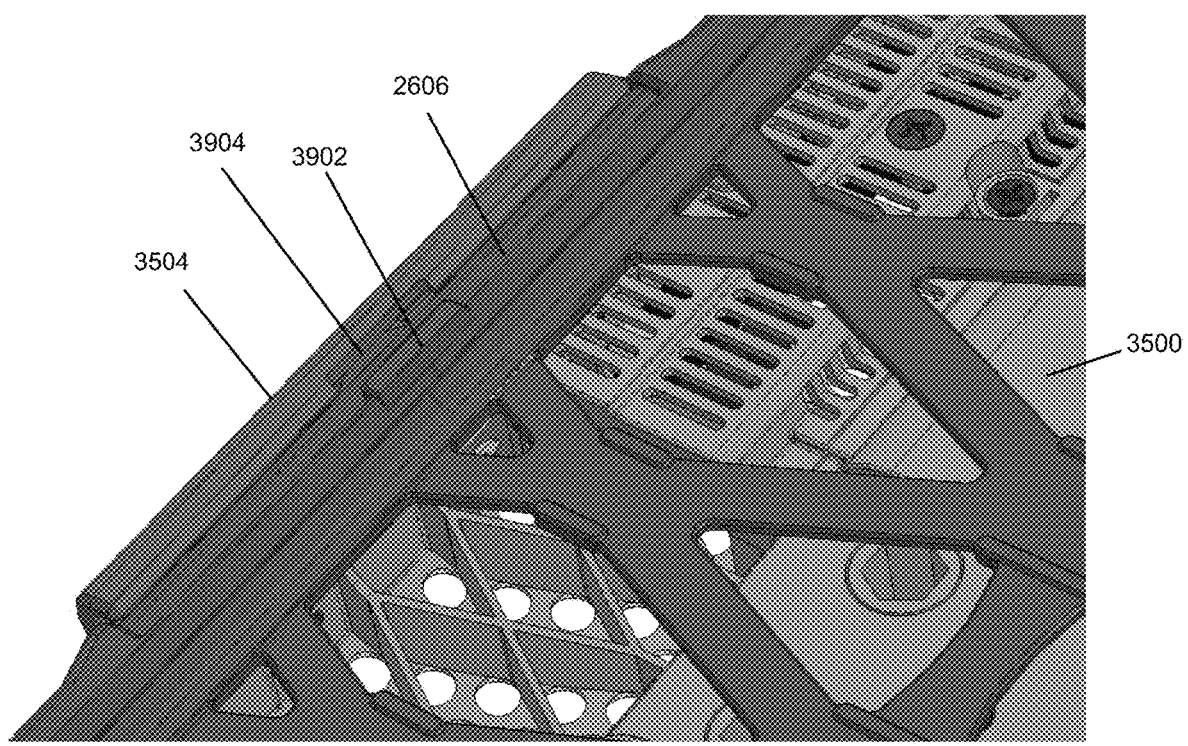
FIG. 39 is a close-up front perspective view of the clamping mechanism of the cooling mount of FIG. 35.

FIG. 39 illustrates a close-up front perspective view of clamping mechanism 3504 when engaging with side 2606 of perimeter casing 2600. As shown in FIG. 39, clamping mechanism may include a lip that comes over the top of side 2606 of perimeter casing 2600 to maintain the perimeter casing 2600 in place. FIG. 39 also shows side 2606 having a raised tab 3902 that engages with corresponding groove 3904 of the clamping mechanism 3504.

Unlike side 2606, side 2604 (as shown in FIG. 40) has two raised tabs 4002 for engaging with corresponding grooves on guide rail 3502. The purpose of having different number of raised tabs on sides 2604 and 2606 is to ensure that perimeter casing 2600 (and the electronic device 2802 encased within the perimeter casing 2600) can only be mounted in cooling mount 3500 in a specific orientation where side 2604 may only engage with guide rail 3502 and side 2606 may only engage with clamping mechanism 3504. Electronic devices such as tablets tend to have uneven heat distribution across the back surface. In other words, some areas on the back of electronic devices tend to get hotter than others. Therefore, to maximize cooling efficiency and/or temperature regulation of the electronic device 2802 when electronic device 2802 is mounted in cooling mount 3500, it is important to have the fans 4004 in cooling mount 3500 located closer to the areas in the back of electronic device 2802 that tends to get the hottest. Given that fans 4004 are located closer to guide rail 3502 (as shown in FIG. 40) than to clamping mechanism 3504, the purpose of having different number of raised tabs 3902, 4002 on sides 2604 and 2606 is to make sure that the hottest areas on the back of electronic device 2802 is located near the fans 4004 when electronic device 2802 is encased in perimeter casing 2600 and mounted in cooling mount 3500. It should also be noted that any shape, size, or number of raised tabs may be incorporated in perimeter casing 2600 and cooling mount 3500 such that perimeter casing 2600 can only be mounted in cooling mount 3500 in one orientation. Additionally, visual indicators such as matching colors or marks may also be incorporated to aid a user in mounting the perimeter casing 2600 in the cooling mount 3500 in one orientation.

FIG. 40 illustrates a close-up front perspective view of guide rail 3502 when engaging with side 2604 of perimeter casing 2600. As shown in FIG. 40, guide rail 3502 may also include a lip that comes over the top of side 2604 of perimeter casing 2600 to maintain the perimeter casing 2600 in place and a groove for engaging with raised tabs 4002. Also shown in FIG. 40 are holes in the web configuration 2602 located in the same location as the fans 4004 on the cooling mount 3500 when the perimeter casing 2600 is mounted within the cooling mount 3500 to allow airflow from the fans 4004 to directly contact the back of electronic device 2802 for sufficiently regulating the temperature of the electronic device 2802.

Figure 41:
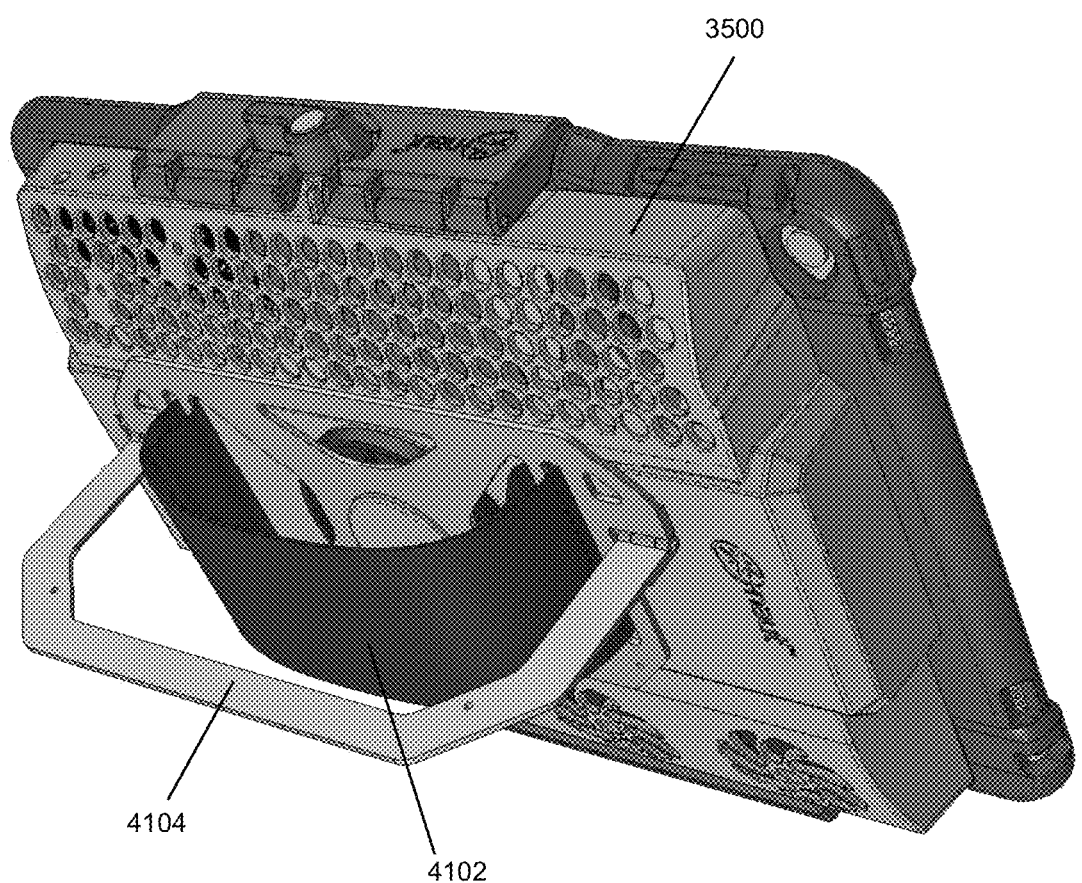
FIG. 41 is a back perspective view of an example of a rotatable strap having a kickstand that is extended mounted to the back of the cooling mount of FIG. 35.

FIG. 41 illustrates a back perspective view of cooling mount 3500 with rotatable strap 4102 having a kickstand 4104 where the kickstand 4104 is extended. As shown in FIG. 41, a rotatable strap 4102 may be mounted to the back of cooling mount 3500. Rotatable strap 4102 may have the same functionality as rotatable strap 1502 (shown in FIG. 15). However, rotatable strap 4102 may also include a kickstand 4104 that rotates with rotatable strap 4102. Kickstand 4104 is also capable of holding cooling mount 3500 at an angle when in the extended position (as shown in FIG. 41).

Figure 42:
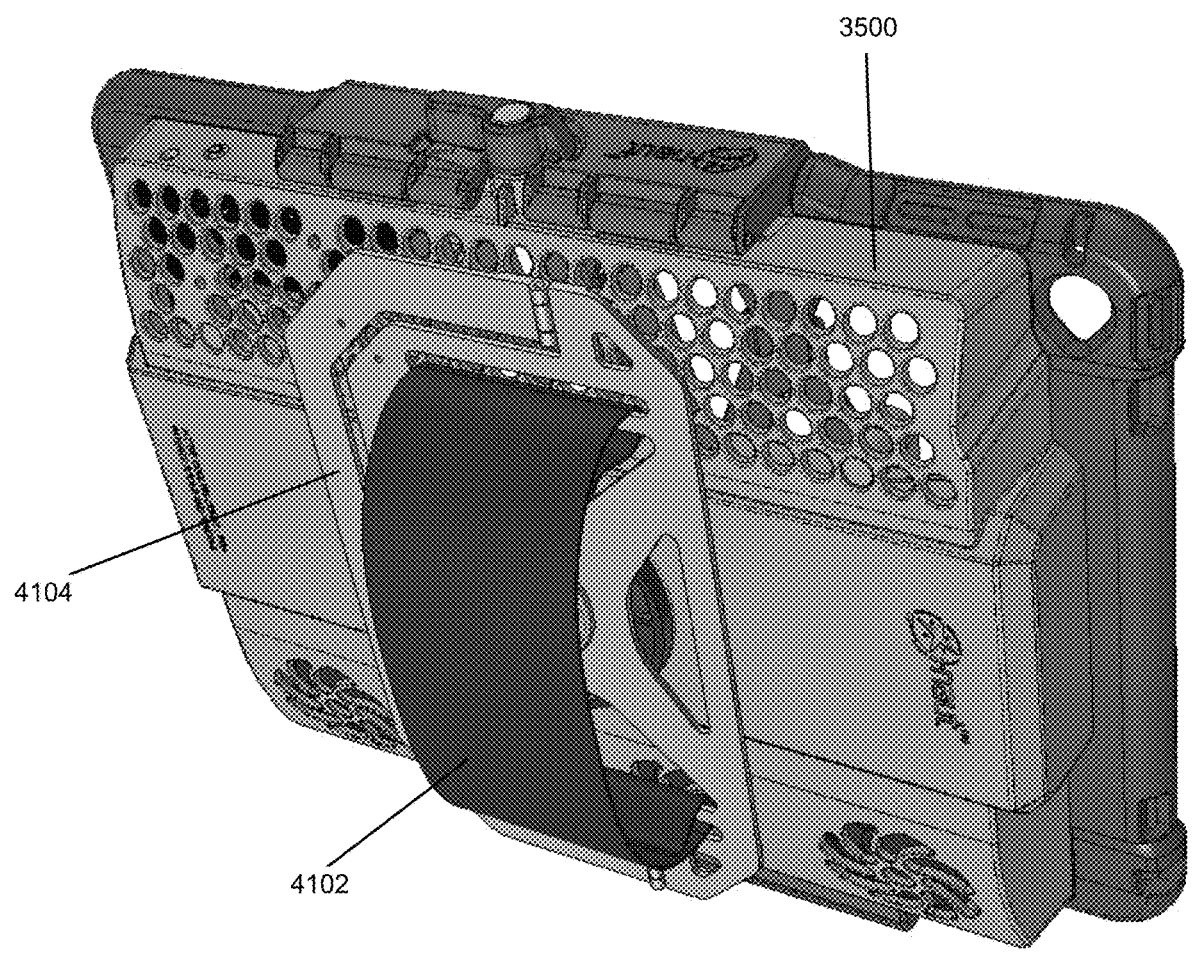
FIG. 42 is back perspective view of an example of the rotatable strap of FIG. 41 mounted to the back of the cooling mount of FIG. 35 where the kickstand is retracted.

FIG. 42 illustrates a back perspective view of cooling mount 3500 with rotatable strap 4102 having a kickstand 4104 where the kickstand 4104 is retracted.

Figure 43:
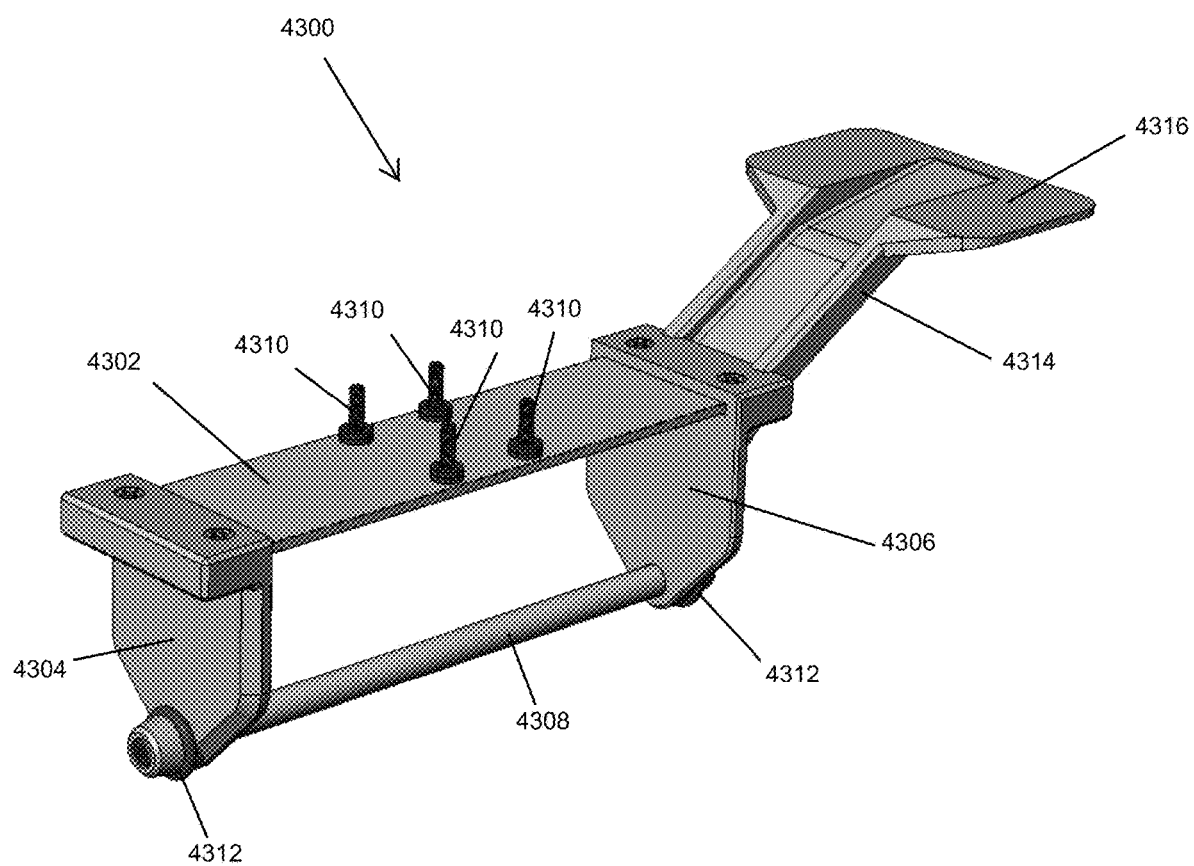
FIG. 43 is a perspective view of a flip mount.
Figure 45:
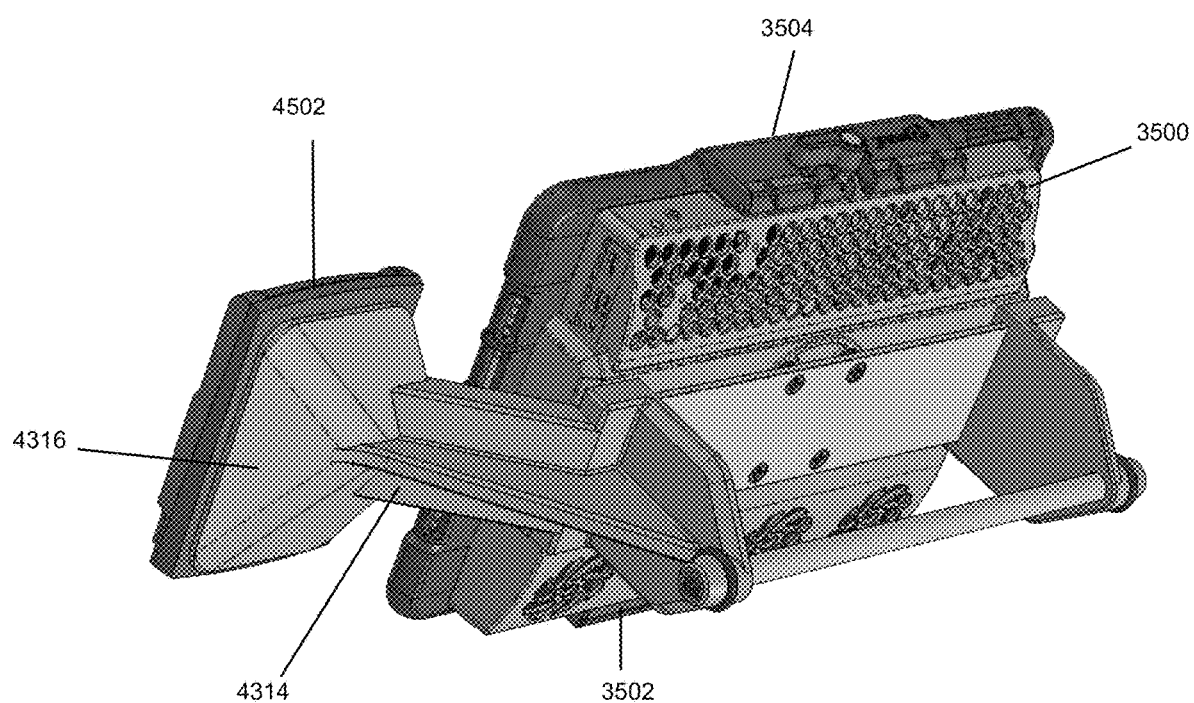
FIG. 45 is a back perspective view of the flip mount of FIG. 43 mounted to the back of the cooling mount of FIG. 35.
Figure 46:
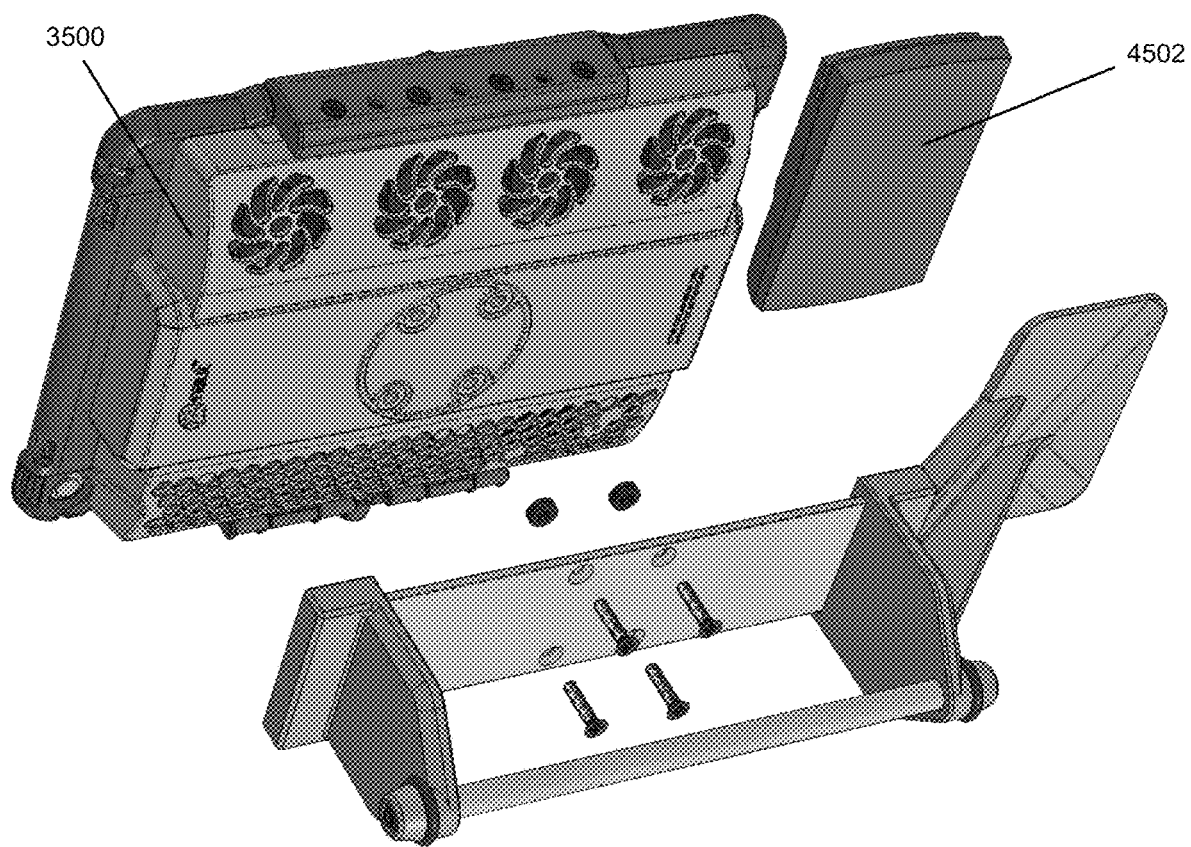
FIG. 46 is an exploded view of the flip mount of FIG. 43 being mounted to the back of the cooling mount of FIG. 35.
Figure 47:
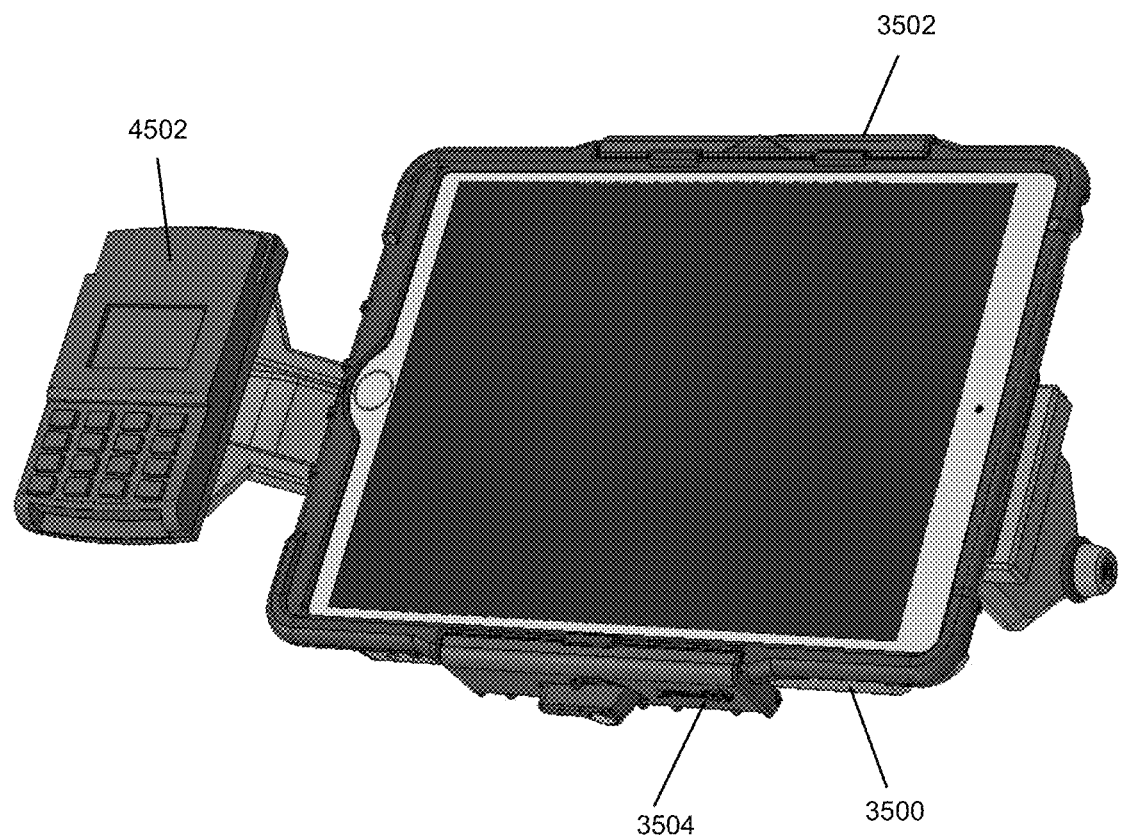
FIG. 47 is a front perspective view of the flip mount of FIG. 43 mounted to the back of the cooling mount of FIG. 35.

FIG. 43 is a perspective view of a flip mount 4300. Flip mount 4300 may comprise of a mounting plate 4302, a side plates 4304, 4306, and rod 4308. Side plate 4304 may connect to one end of the mounting plate 4302 while side plate 4306 may connect to an opposing end of mounting plate 4302. Similarly, side plate 4304 may connect to one end of rod 4308 while side plate 4306 may connect to an opposing end of rod 4308. Side plate 4306 may also be molded to an extended arm 4314 having an end plate 4316 in which point of sale systems can be used thereon (as shown in FIGS. 46 and 47). The mounting plate may also have holes in which screws 4310 are inserted for mounting to the back of cooling mount 3500 as shown in FIG. 45. The opposing ends of flip rod 4308 may also have rubber rings 4312 for providing grip and for allowing the flip mount to flip from one side to another side when flip mount 4300 is mounted to the back of cooling mount 3500.

In the illustrated example, the side plates 4304 and 4306 may be shaped general like a pentagon or a plate having a square base with a triangular element positioned on top, such that side plates 4304 and 4306 pivot on the point of the pentagon or triangular top element and rests on opposing angled sides when being flip from one direction to the other. In operation, the mount 3500 is flipped over the top to present in opposing front and back directions by pivoting on the point of the side plates 4304 and 4036 and then resting on the sides of the cooling mount 3500 and the opposing angled sides of the side plates 4304 and 4036. Those skilled in the art will recognize that it is not necessary to shape the sides plates 4304 and 4036 as shown or rest the mount 3500 on the opposing sides of the plate 4304 and 4036.

Figure 44:
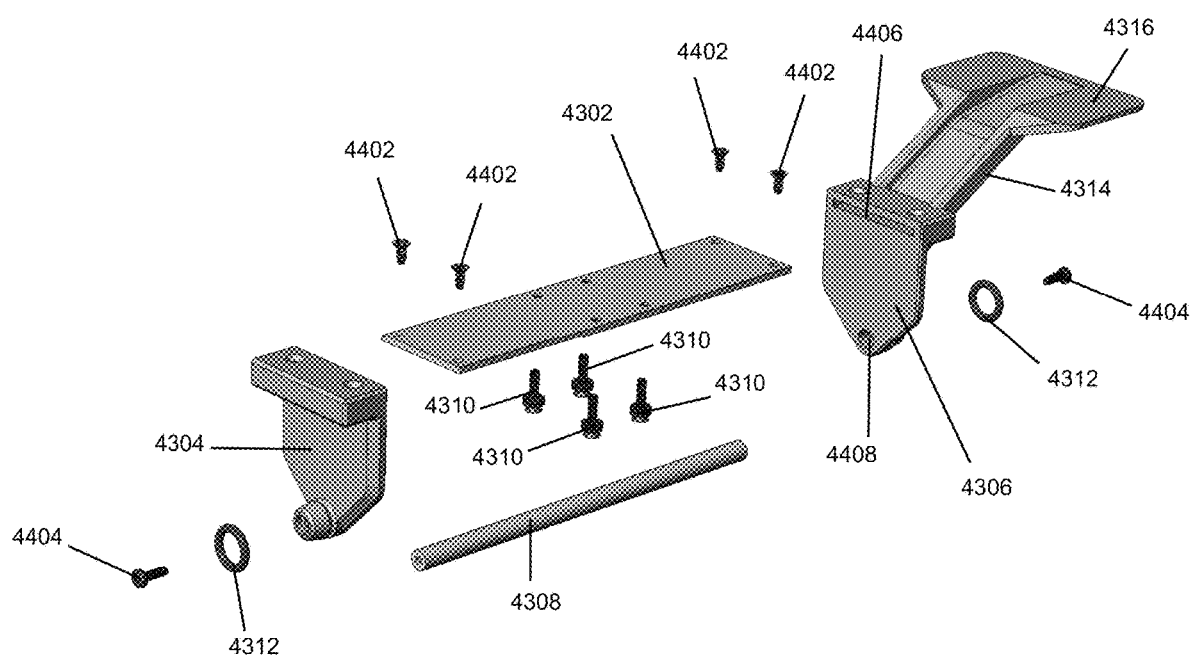
FIG. 44 is an exploded view of the flip mount of FIG. 43.

FIG. 44 is an exploded view of flip mount 4300. In particular, FIG. 44 shows how the connection is made between side plates 4304, 4306 and mounting plate 4302. In particular, the opposing ends of mounting plate 4302 may be inserted into slots 4406 located on side plates 4304, 4306 and then secured by screws 4402. Additionally, FIG. 44 shows how the connection is made between side plates 4304, 4306 and rod 4308. In particular, the opposing ends of rod 4308 may be inserted into holes 4408 located on side plates 4304, 4306 and then secured by screws 4404.

FIG. 45 is a back perspective view of the flip mount of FIG. 43 mounted to the back of the cooling mount of FIG. 35. In particular, flip mount 4300 acts as a stand for cooling mount 3500. As shown in FIG. 45, a point of sale system 4502 may be attached to plate 4316 of arm 4314. The point of sale system 4502 may be attached to plate 4316 by any mechanism known in the art including but not limited to Velcro. Cooling mount 3500 may be supported in an upright position by flip mount 4300 such that the guide rail side 3502 of the cooling mount 3500 contacts the ground. Alternatively, flip mount 3500 allows cooling mount 3500 to be flipped such that the clamping mechanism side 3504 of the cooling mount 3500 contacts the ground (as shown in FIG. 47). This flipping feature allows greater efficiency and convenience for sales transactions to be made. For example, in operation, a cashier can quickly flip the cooling mount toward a customer so that the customer can make a credit card payment on the point of sale system and then quickly flip the cooling mount back to the cashier to complete the transaction.

FIG. 46 is an exploded view of the flip mount of FIG. 43 being mounted to the back of the cooling mount of FIG. 35. It should also be noted that flip mount 4300 may also be mounted to the back of cooling mounts 100 and 1900.

FIG. 47 is a front perspective view of the flip mount of FIG. 43 mounted to the back of the cooling mount of FIG. 35. As shown on FIG. 47, the point of sale system 4502 may comprise of a keypad, display and credit card slot. However, any point of sale system known in the art may be utilized.

Figure 52:
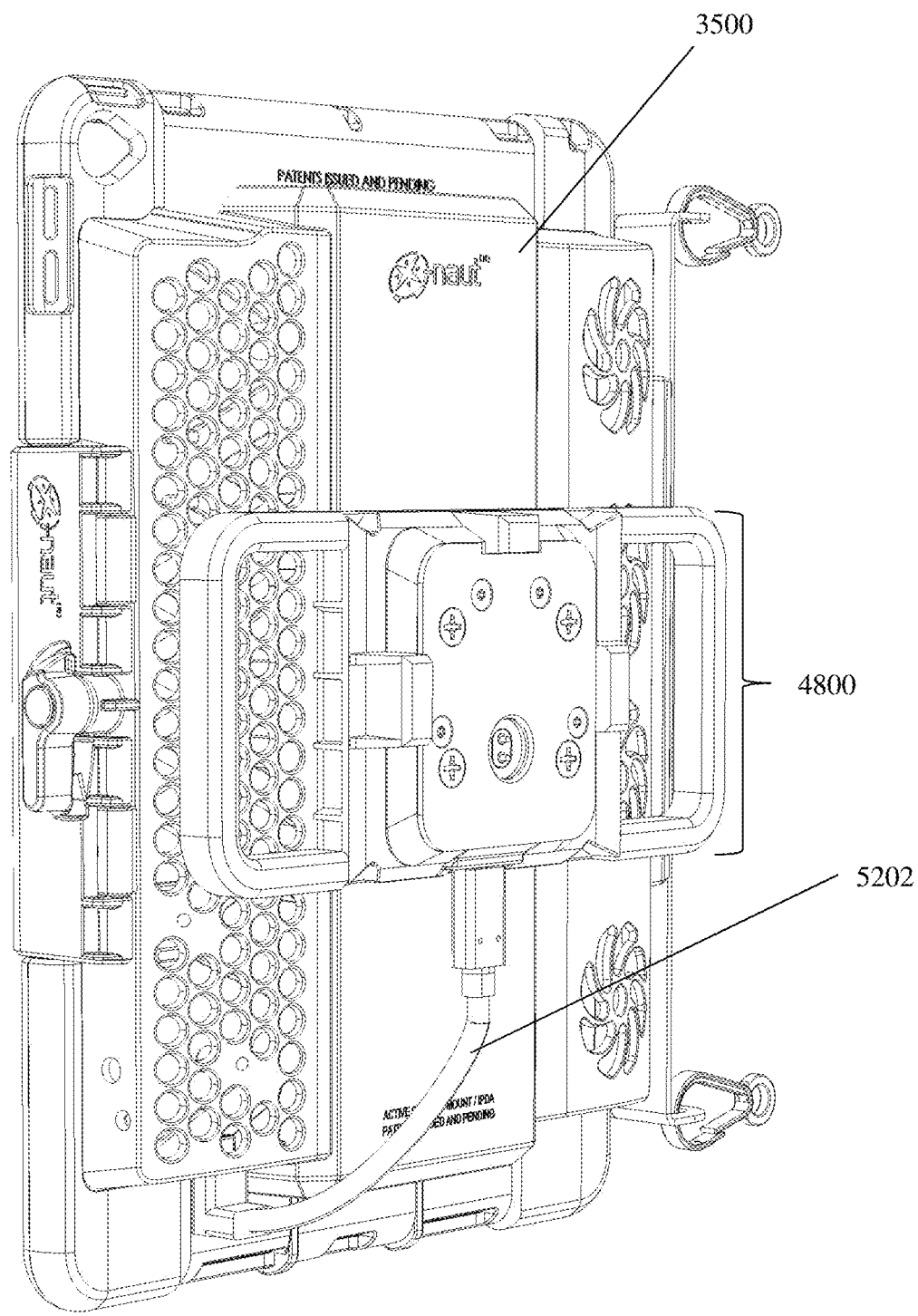
FIG. 52 illustrates the magnet mount of FIG. 48 mounted to the back of the cooling mount of FIG. 35.
Figure 53:
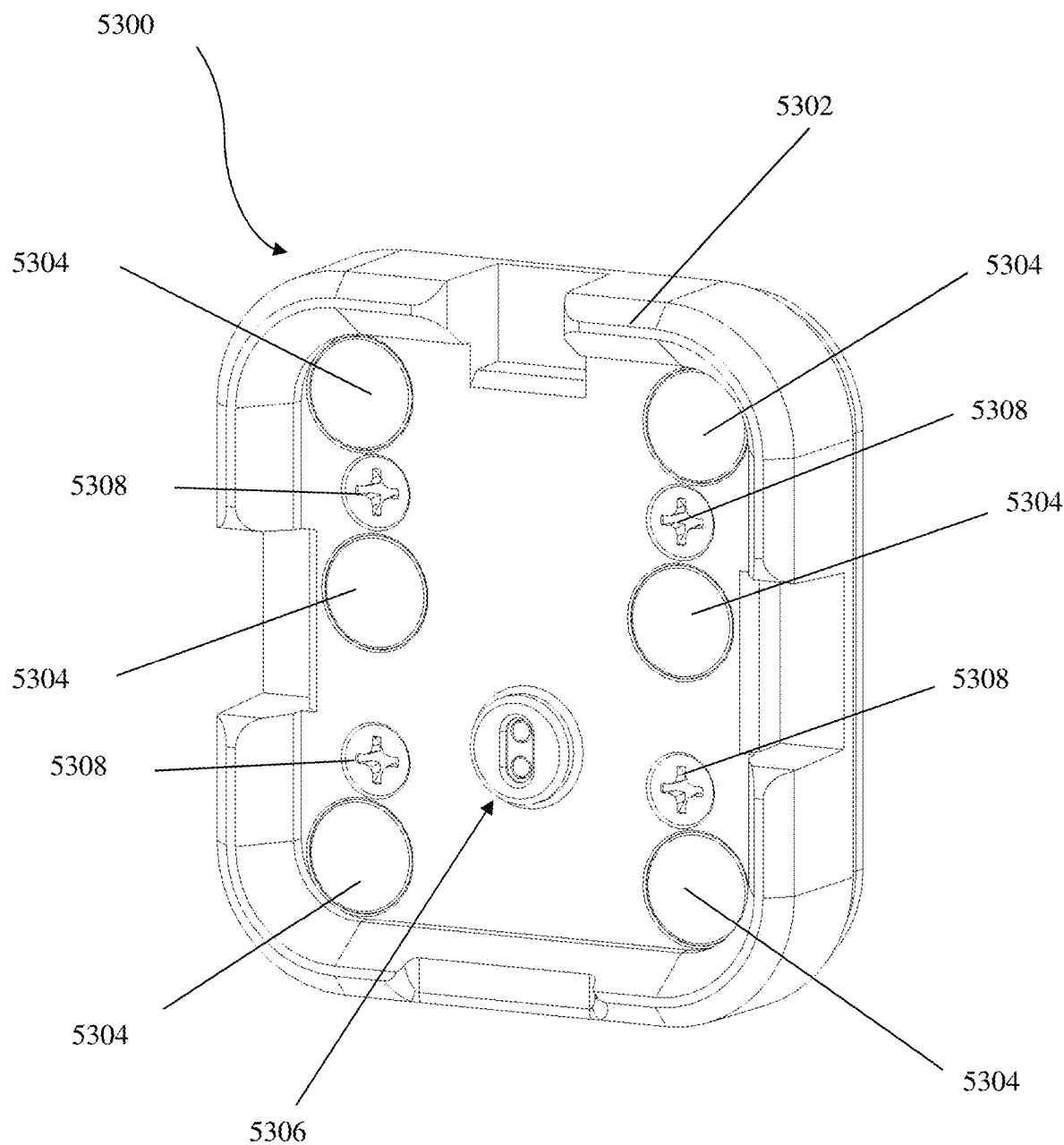
FIG. 53 is a front perspective view of a magnet receiving mount of the magnet mount assembly of the present invention.

FIGS. 48-65 illustrate one example of a magnet mounting assembly for portable electronic devices capable of supplying power to the portable electronic device through the mounting assembly. The magnet mounting assembly can be used with or without the cooling mount or temperature control device, and functions to allow the hands-free operation of the portable electronic devices at varying angles and various elevations. As will be illustrated below, the mounting assembly includes a magnet mount 4800 (FIG. 48) that is received or engaged by a receiving mount or a support mount 5300 (FIG. 53). The magnet mount 4800 is positioned on the back of the portable electronic device to magnetically engage the receiving mount or support mount 5300 in a manner that allows for the quick release of the portable electronic device from the receiving mount 5300.

Figure 48:
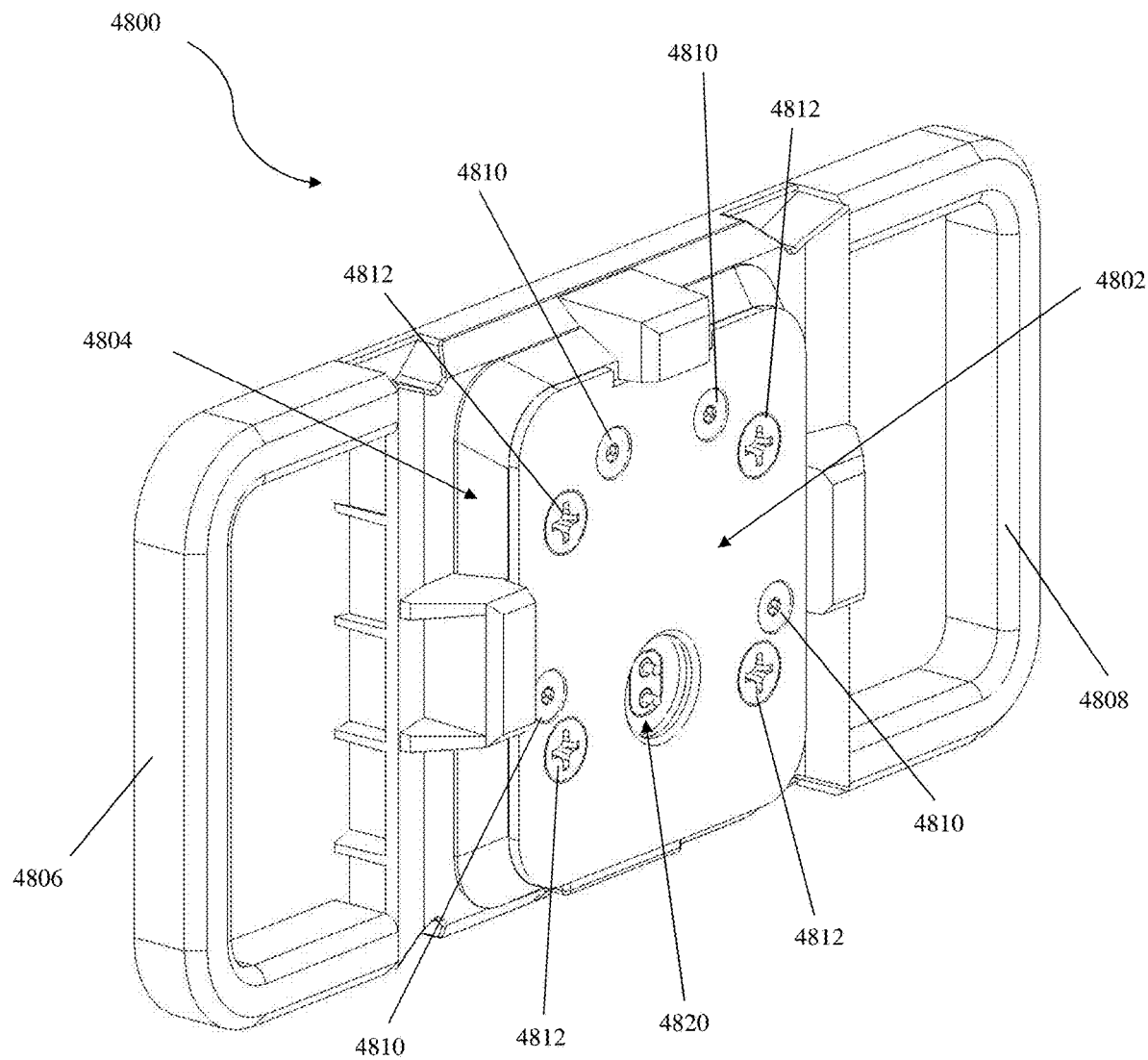
FIG. 48 is a rear perspective view of one example of a magnet mount of the magnet mount assembly of the present invention.

FIG. 48 is a rear perspective view of one example of a magnet mount 4800. The magnet mount 4800 may be mounted to the back of cooling mount 3500 or to the back of a portable electronic device. Magnet mount 4800 includes a magnet plate 4802, magnet plate securing mount 4804, electrical connection 4820, printed circuit board 5002 (shown in FIG. 50), screws 4810 for mounting the magnet plate to the magnet securing mount 4804 and screws 4812 for mounting the magnet mount 4800 to the back of cooling mount 3500 (as shown in FIG. 52). The magnet plate securing mount 4804 may further comprise of handles 4806, 4808 on opposite sides of the magnet plate securing mount 4804 for a user to grip when the magnet mount 4800 is mounted to the back of cooling mount 3500. As will be discussed further in connection with FIG. 50, the printed circuit board 5002 may comprise of two male pogo pins 5004, or other electrical connectors and USB port 5006. As will also be discussed further in connection with FIG. 50, magnet plate 4802 may include a hole or opening 5008 for the electrical connection 4820 in which the two male pogo pins 5004 may project through. The electrical connection 4820 includes electrical connectors for receiving power from a power supply and cable connection for interfacing with the magnet mount 4800 to provide power to the electrical connection in magnet mount 4800 to power a personal electronic device and/or a temperature regulating mount 3500.

Figure 49:
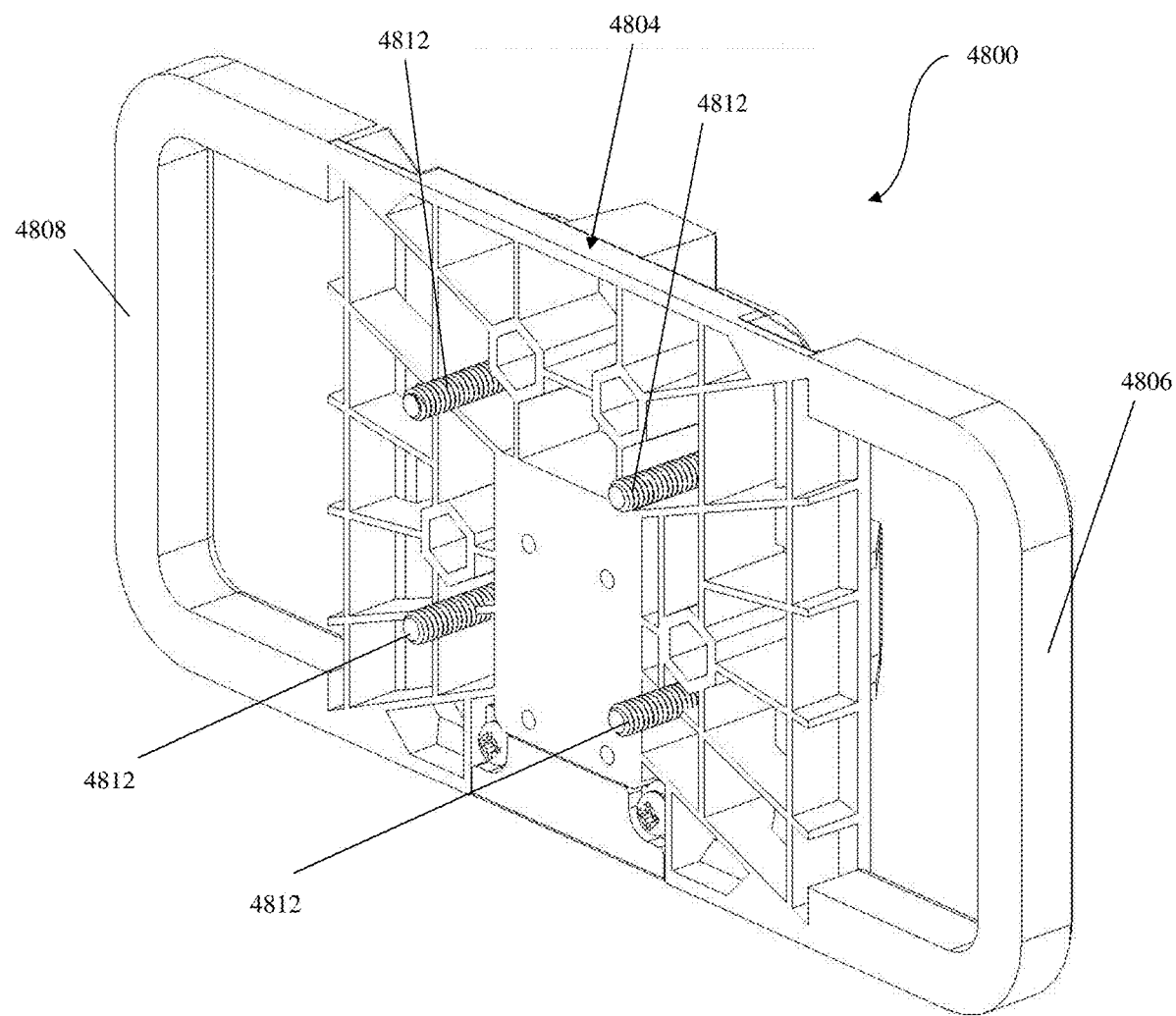
FIG. 49 is a front perspective view of the magnet mount of FIG. 48.

FIG. 49 is a front perspective view of the magnet mount 4800 of FIG. 48. In particular, FIG. 48 illustrates screws 4812 that project out from the front of the magnet mount 4800 for mounting to the back of cooling mount 3500. These screws 4812 are secured through the magnet plate 4802 and magnet plate securing mount 4804 to secure the magnet mount 4800 to the cool mount 3500. Those skilled in the art will recognize that other fastening mechanisms besides screws 4812 may be used to fasten the magnet mount 4800 to the cooling mount 3500, including but not limited to adhesive, friction fit connections, slide connections, or other know fastening mechanisms for secure two parts together.

Figure 50:
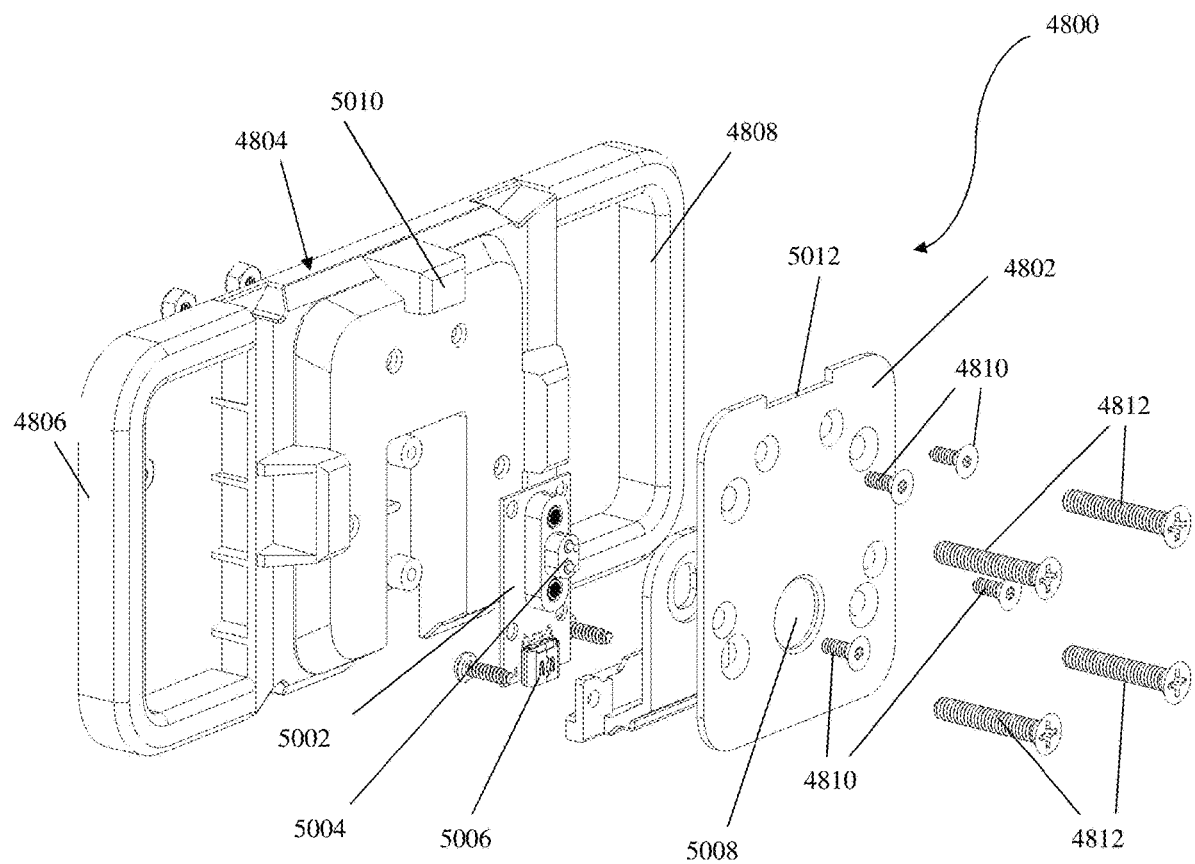
FIG. 50 is a rear exploded view of the magnet mount of FIG. 48.
Figure 51:
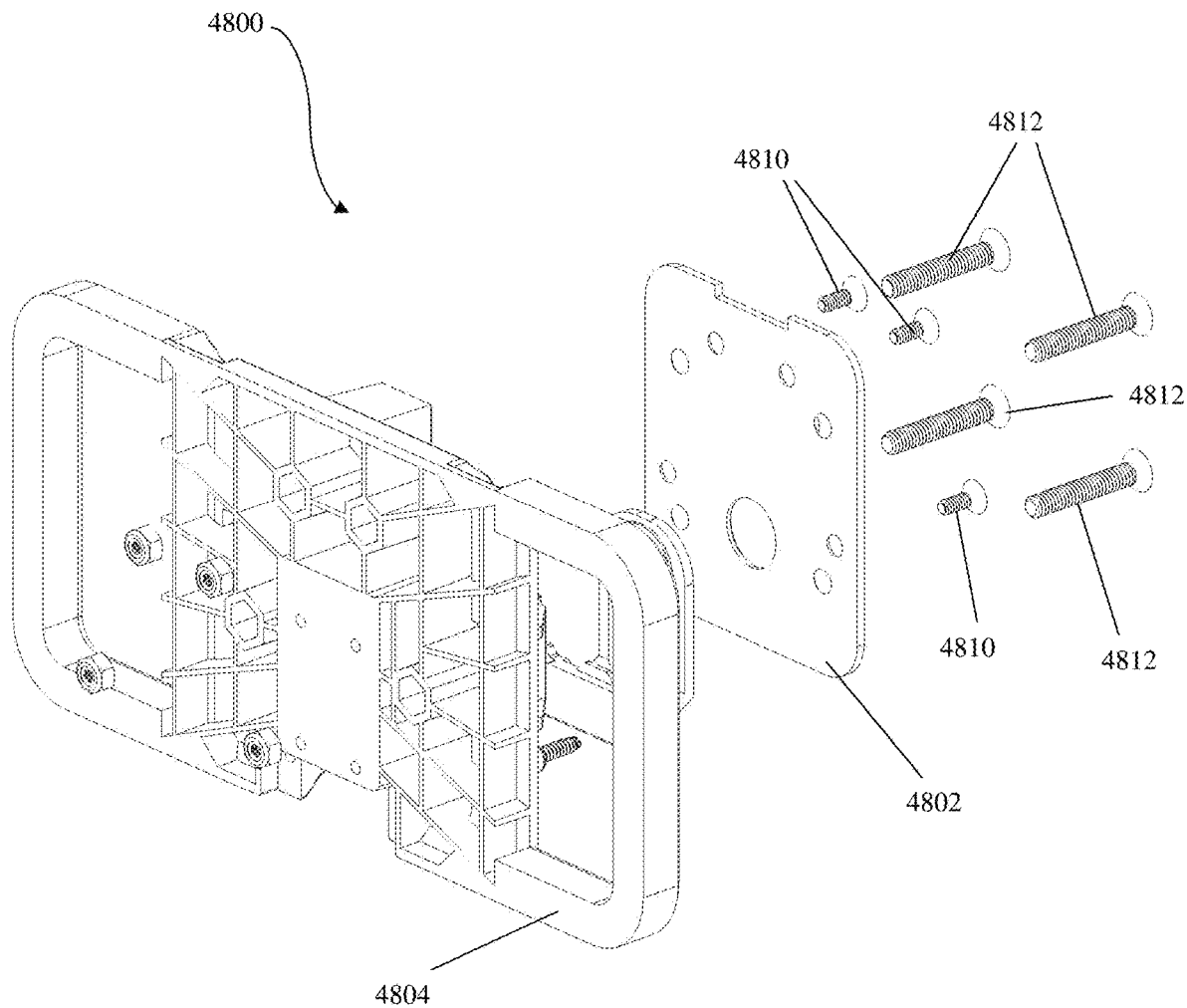
FIG. 51 is a front exploded view of the magnet mount of FIG. 49.

FIG. 50 is a rear exploded view of the magnet mount 4800 of FIG. 48, and FIG. 51 is a front exploded view of the magnet mount 4800 of FIG. 49. FIG. 50 most clearly illustrates the printed circuit board 5002, which may be located between magnet plate 4802 and magnet plate securing mount 4804. Male pogo pins 5004 and USB port 5006 may be located on printed circuit board 5002. While two male pogo pins are illustrated in FIG. 50, it should be recognized that any number of male pogo pins may be utilized in connection with magnet mount 4800. Male pogo pins 5004 and USB port 5006 are electrically connected to one another through printed circuit board 5002 such that when power is received by male pogo pins 5004, power is transmitted through USB port 5006. Additionally, a charging cable 5202 (shown in FIG. 52) may connect USB port 5006 to the charging port located on any electronic device as discussed in this application. Therefore, when power is receive by male pogo pins 5004, the electronic device mounted within cooling mount 3500 may get charged through charging cable 5202. FIG. 50 further shows securing block 5010 that may engage with groove 5012 located on magnet plate 4802 for providing further security when magnet plate 4802 is mounted to magnet plate securing mount 4804.

FIG. 52 illustrates the magnet mount 4800 of FIG. 48 mounted to the back of cooling mount 3500. While magnet mount 4800 is shown to be mounted to the back of cooling mount 3500, it should be understood that magnet mount 4800 may also be mounted to the back of cooling mounts 100 and 1900, or other implementations thereof. Additionally, it should further be understood that the number and placement of screws 4812 may vary in order to mount magnet mount 4800 to any of cooling mounts 3500, 100 and 1900. As further shown in FIG. 52, a charging cable 5202 may connect USB port 5006 to any electronic device in connection with the present invention in order to charge the electronic device.

FIG. 53 is a front perspective view of a magnet receiving mount 5300 for receiving and engaging the magnet mount 4800. The magnet receiving mount 5300 may include a receiver plate 5302, printed circuit board 5404 (shown in FIG. 54), receiver plate securing mount 5402 (shown in FIG. 54), magnets 5304, and screws 5308 for securing receiver plate 5302 to receiver plate securing mount 5402. As further illustrated in FIG. 53, six cylindrical magnets 5304 may be located within receiver plate 5302. It should be recognized that any number, size, or shape of magnets may be used in connection with the present invention. Optionally, the receiver plate 5302 may be made of ferromagnetic material. Magnets 5304 may further be located within receiver plate 5302 such that the magnets are flush with the receiver plate 5303. Receiver plate 5302 may further comprise of an opening 5408 (illustrated in FIG. 54) that exposes two female pogo pins 5306 (which are connected to printed circuit board 5404) for mating with the electrical connection 4812 of the magnet mount 4800.

Figure 54:
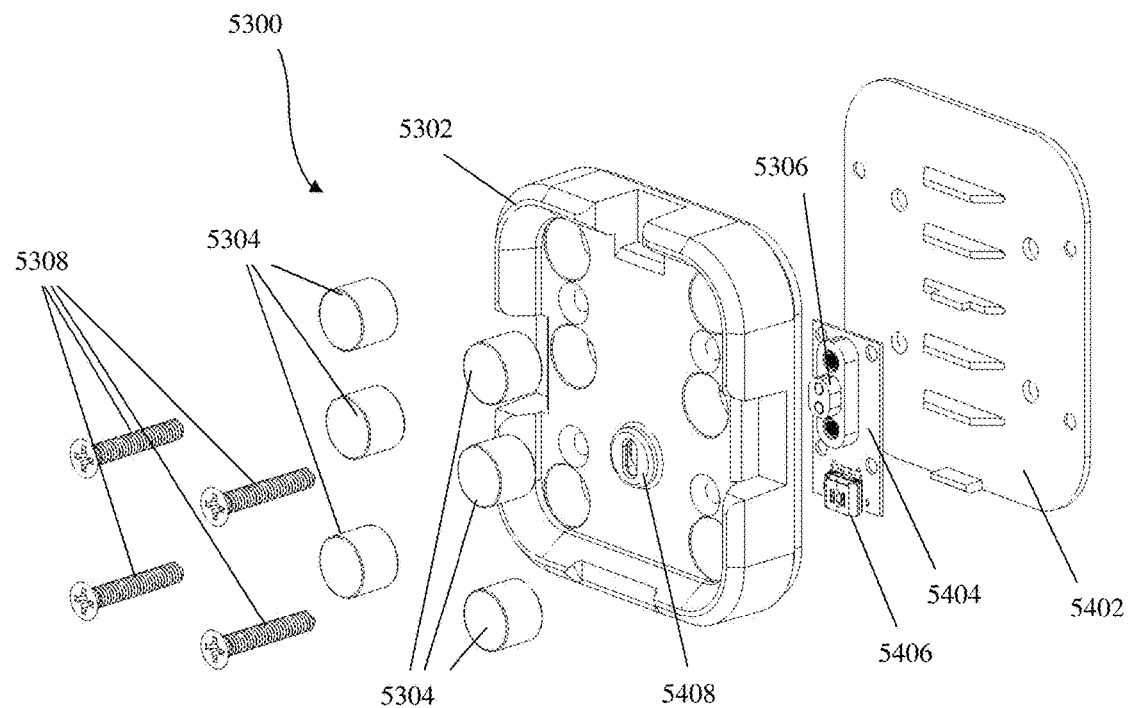
FIG. 54 is a front exploded view of the magnet receiving mount of FIG. 53.
Figure 55:
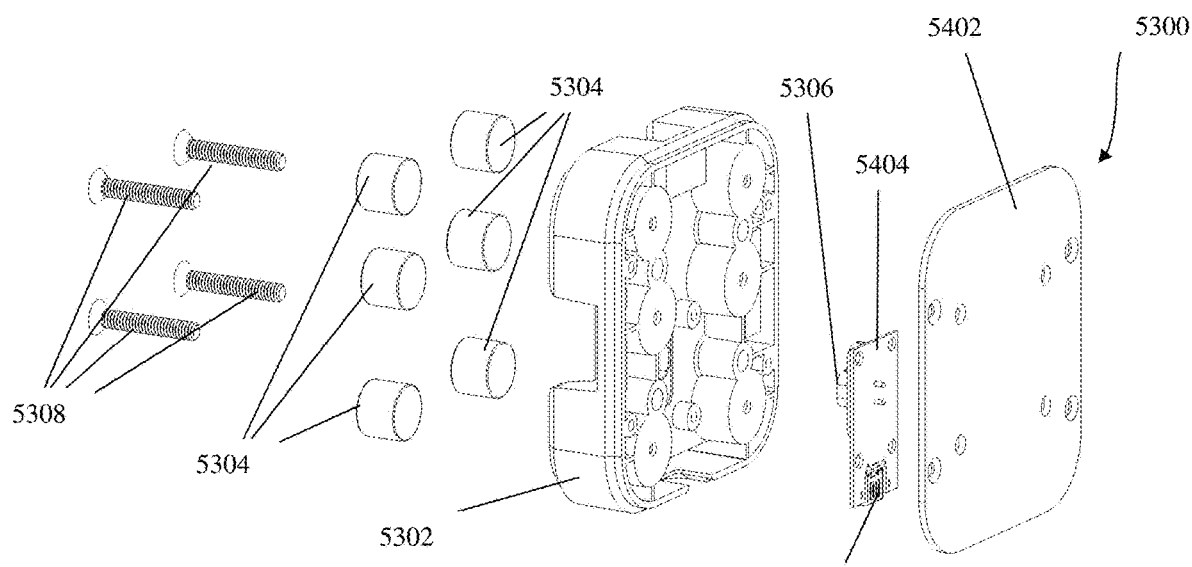
FIG. 55 is a rear exploded view of the magnet receiving mount of FIG. 53.

FIG. 54 is a front exploded view of the magnet receiving mount 5300 of FIG. 53. FIG. 55 is a back exploded view of the magnet receiving mount 5300 of FIG. 53. FIGS. 54 and 55 most clearly illustrate printed circuit board 5404, which may be located between receiver plate 5302 and receiver plate securing mount 5402. Female pogo pins 5306 and USB port 5406 may be located on printed circuit board 5404. While two female pogo pins are illustrated in FIG. 54, it should be recognized that any number of female pogo pins may be utilized in connection with magnet receiving mount 5300. Female pogo pins 5306 and USB port 5406 are electrically connected to one another through printed circuit board 5404 such that when power is received by USB port 5404, power is transmitted through female pogo pins 5306. While not shown, USB port 5406 may receive power from any external power source such as a power outlet.

Figure 56:
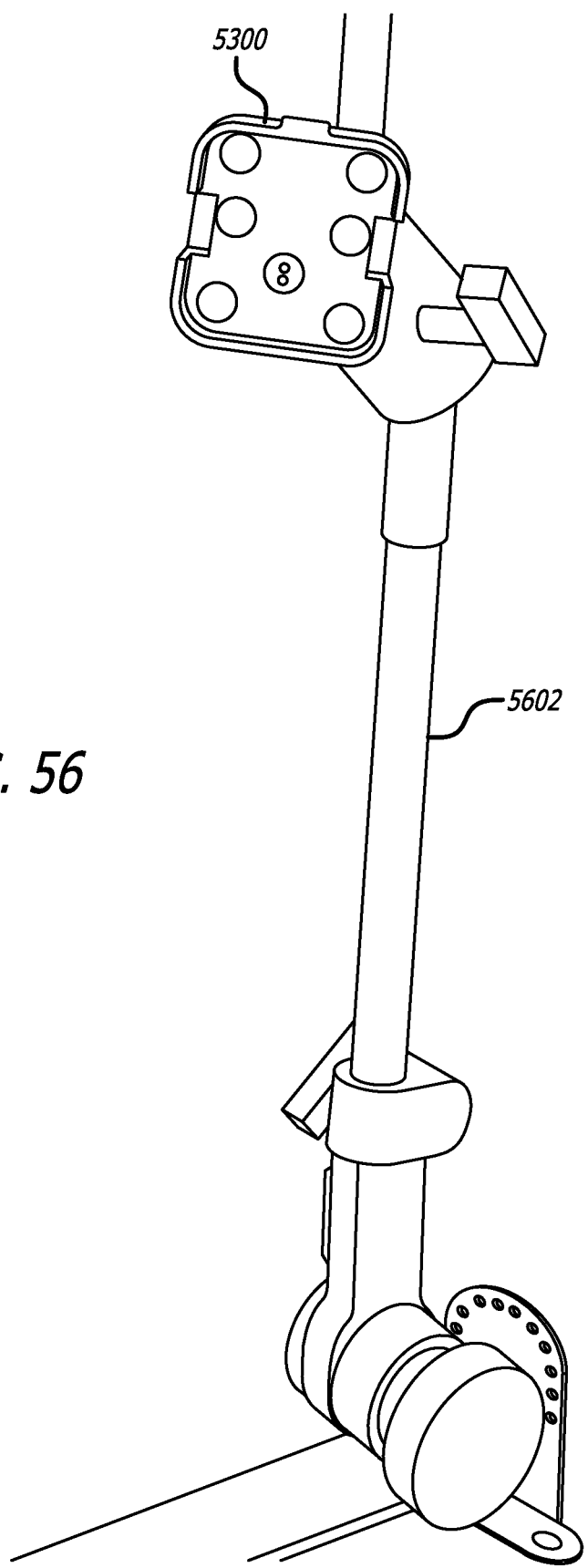
FIG. 56 is a photograph of magnet receiving mount being mounted to a table stand.

The magnet receiving mount 5300 may from part of any support mechanism, such as a stand, clamp and/or holder. FIG. 56 illlustrates on example of the magnet receiving mount 5300 incorporated into an adjustable height, pivotal stand. In particular, FIG. 56 is a photograph of a magnet receiving mount 5300 mounted to table stand 5602. Magnet receiving mount may be mounted to table stand 5602 by screws 5308. It should further be noted that any stand, holder, clamp or support device known in the art may be used for mounting magnet receiving mount 5300.

Figure 57:
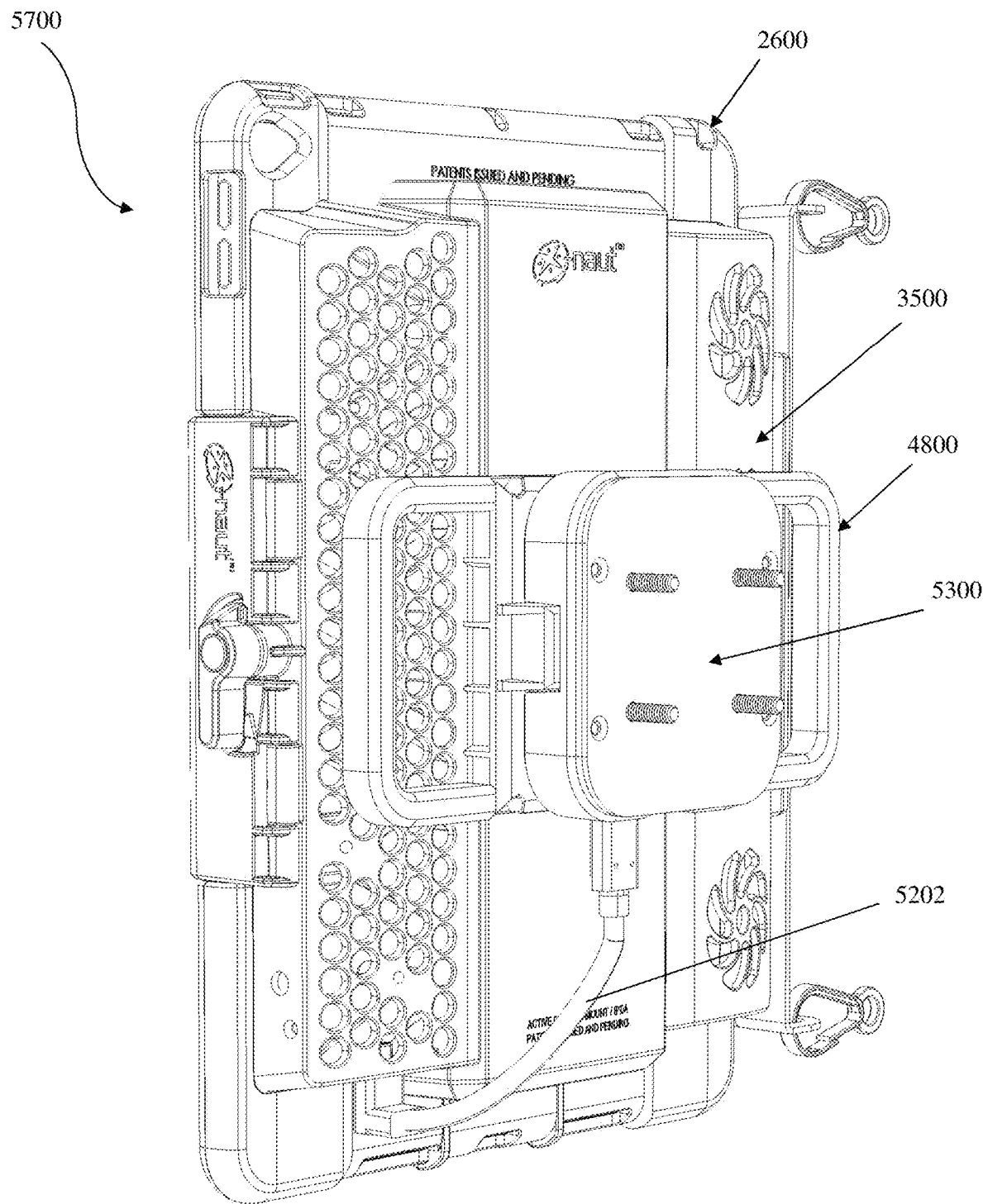
FIG. 57 illustrates another example of an implementation of a magnet mount assembly in accordance with the present invention.

For example, the receiving mount 5300 may be incorporated into floor stands, cup holders, vent clips, dash stands or other engagement devices typically used in a person's vehicle to support an electronic device. Further, the receiving mount 5300 may used in connection with any of the different types of mounts previously described above for engaging the cooling mount 3500. FIG. 57 illustrates one example of a magnet mount assembly 5700 in accordance with the present invention, with the magnet mount 4800 and receiving mount 5300 engaged on the back of cooling mount 3500. In particular, magnet mount assembly 5700 comprises the front of magnet mount 4800 secured to the back of cooling mount 3500 and the back of magnet mount 4800 connected to the front of magnet receiving mount 5300. The back of magnet mount 4800 may connect to the front of magnet receiving mount 5300 by the attraction of magnet plate 4802 to magnets 5304. It should be recognized that the pull force of the magnet plate 4802 with magnets 5304 may vary depending on the strength of connection desired, but may be, in one implementation, at least 15 lbs. of pull force required to disconnect the magnet mount 4800 from the receiving mount 5300.

When the back of magnet mount 4800 is connected to the front of magnet receiving mount 5300 by magnetic force, a connection is also made between the male pogo pins 5004 and female pogo pins 5306. As should be understood in the art, male pogo pins 5004 usually take the form of a slender cylinder containing a spring-loaded pin and when pressed with female pogo pins 5306, the points at each end of the male pogo pins 5004 make secure contacts with the two printed circuit boards 5002 and 5404 and thereby electrically connect them together. Therefore, in operation, external power may be provided to USB port 5406, which in turn transmits power to female pogo pins 5306 through printed circuit board 5404. The power from female pogo pins 5306 is then received by male pogo pins 5004 and transmitted to USB port 5006 through printed circuit board 5002. A charging cable 5202 connected to USB port 5006 may then provide charging to any electronic device located within perimeter casing 2600 as discussed above. Therefore, the magnetic connection between the magnet mount 4800 and magnet receiving mount 5300 may ultimately allow for the charging to any electronic device as discussed above. Those skilled in the art will recognize that the invention is not limited to the use of USB ports and that other pin connectors and adapters may be used to receive and supply power from the receiving mount 5300 to the magnet mount 4800 to supply power to the electrical device. Further, the present invention may be adapted to also supply power to the cool mount 3500. The electrical connection includes electrically connectors for receiving power from a power supply and cable connection for interfacing with the magnet mount 4800 to provide power to the electrical connection in magnet mount 4800 to power a personal electronic device and/or a temperature regulating mount 3500.

Figure 58:
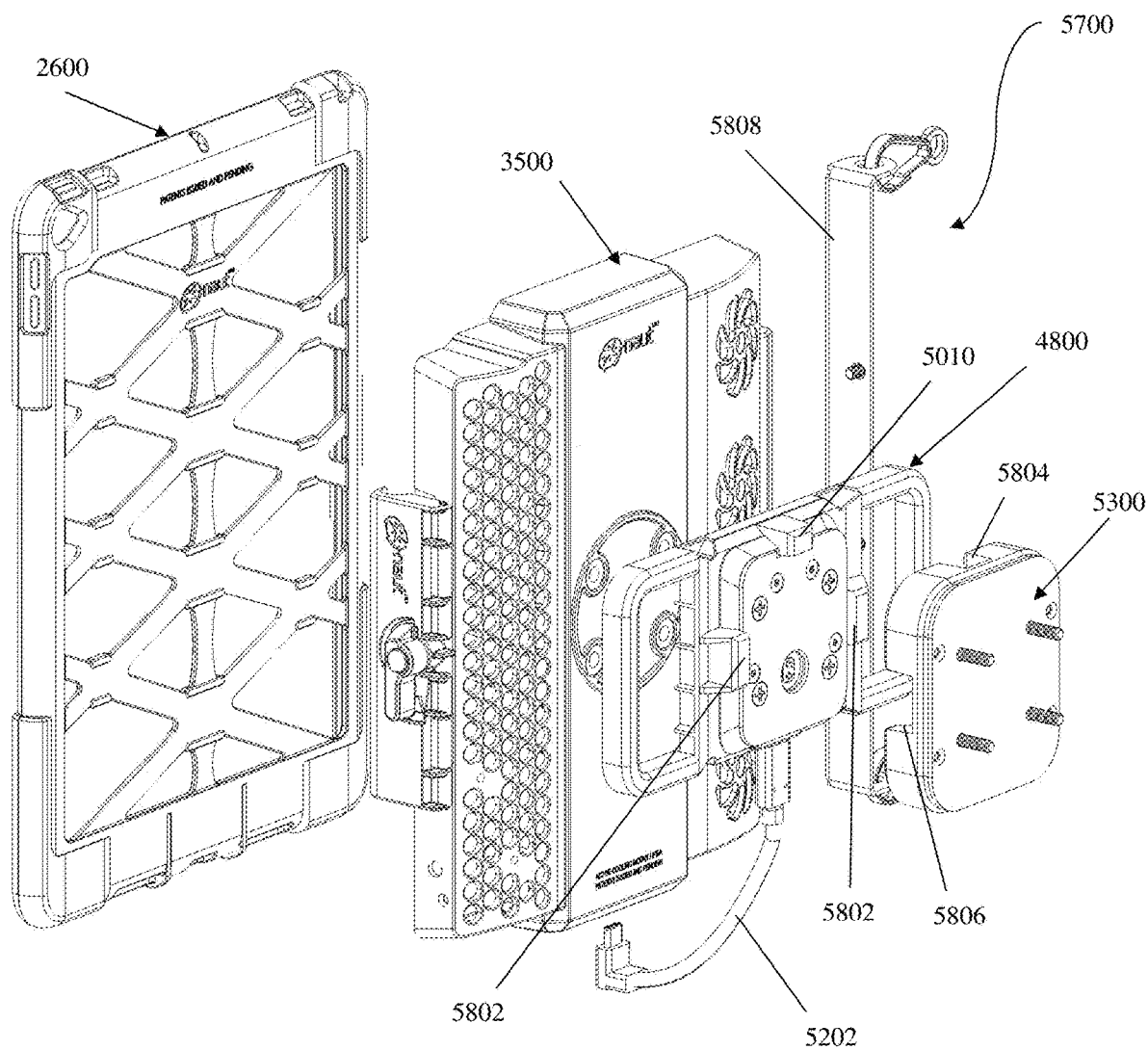
FIG. 58 illustrates an exploded view of the magnet mount assembly of FIG. 57.

FIG. 58 illustrates an exploded view of the magnet mount assembly 5700 of FIG. 57. FIG. 58 further illustrates securing block 5010 that may engage with groove 5804 located on receiver plate 5302 and securing blocks 5802 engaging with grooves 5806 for providing further security when magnet receiving mount 5300 is mounted to magnet mount 4800, and for properly aligning the magnet mount 4800 with the receiving mount 5300.

Figure 59:
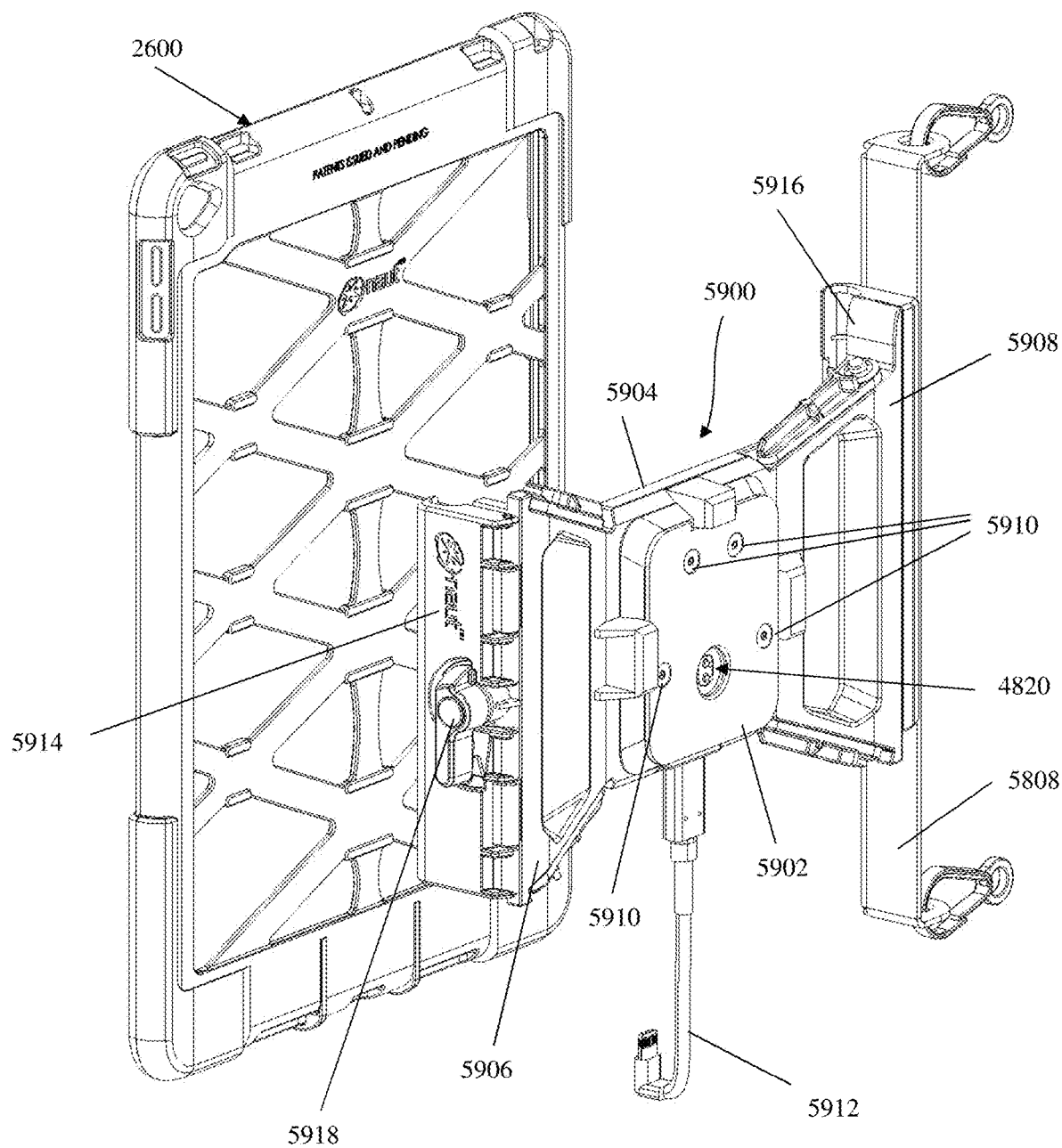
FIG. 59 is the rear of another example of a magnet mount in accordance with the present invention.

FIG. 59 is the rear of another example of a magnet mount 5900 in accordance with the present invention. Unlike magnet mount 4800, magnet mount 5900 may attach directly to the back of perimeter casing 2600. Similar to magnet mount 4800, magnet mount 5900 may comprise of magnet plate 5902, magnet plate securing mount 5904, electrical connection 4820, printed circuit board 6002 (shown in FIG. 60), and screws 5910 for mounting the magnet plate 5902 to the magnet securing mount 5904.

The magnet plate securing mount 5904 may further comprise of handles 5906, 5908 on opposite sides of the magnet plate securing mount 5904 for a user to grip when the magnet mount 5900 is mounted to the back of perimeter casing 2600. In this example, the magnet plate securing mount 5904 includes a central portion where the magnet plate is secured against the magnet plate securing mount. The handles 5906, 5908 extend outward from the sides of the central portion in opposing manner, extending between the central portion of the magnet plate securing mount 5904 and the guide rail 5916 on one side and the clamping mechanism 5914 on the other sides.

As further shown on FIG. 59, guide rail 5916 may be attached to one side on handle 5908 of the magnet plate securing mount 5904 and clamping mechanism 5914 may attach to the opposite side on handle 5906 of magnet plate securing mount 5904. Guide rail 5916 and clamping mechanism 5914 may have the same features and functionalities as those associated with guide rail 3502 and clamping mechanism 3504. For example, similar to clamping mechanism 3504, clamping mechanism 5914 may pivot from an open position to a closed positioner. In the closed position, clamping mechanism 5914 may engage perimeter casing 2600 (in which an electronic device may be held within) such that the electronic device is maintained between guide rail 5916 and clamping mechanism 5914 in magnet plate securing mount 5904. The clamping mechanism 5914 may then lock into place by a movable or pivotable locking mechanism 5918. Therefore, the same mechanism for securing perimeter casing 2600 to cooling mount 3500 may be used to secure perimeter casing 2600 to magnet mount 5900. Additionally, external accessories, such as shoulder strap clips 5918 may be mounted on magnet mount 5900. Guide rail 5916 and clamp mechanism 5914 may further mate with grooves or indents in the sides of the perimeter casing 2600, in the same manner as previously described above.

Figure 60:
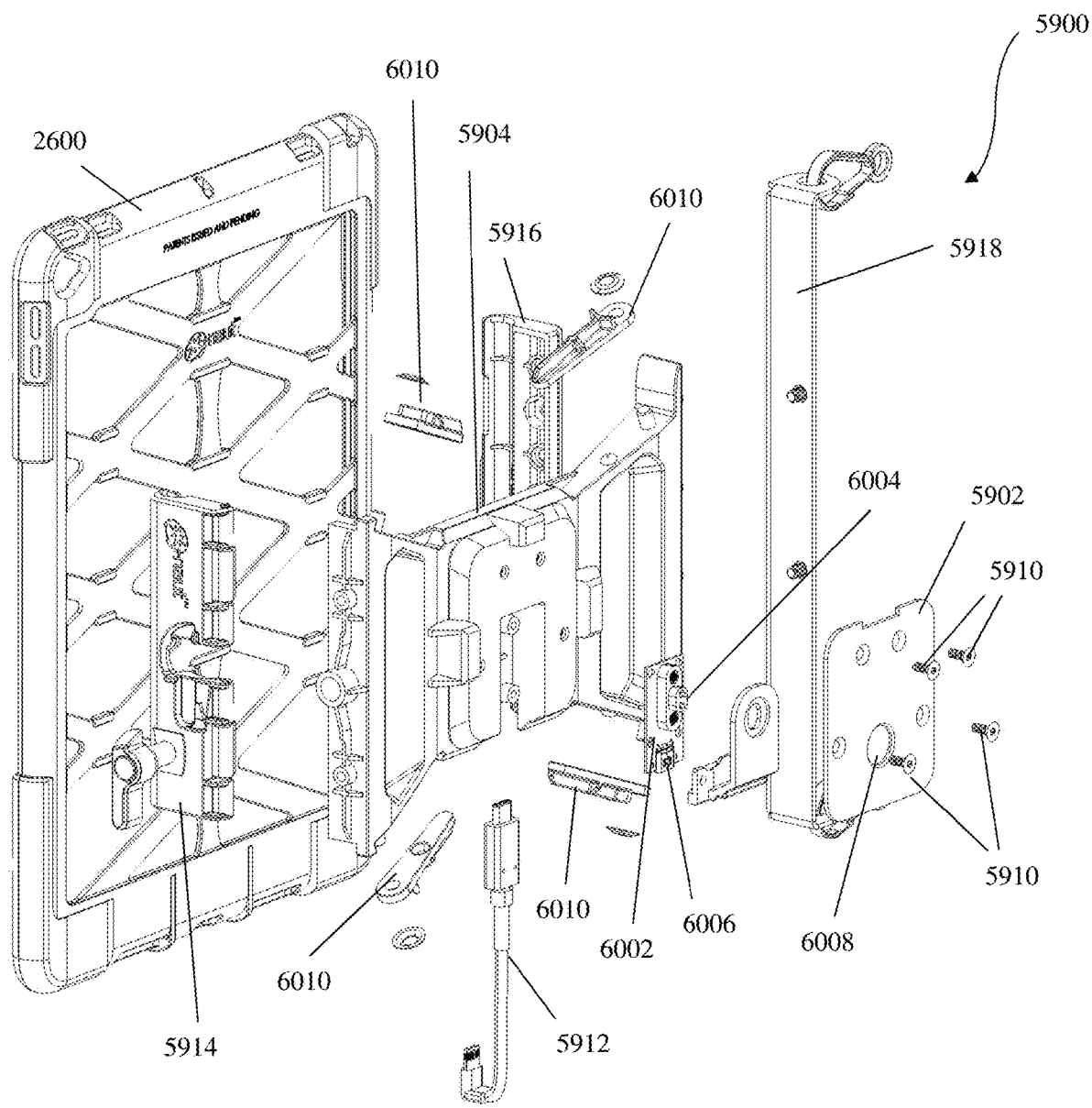
FIG. 60 is an exploded view of the back of the magnet mount of FIG. 59.

FIG. 60 is an exploded view of the back of magnet mount 5900 of FIG. 59. FIG. 60 most clearly illustrates printed circuit board 6002, which may be located between magnet plate 5902 and magnet plate securing mount 5904. The features and functionalities of the printed circuit board 6002 may be the same as those discussed for printed circuit board 5002. For example, male pogo pins 6004 and USB port 6006 are electrically connected to one another through printed circuit board 6002 such that when power is received by male pogo pins 6004, power is transmitted through USB port 6006. Additionally, a charging cable 5912 (shown in FIG. 59) may connect USB port 6006 to the charging port located on any electronic device as discussed in this application. Also shown in FIG. 60, are folding feet 6010 that allow the perimeter casing to lie on a flat surface at an angle on either a portrait position or landscape position. These folding feet 6010 are also illustrated in connection with FIGS. 64 and 65, and are able to move independent of one another.

Figure 61:
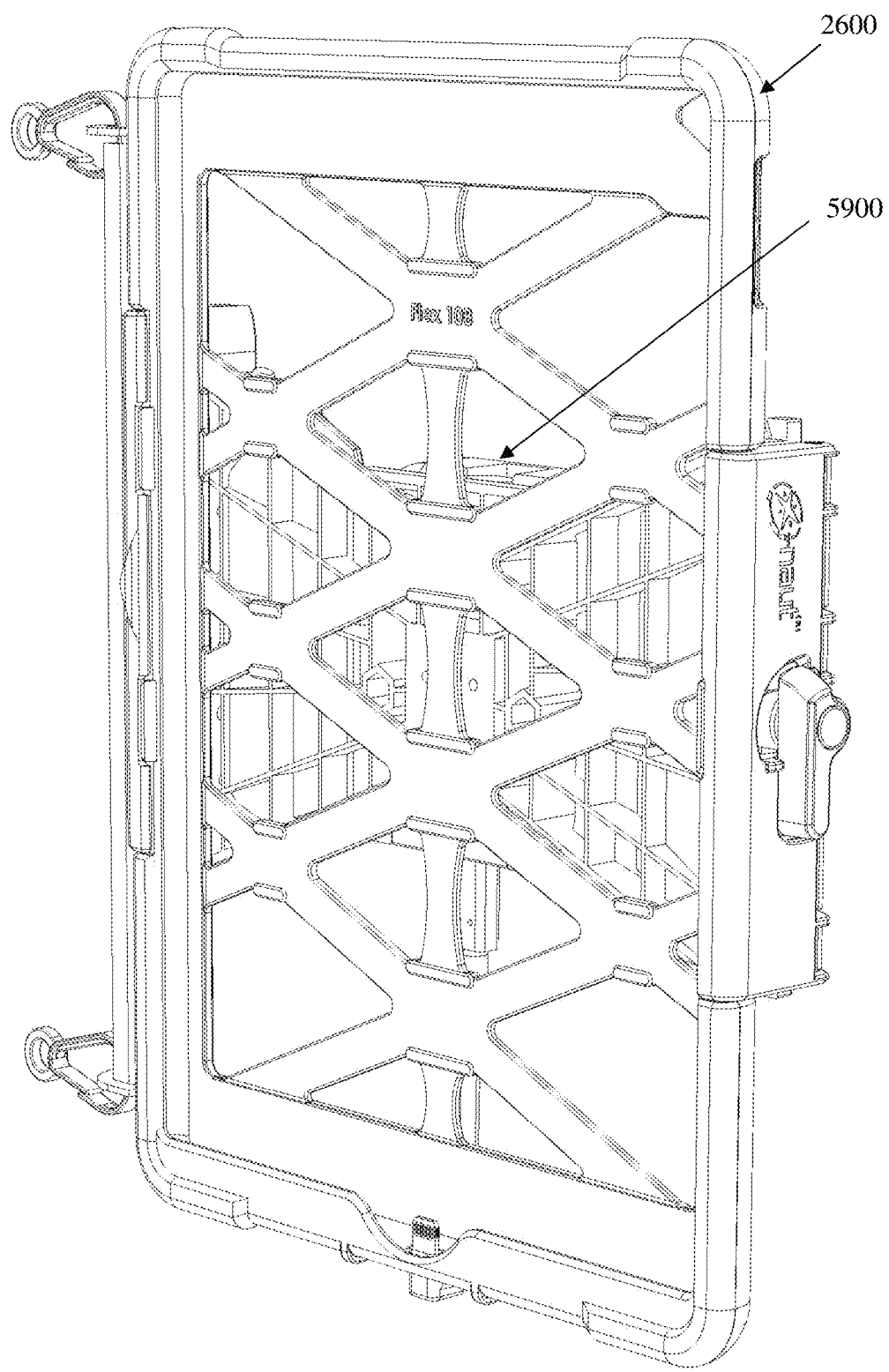
FIGS. 61 and 62 illustrate front perspective views of the magnet mount of FIG. 59 secured to the perimeter casing of FIG. 26.
Figure 62:
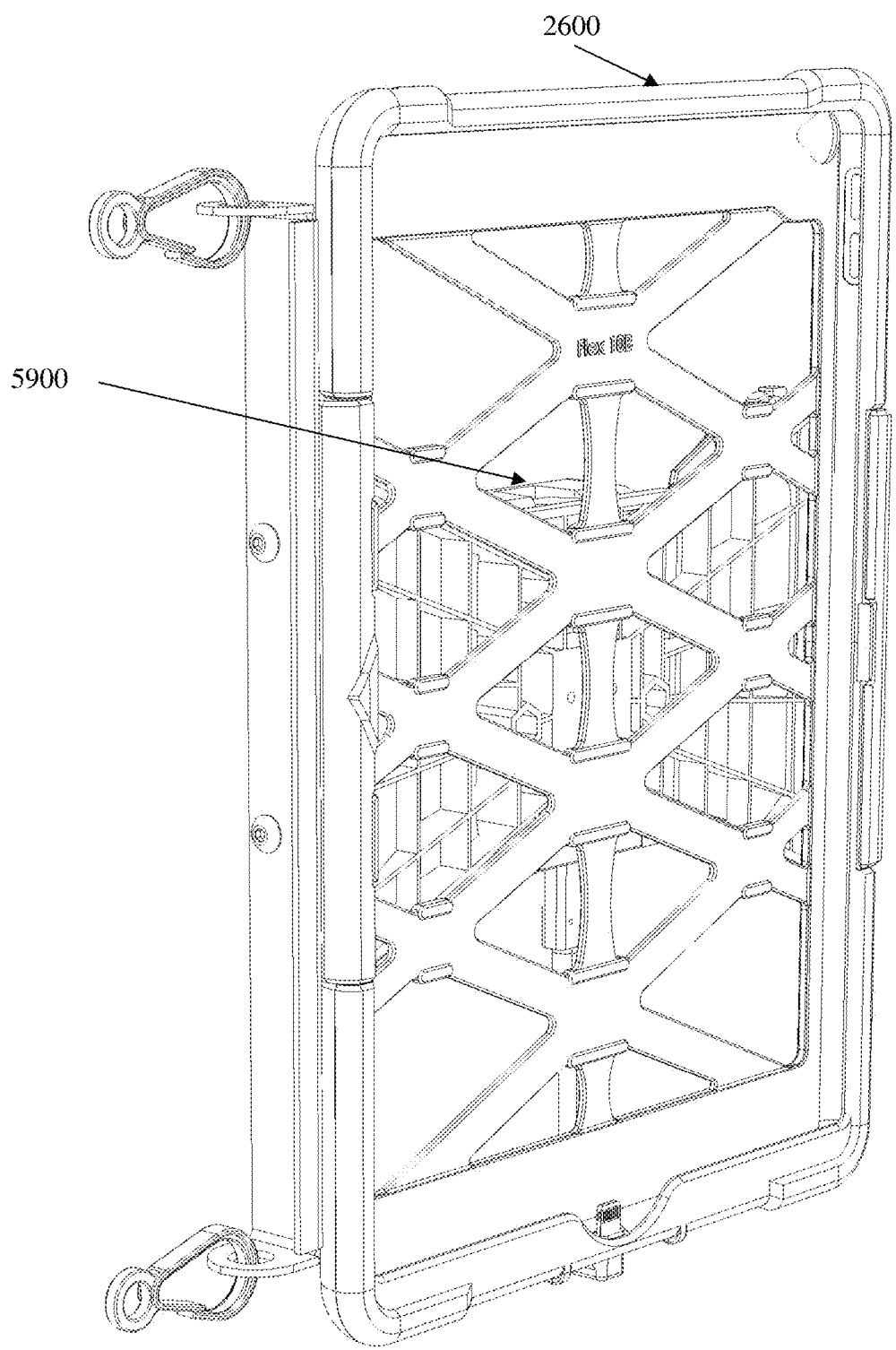
Figure 63:
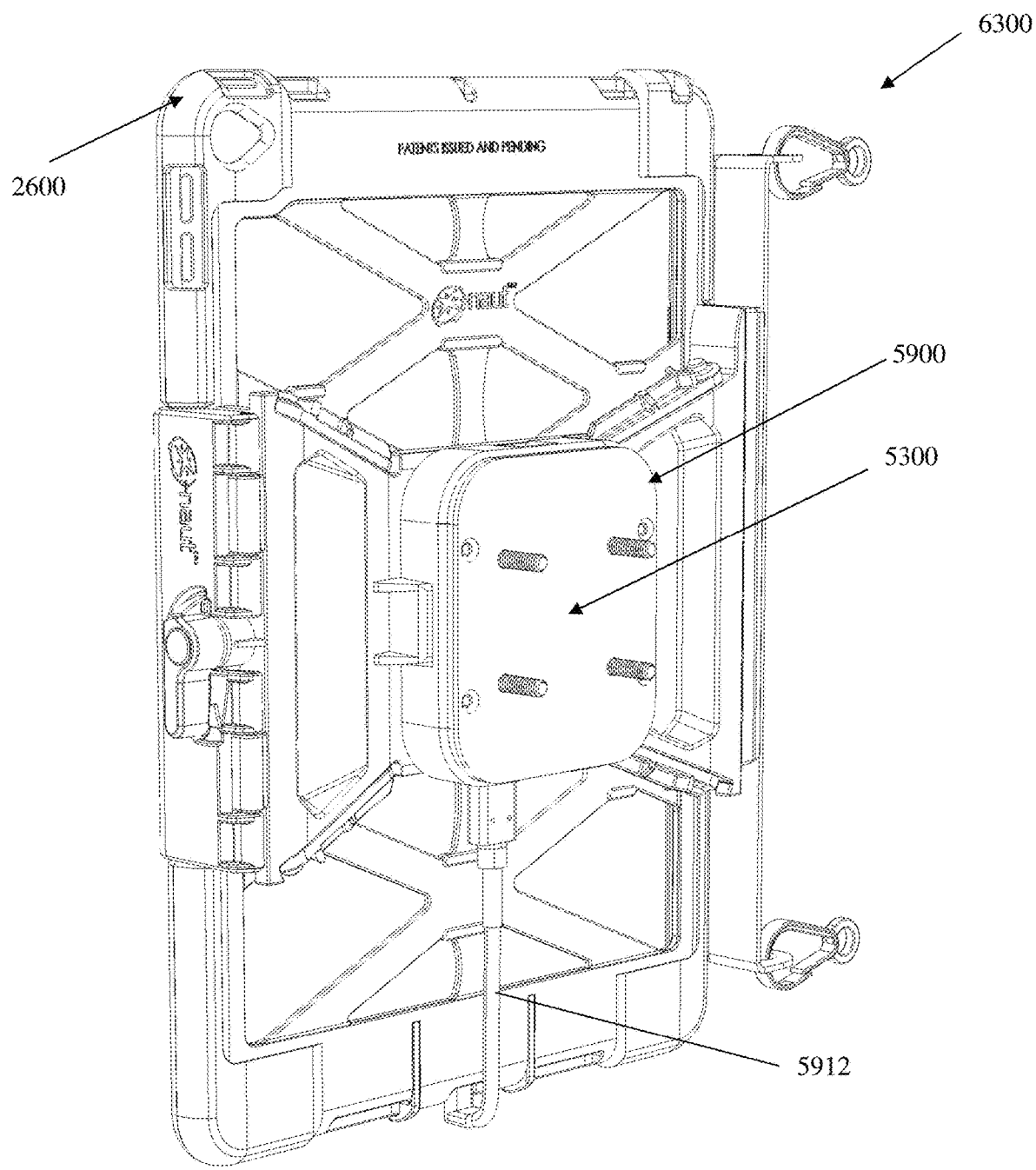
FIG. 63 illustrates back perspective views of another example of a magnet mount assembly in accordance with the present invention.

FIGS. 61 and 62 illustrate front perspective views of magnet mount 5900 when secured to perimeter casing 2600. FIG. 63 illustrates a back perspective views of one example of a magnet mount assembly 6300 in accordance with the present invention, with the magnet mount 5900 and receiving mount 5300 engaged on the back of cooling mount 3500. In particular, magnet mount assembly 6300 comprises the front of magnet mount 5900 secured to the back of perimeter casing 2600 and the back of magnet mount 5900 connected to the front of magnet receiving mount 5300. The back of magnet mount 5900 may connect to the front of magnet receiving mount 5300 in the same way as magnet mount 4800 is connected to magnet receiving mount 5300, which is by the attraction of magnet plate 5902 to magnets 5304. Similarly, the magnetic connection between the magnet mount 5900 and magnet receiving mount 5300 may ultimately allow for the charging to any electronic device secured in perimeter casing 2600 as discussed above.

Figure 64:
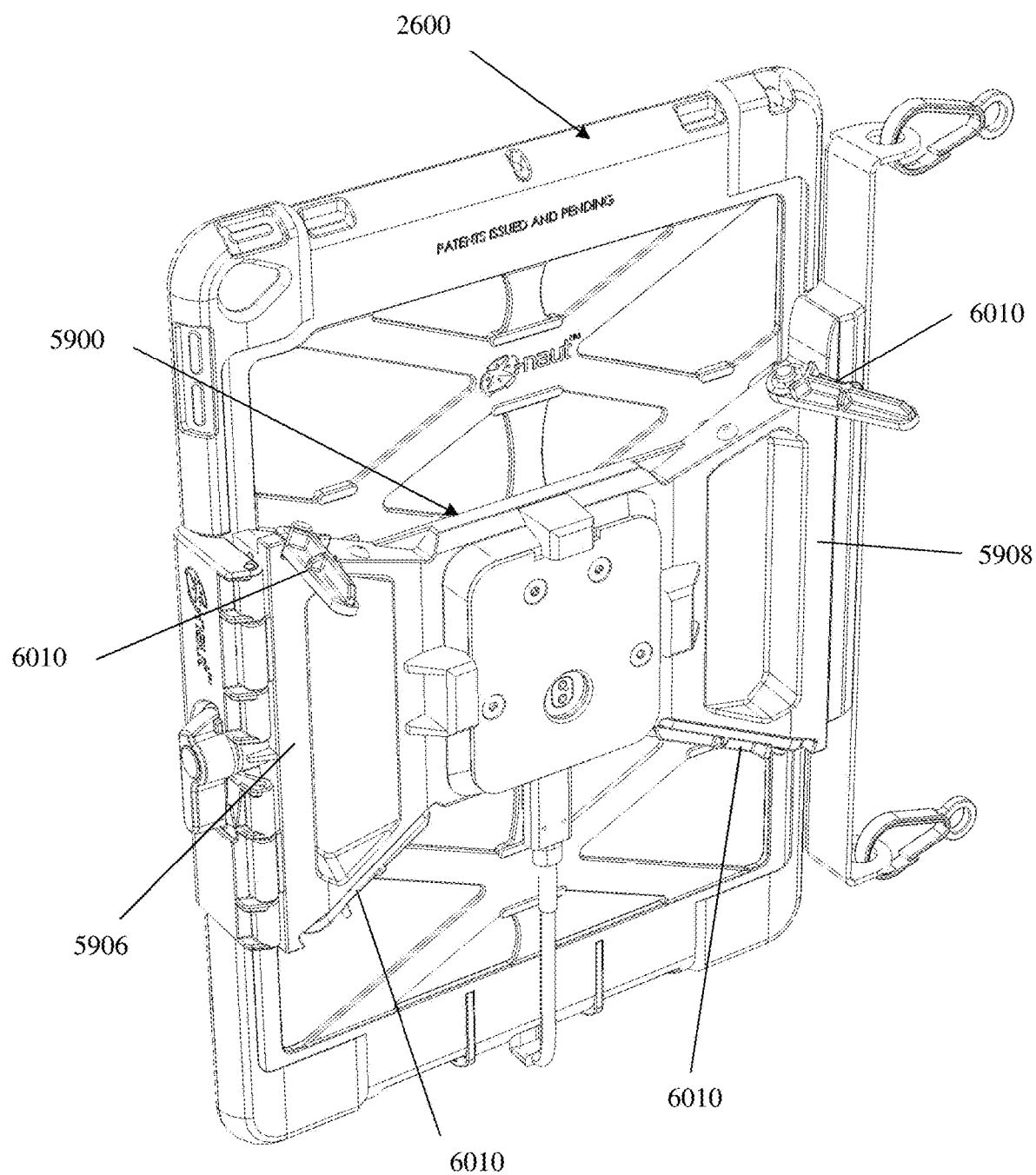
FIGS. 64 and 65 illustrate the folding feet of the magnet mount of FIG. 59.

FIGS. 64 and 65 illustrate the folding feet of magnet mount 5900. Also shown in FIGS. 64-65, the folding feet 6010 allow the perimeter casing to lie on a flat surface at an angle on either a portrait position (FIG. 64) or landscape position (FIG. 65). In this example, the four folding feet 6010 are pivotally connect to the handles 5906, 5908 such that two are on the two sides of the handles and two are on the bottom sides of the handles 5906, 5908. In particular, FIG. 64 illustrates two of the folding feet located on the top of the handles 5906, 5908 in an open position such that perimeter casing 2600 may be angled in a portrait position. FIG. 65 illustrates two of the folding feet on the same side of handle 5906 in an open position such that perimeter casing 2600 may be angled in a landscape position.

In operation the magnet mount and receiving mount of FIGS. 48-65 are magnetically attracted to one another through the magnetic in the receiving mount and magnetic plate in the magnet mount. The magnet mount and receiving mount engage on another when positioned in close proximity. Corresponding protrusions and groove in the magnet mount and receiving mount align allowing an electrical connection between the magnet mount and receiving mount for powering the electronic device or temperature regulating mount. External power is supplied to the receiving mount. The receiving mount may incorporated into any support structure designed to engage any number of objects or rest on a surface.

Other features may also be optionally implemented into the cooling mounts described herein, without departing from the scope of the invention. For example, other cooling units or mechanism for cooling the portable electronic device, such as induction cooling, may be used in addition to or in lieu of fans. Depending upon the type of cooling unit, contact may be desired between the electronic device and the cooling unit 105. Further, the cooling mounts may include WiFi access, Bluetooth and other hardware and software to facilitate communications between the cooling mounts and the portable electronic devices and an internal or external network. Bluetooth, WiFi, radio and or other wired or wireless communications may be established between the portable electronic devices and cooling mounts to increase functionality by placing the cooling mounts in signal communication with the portable electronic devices. For example, speakers or other accessories may be included in the cooling mounts that are accessible through communication between the portable electronic devices and cooling mounts.

It will be understood that the component parts of the system taught herein may further be in signal communication with one another. The term "in signal communication" as used herein means that two or more systems, devices, components, modules, or sub-modules are capable of communicating with each other via signals that travel over some type of signal path. The signals may be communication, power, data, or energy signals, which may communicate information, power, or energy from a first system, device, component, module, or sub-module to a second system, device, component, module, or sub-module along a signal path between the first and second system, device, component, module, or sub-module. The signal paths may include physical, electrical, magnetic, electromagnetic, electrochemical, optical, wired, or wireless connections. The signal paths may also include additional systems, devices, components, modules, or sub-modules between the first and second system, device, component, module, or sub-module.

More generally, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components. For purposes of this application, the hardware and/or software necessary to establish signal communication between two components shall be "communications components."

The foregoing description of an implementation has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A magnet mount, the magnet mount comprising a magnet plate, a magnet plate securing mount having a central portion for receiving the magnet plate, where the magnet plate securing mount further includes at least one handle extending outward from one side of the central portion, the magnet mount further including an electrical connection exposed through an opening in the magnet plate, where the electrical connection includes electrical connectors for receiving power from a power supply and cable connection for interfacing with a portable electronic device to provide power to the portable electronic device through the magnet mount, and where the magnet mount further includes a fastening mechanism for fastening the back of the magnet mount to a temperature regulating unit that engages the portable electronic device to regulate the temperature of the portable electronic device.

2. The magnet mount of claim 1 further including a receiving mount for mating with the magnet mount, where the receiving mount includes magnets and an electrical connection for mating with the electrical connection on the magnet mount for supplying power to the magnet mount.

3. The magnet mount of claim 1 where the magnet plate securing mount further includes at least two opposing handles with one handle extending outward from one side of the central portion and the other handle extending outward from the opposing side of the central portion.

4. The magnet mount of claim 3 further including a guide rail on one side of one of the two opposing handles and a clamping mechanism on the opposing side of the other of the two opposing handles for clamping to a casing designed to engage the portable electronic device.

5. A magnet mount assembly, the magnet mount assembly including a magnet mount for mounting onto a temperature regulating unit that engages a portable electronic device to regulate the temperature of the portable electronic device, where the magnet mount has a central portion for receiving a magnet plate and two opposing handles extending outward from each side of the central portion, the magnet mount further including an electrical connection exposed through an opening in the magnet plate, where the electrical connection includes electrical connectors for receiving power from a power supply and cable connection for interfacing with the portable electronic device to provide power to the portable electronic device through the magnet mount.

6. The magnet mount of claim 5 further including a receiving mount for mating with the magnet mount, where the receiving mount includes magnets that are magnetically attracted to the magnet mount and an electrical connection for mating with the electrical connection on the magnet mount for supplying power to the magnet mount.

7. The magnet mount of claim 5 where the temperature regulating unit includes a clamping mechanism for clamping to the portable electronic device.

8. A magnet mount assembly, the magnet mount assembly comprising
    a magnet mount having a magnet plate mounted to a central portion of the magnet mount, the magnet mount further including an electrical connection exposed through an opening in the magnet plate, where the electrical connection includes electrical connectors for receiving power from a power supply and cable connection for interfacing with a portable electronic device to provide power to the portable electronic devices through the magnet mount, and where the magnet mount further includes a fastening mechanism for fastening the back of the magnet mount to a temperature regulating unit that engages the portable electronic device to regulate the temperature of the portable electronic device; and
    a receiving mount for mating with the magnet mount, where the receiving mount includes magnets that are magnetically attracted to the magnet plate on the magnet mount and an electrical connection for mating with the electrical connection on the magnet mount for supplying power to the magnet mount.

9. The magnet mount assembly of claim 8 where the magnet mount includes two opposing handles where one handle extends outward from one side of the central portion and the other handle extends outward from the opposing side of the central portion.

10. The magnet mount assembly of claim 9 where the magnet mount further including a guide rail on one side of one of the two opposing handles and a clamping mechanism on the opposing side of the other of the two opposing handles for clamping to a casing designed to engage an electronic device.

11. The magnet mount assembly of claim 8 where the magnet mount further includes a clamping mechanism for securing the magnet mount to the portable electronic device.

12. The magnet mount assembly of claim 8 where the magnet mount further includes a clamping mechanism for securing the magnet mount to a casing protecting the portable electronic device.

13. The magnet mount assembly of claim 8 where the magnet mount includes at least two folding feet for supporting the magnet mount on a flat service at an angle.

14. The magnet mount assembly of claim 8 where the magnet mount includes at least four independently movable folding feet for supporting the magnet mount on a flat service at an angle either the horizontal or vertical positions.

* * * * *